US009313872B2

(12) United States Patent
Yamazawa et al.

(10) Patent No.: US 9,313,872 B2
(45) Date of Patent: Apr. 12, 2016

(54) PLASMA PROCESSING APPARATUS AND PLASMA PROCESSING METHOD

(75) Inventors: Yohei Yamazawa, Nirasaki (JP); Chishio Koshimizu, Nirasaki (JP); Kazuki Denpoh, Nirasaki (JP); Jun Yamawaku, Nirasaki (JP); Masashi Saito, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 834 days.

(21) Appl. No.: 12/913,441

(22) Filed: Oct. 27, 2010

(65) Prior Publication Data
US 2011/0104902 A1 May 5, 2011

Related U.S. Application Data

(60) Provisional application No. 61/265,523, filed on Dec. 1, 2009, provisional application No. 61/265,545, filed on Dec. 1, 2009.

(30) Foreign Application Priority Data

Oct. 27, 2009 (JP) ................................. 2009-245988
Oct. 27, 2009 (JP) ................................. 2009-245991
Sep. 27, 2010 (JP) ................................. 2010-215119

(51) Int. Cl.
*C23C 16/00* (2006.01)
*H01L 21/306* (2006.01)
(Continued)

(52) U.S. Cl.
CPC ................ *H05H 1/46* (2013.01); *H01J 37/321* (2013.01)

(58) Field of Classification Search
CPC ................ H01J 37/321; H01J 37/3211; H01J 37/32119; H01J 37/32128; H01J 37/32137; H01J 37/32146; H01J 37/32155; H01J 37/32165; H01J 37/32174; H01J 37/32183
USPC ........ 118/723 I, 723 IR, 723 AN; 156/345.48, 156/345.49; 315/111.51
See application file for complete search history.

(56) References Cited

U.S. PATENT DOCUMENTS 5,109,790 A 5/1992 Matsumoto et al.
5,280,154 A 1/1994 Cuomo et al.
(Continued)

FOREIGN PATENT DOCUMENTS

CN 1055495 A 10/1991
CN 1392754 A 1/2003
(Continued)

OTHER PUBLICATIONS

U.S. Office Action mailed Mar. 22, 2013 in co-pending U.S. Appl. No. 12/913,135.
(Continued)

*Primary Examiner* — Luz Alejandro Mulero
(74) *Attorney, Agent, or Firm* — Rothwell, Figg, Ernst & Manbeck, P.C.

(57) ABSTRACT

A plasma processing apparatus includes a processing chamber including a dielectric window; a coil shaped RF antenna provided outside the dielectric window; a substrate supporting unit, provided in the processing chamber, for mounting thereon a target substrate to be processed; a processing gas supply unit for supplying a desired processing gas to the processing chamber to perform a desired plasma process on the target substrate; and an RF power supply unit for supplying an RF power to the RF antenna to generate a plasma of the processing gas by an inductive coupling in the processing chamber. The apparatus further includes a floating coil electrically floated and arranged at a position outside the processing chamber where the floating coil is to be coupled with the RF antenna by an electromagnetic induction; and a capacitor provided in a loop of the floating coil.

27 Claims, 36 Drawing Sheets

(51) Int. Cl.
  *H05H 1/46* (2006.01)
  *H01J 37/32* (2006.01)

(56) References Cited

U.S. PATENT DOCUMENTS

| | | | |
|---|---|---|---|
| 5,401,350 A | 3/1995 | Patrick et al. | |
| 5,620,523 A | 4/1997 | Maeda et al. | |
| 5,637,961 A * | 6/1997 | Ishii et al. | 315/111.51 |
| 5,731,565 A | 3/1998 | Gates | |
| 5,800,619 A | 9/1998 | Holland et al. | |
| 5,907,221 A | 5/1999 | Sato et al. | |
| 5,919,382 A | 7/1999 | Qian et al. | |
| 6,016,131 A | 1/2000 | Sato et al. | |
| 6,080,287 A | 6/2000 | Drewery et al. | |
| 6,164,241 A * | 12/2000 | Chen et al. | 118/723 I |
| 6,229,264 B1 | 5/2001 | Ni et al. | |
| 6,252,354 B1 | 6/2001 | Collins et al. | |
| 6,288,493 B1 | 9/2001 | Lee et al. | |
| 6,518,705 B2 | 2/2003 | Wilcoxson et al. | |
| 6,572,732 B2 | 6/2003 | Collins | |
| 6,660,134 B1 | 12/2003 | Gopalraja et al. | |
| 6,876,155 B2 * | 4/2005 | Howald et al. | 315/111.51 |
| 7,210,424 B2 | 5/2007 | Tolmachev et al. | |
| 2002/0041160 A1 | 4/2002 | Barnes et al. | |
| 2002/0189763 A1 | 12/2002 | Kwon et al. | |
| 2003/0145952 A1 | 8/2003 | Wilcoxson et al. | |
| 2004/0085246 A1 | 5/2004 | Howald et al. | |
| 2004/0124779 A1 | 7/2004 | Howald et al. | |
| 2004/0216676 A1 | 11/2004 | Wilcoxson et al. | |
| 2004/0223579 A1 | 11/2004 | Lee et al. | |
| 2005/0205211 A1 | 9/2005 | Singh et al. | |
| 2007/0256787 A1 * | 11/2007 | Chandrachood et al. | 156/345.48 |
| 2008/0185284 A1 | 8/2008 | Chen et al. | |

FOREIGN PATENT DOCUMENTS

| | | |
|---|---|---|
| CN | 1537405 A | 10/2004 |
| CN | 1555568 A | 12/2004 |
| CN | 1574199 A | 2/2005 |
| CN | 1689132 A | 10/2005 |
| CN | 101304630 A | 11/2008 |
| JP | 4-94090 A | 3/1992 |
| JP | 7-122397 A | 5/1995 |
| JP | 8-162288 A | 6/1996 |
| JP | 9-115895 A | 5/1997 |
| JP | 10-70107 A | 3/1998 |
| JP | 10-149898 A | 6/1998 |
| JP | 10-189296 A | 7/1998 |
| JP | 2001-52894 A | 2/2001 |
| JP | 2002-151481 A | 5/2002 |
| JP | 2002-519861 A | 7/2002 |
| JP | 2003-517197 | 5/2003 |
| JP | 2003-234338 A | 8/2003 |
| JP | 2003-273028 A | 9/2003 |
| JP | 2004-179432 A | 6/2004 |
| JP | 2004-537830 | 12/2004 |
| JP | 2005-11799 A | 1/2005 |
| JP | 2005-534150 | 11/2005 |
| JP | 2006-221852 A | 8/2006 |
| JP | 2007-524963 A | 8/2007 |
| JP | 2008-235924 A | 10/2008 |
| TW | 447226 | 7/2001 |
| WO | 00/00993 A1 | 1/2000 |
| WO | 2004/114461 A2 | 12/2004 |

OTHER PUBLICATIONS

U.S. Office Action mailed Mar. 22, 2013 in co-pending U.S. Appl. No. 12/913,162.

U.S. Office Action issued Nov. 6, 2014 in co-pending U.S. Appl. No. 12/913,209, filed Oct. 27, 2010. (27 pages).

* cited by examiner

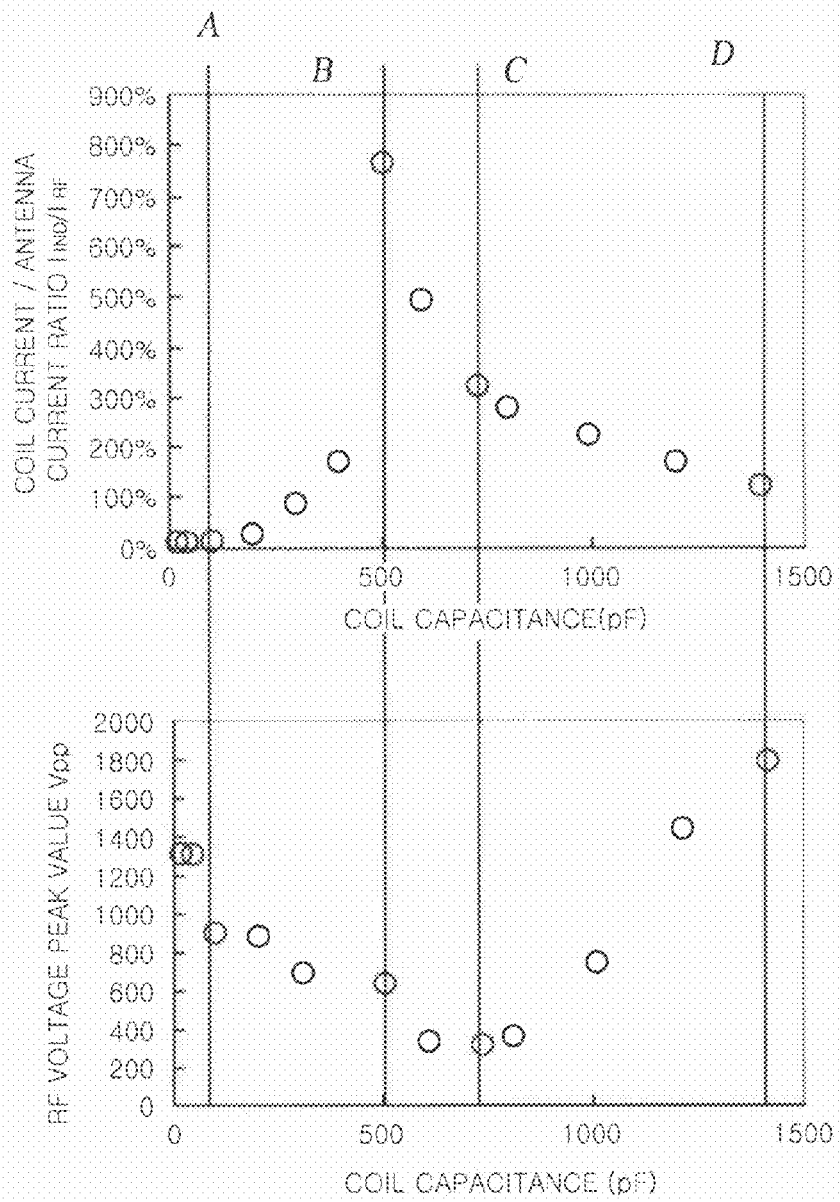

(TOP VIEW)

(FRONT VIEW)

(CROSS SECTION OF COIL CONDUCTOR)

($S_2$ :OFF, $S_1$ :OFF, OPEN STATE)

($S_1$ :ON, $S_2$ :OFF, SMALL CAPACITANCE)

($S_1$ :ON, $S_2$ :OFF, LOCAL MAXIMUM CAPACITANCE)

($S_1$ :ON, $S_2$ :ON, CLOSED STATE)

PLASMA PROCESSING APPARATUS AND PLASMA PROCESSING METHOD

CROSS-REFERENCE TO RELATED APPLICATIONS

This application claims priority to Japanese Patent Application Nos. 2009-245988 and 2009-245991 filed on Oct. 27, 2009 and 2010-215119 filed on Sep. 27, 2010 and U.S. Provisional Application Nos. 61/265,545 and 61/265,523 filed on Dec. 1, 2009, the entire contents of which are incorporated herein by reference.

FIELD OF THE INVENTION

The present invention relates to a technique for performing a plasma process on a target substrate to be processed; and, more particularly, to an inductively coupled plasma processing apparatus and a plasma processing method therefor.

BACKGROUND OF THE INVENTION

In the manufacturing process of a semiconductor device or a flat panel display (FPD), a plasma is widely used in a process such as etching, deposit, oxidation, sputtering or the like since it has a good reactivity with a processing gas at a relatively low temperature. In such plasma process, the plasma is mostly generated by a radio frequency (RF) discharge in the megahertz range. Specifically, the plasma generated by the RF discharge is classified into a capacitively coupled plasma and an inductively coupled plasma.

Typically, an inductively coupled plasma processing apparatus includes a processing chamber, at least a portion (e.g., a ceiling portion) of which is formed of a dielectric window; and a coil-shaped RF antenna provided outside the dielectric window, and an RF power is supplied to the RF antenna. The processing chamber serves as a vacuum chamber capable of being depressurized, and a target substrate (e.g., a semiconductor wafer, a glass substrate or the like) to be processed is provided at a central portion of the chamber. Further, a processing gas is introduced into a processing space between the dielectric window and the substrate.

As an RF current flows through the RF antenna, an RF magnetic field is generated around the RF antenna, wherein the magnetic force lines of the RF magnetic field travel through the dielectric window and the processing space. A temporal alteration of the generated RF field causes an electric field to be induced azimuthally. Moreover, electrons azimuthally accelerated by the induced electric field collide with molecules and/or atoms of the processing gas, to thereby ionize the processing gas and generate a plasma in a doughnut shape.

By increasing the size of the processing space in the chamber, the plasma is efficiently diffused in all directions (especially, in the radial direction), thereby making the density of the plasma on the substrate uniform. However, the uniformity of the plasma density on the substrate that is obtained by merely using a typical RF antenna is generally insufficient for the plasma process.

Accordingly, even as for the inductively coupled plasma processing apparatus, it becomes one of the most important factors to improve the uniformity of the plasma density on the substrate and several techniques therefor have been suggested, since it determines the uniformity and the reproducibility of the plasma process itself and, furthermore, the manufacturing production yield.

In addition, there has been known a method in which a single RF antenna is used and a passive antenna is provided around the RF antenna (see, e.g., Japanese Patent Application Publication No. 2005-534150 (JP2005-534150)). The passive antenna is formed of an independent coil to which an RF power is not supplied from the RF power supply. The passive antenna serves to decrease the intensity of the magnetic field in the loop of the passive antenna compared to that of the magnetic field generated by the RF antenna (inductive antenna) and increase the intensity of the magnetic field outside the loop of the passive antenna. Accordingly, the radial distribution of the RF electromagnetic field in the plasma generating region in the chamber is changed.

In the conventional method using the passive antenna described in JP2005-534150, the magnetic field generated by the RF antenna is affected by the passive antenna and, thus, the radial distribution of the RF electromagnetic field in the plasma generation region in the chamber can be changed. Since, however, the effect of the passive antenna has not been sufficiently examined to be understood enough, it is not easy to realize the specific configuration of the apparatus for accurately controlling the plasma density distribution by using the passive antenna.

Along with the trend toward scaling-up of a substrate and scaling-down of a device, the recent trend in the current plasma process has brought about the demand for high-density plasma sources with larger diameters at a low pressure. Therefore, it is difficult to improve the uniformity of the process on the substrate.

In this regard, the inductively coupled plasma processing apparatus generates a plasma in a doughnut shape inside the dielectric window close to the RF antenna and diffuses the plasma generated in the doughnut shape in all directions toward the substrate. However, the diffusion shape of the plasma is varied depending on the pressure inside the chamber, which results in changes in the plasma density distribution on the substrate. Furthermore, the density distribution of the plasma in the doughnut shape may be changed depending on the magnitude of the RF power supplied to the RF antenna, the flow rate of the processing gas introduced into the chamber, and the like. Hence, if it is not possible to correct the magnetic field generated by the RF antenna (inductive antenna) to maintain the uniformity of the plasma density on the substrate regardless of the changes in the pressure of the process recipe, it is difficult to cope with various and high process performances required by the current plasma processing apparatus.

SUMMARY OF THE INVENTION

In view of the above, the present invention provides an inductively coupled plasma processing apparatus and a plasma processing method therefor, capable of freely accurately controlling the plasma density distribution by using an electrically floated coil without requiring special processing on the plasma-generating RF antenna or the RF power supply system.

In accordance with a first aspect of the present invention, there is provided a plasma processing apparatus. The apparatus includes a processing chamber including a dielectric window; a coil shaped RF antenna provided outside the dielectric window; a substrate supporting unit, provided in the processing chamber, for mounting thereon a target substrate to be processed; a processing gas supply unit for supplying a desired processing gas to the processing chamber to perform a desired plasma process on the target substrate; an RF power supply unit for supplying an RF power to the RF antenna to generate a plasma of the processing gas by an inductive coupling in the processing chamber, the RF power having an appropriate frequency for RF discharge of the processing gas; a floating coil electrically floated and arranged at a position outside the processing chamber where the floating coil is to be coupled with the RF antenna by an electromagnetic induction; and a capacitor provided in a loop of the floating coil.

In accordance with the first aspect of the present invention, there is provided a method for performing a desired plasma process on a target substrate to be processed, in a plasma processing apparatus including a processing chamber including a dielectric window a coil shape RF antenna provided outside the dielectric window; a substrate supporting unit, provided in the processing chamber, for mounting thereon the target substrate; a processing gas supply unit for supplying a desired processing gas to the processing chamber to perform a desired plasma process on the target substrate; an RF power supply unit for supplying an RF power to the RF antenna to generate a plasma of the processing gas by an inductive coupling in the processing chamber, the RF power having an appropriate frequency for RF discharge of the processing gases. The method includes arranging outside the processing chamber a floating coil that is electrically floated from the RF antenna, arranged at a position outside the processing chamber where the floating coil is to be coupled with the RF antenna by an electromagnetic induction, and including a fixed or variable capacitor in a loop thereof; and selecting or variably adjusting an electrostatic capacitance of the capacitor to control a density distribution of a plasma.

In the plasma processing apparatus and the plasma processing method in accordance with the first aspect, if the RF power is supplied from the RF power supply unit to the RF antenna, an RF magnetic field is generated around the antenna conductor by the RF current flowing through the RF antenna, and the electric field is induced and contributes to RF discharge of the processing gas in the processing chamber. Further, an electromotive power is induced in the floating coil by the electromagnetic induction between the RF antenna and the floating coil and, thus, the induced current flows therethrough. The induced electric field is also generated in the plasma generation space in the processing chamber by the induced current flowing through the floating coil and, thus, negatively or positively involves in the RF discharge of the processing gas or the generation of the inductively coupled plasma.

The operation of the floating coil that contributes to the density distribution of the core plasma (the plasma in the doughnut shape) generated in the processing chamber by the electromagnetic induction depends on the relatively positional relationship between the RF antenna and the floating coil and the magnitude and direction of the current flowing through the floating coil.

The current value and the phase (direction) of the current flowing through the floating coil depend on the induced electromotive power generated in the loop of the floating coil and the impedance in the loop. In the plasma processing apparatus, the impedance, especially reactance, in the loop is adjusted and the magnitude and direction of the current in the loop is controlled by adjusting the electrostatic capacitance of the capacitor provided in the loop of the floating coil.

By providing such floating coil having the capacitor, it is possible to freely and variously control the density distribution of the plasma in the doughnut shape. Accordingly, it is possible to freely and accurately control the plasma density distribution around the substrate mounted on the substrate supporting unit and it is easily to accomplish the improvement in the uniformity of the plasma process.

In accordance with a second aspect of the present invention, there is provided a plasma processing apparatus. The apparatus includes a processing chamber including a dielectric window; an RF antenna including an inner coil and an outer coil that are spaced from each other in a diametric direction and respectively arranged at an inner portion and an outer portion outside the dielectric window, the inner coil and the outer coil being electrically connected in parallel to an RF power supply unit; a substrate supporting unit, provided in the processing chamber, for mounting thereon a target substrate to be processed; a processing gas supply unit for supplying a desired processing gas to the processing chamber to perform a desired plasma process on the target substrate; the RF power supply unit for supplying an RF power to the RF antenna to generate a plasma of the processing gas by an inductive coupling in the processing chamber, the RF power having an appropriate frequency for RF discharge of the processing gas; a floating coil electrically floated and arranged at a position outside the dielectric window where the floating coil is to be coupled with at least one of the inner coil and the outer coil of the RF antenna by an electromagnetic induction; and a capacitor provided in a loop of the floating coil.

In accordance with the second aspect of the present invention, there is provided a method for performing a desired plasma process on a target substrate to be processed, in a plasma processing apparatus including a processing chamber including a dielectric window; an RF antenna including an inner coil and an outer coil that are spaced from each other in a diametric direction and respectively arranged at an inner portion and an outer portion outside the dielectric window, the inner coil and the outer coil being electrically connected in parallel to an RF power supply unit; a substrate supporting unit, provided in the processing chamber, for mounting thereon a target substrate to be processed; a processing gas supply unit for supplying a desired processing gas to the processing chamber to perform a desired plasma process on the target substrate; and the RF power supply unit for supplying an RF power to the RF antenna to generate a plasma of the processing gas by an inductive coupling in the processing chamber, the RF power having an appropriate frequency for RF discharge of the processing gas. The method includes arranging outside the dielectric window a floating coil that is electrically floated, at a position where the floating coil is to be coupled with at least one of the inner coil and the outer coil of the RF antenna by an electromagnetic induction, the floating coil including a fixed or variable capacitor in a loop thereof; and selecting or variably adjusting an electrostatic capacitance of the capacitor to control a density distribution of a plasma.

In the plasma processing apparatus and the plasma processing method in accordance with the second aspect, if the RF power is supplied from the RF power supply unit to the RF antenna, an RF magnetic field is generated around each antenna conductor of the inner coil and the outer coil of the RF antenna by the RF currents flowing through the inner coil and the outer coil, and the electric field is induced and contributes to RF discharge of the processing gas in the processing chamber. Further, an electromotive power is induced in the floating coil by the electromagnetic induction between the floating coil and the inner coil and/or the outer coil of the RF antenna and, thus, the induced current flows therethrough. The induced electric field is also generated in the plasma generation space in the processing chamber by the induced current flowing through the floating coil and, thus, negatively or positively involves in the RF discharge of the processing gas or the generation of the inductively coupled plasma.

The operation of the floating coil that contributes to the density distribution of the core plasma (the plasma in the doughnut shape) generated in the processing chamber by the electromagnetic induction depends on the relatively positional relationship between the floating coil and the inner coil and/or the outer coil of the RF antenna and the magnitude and direction of the current flowing through the floating coil.

The current value and the phase (direction) of the current flowing through the floating coil depend on the induced electromotive power generated in the loop of the floating coil and the impedance in the loop. In the plasma processing apparatus, the impedance, especially reactance, in the loop is adjusted and the magnitude and direction of the current in the loop are controlled by adjusting the electrostatic capacitance of the capacitor provided in the loop of the floating coil.

By providing such floating coil having the capacitor, it is possible to freely and variously control the density distribution of the plasma in the doughnut shape. Accordingly, it is possible to freely and accurately control the plasma density distribution around the substrate mounted on the substrate supporting unit and it is easily to accomplish the improvement in the uniformity of the plasma process.

BRIEF DESCRIPTION OF THE DRAWINGS

The objects and features of the present invention will become apparent from the following description of embodiments, given in conjunction with the accompanying drawings, in which:

FIG. 3 shows a current property and a $V_{PP}$ property (electromagnetic field simulation result) varied depending on a capacitor of the floating coil in accordance with the first embodiment of the present invention;

DETAILED DESCRIPTION OF THE EMBODIMENTS

Embodiments of the present invention will now be described with reference to the accompanying drawings which form a part hereof.

(First Embodiment)

A first embodiment of the present invention will be described with reference to FIGS. 1 to 4.

Figure 1:
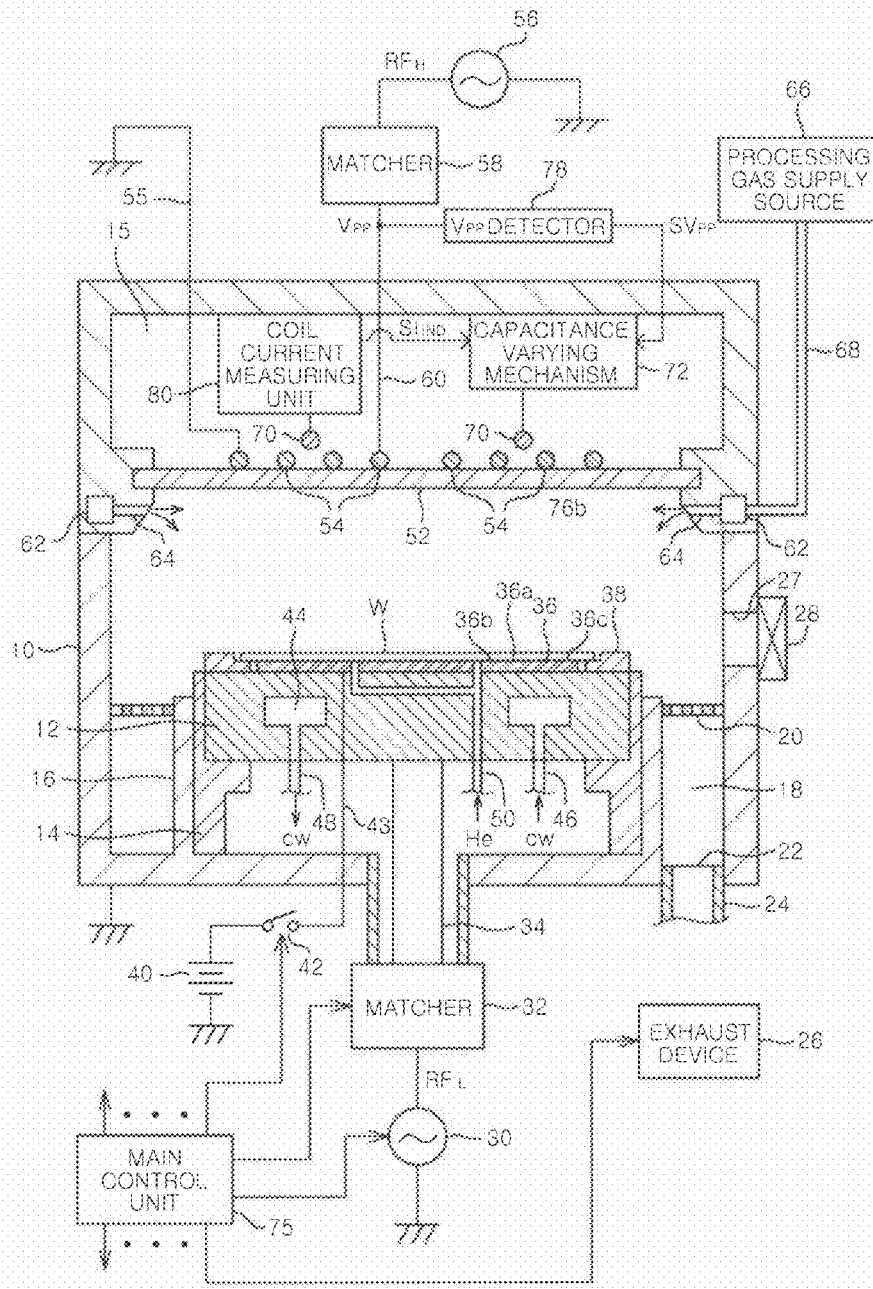
FIG. 1 is a longitudinal cross sectional view showing a configuration of an inductively coupled plasma processing apparatus in accordance with a first embodiment of the present invention.

FIG. 1 shows a configuration of an inductively coupled plasma processing apparatus in accordance with the first embodiment of the present invention. The inductively coupled plasma etching apparatus is a plasma etching apparatus using a planar coil type RF antenna, and includes a cylindrical vacuum chamber (processing chamber) 10 having a bottom portion which is made of a metal, e.g., aluminum, stainless steel or the like. The chamber 10 is frame-grounded.

In the inductively coupled plasma etching apparatus, various units having no involvement in plasma generation will be described first.

At a lower central portion of the chamber 10, a circular plate-shaped susceptor 12 for mounting thereon a target substrate, e.g., a semiconductor wafer W as a substrate supporting table is horizontally arranged. The susceptor 12 also serves as an RF electrode. The susceptor 12, which is made of, e.g., aluminum, is supported by an insulating tubular support 14 uprightly extending from a bottom portion of the chamber 10.

A conductive tubular support part 16 is provided uprightly extending from the bottom portion of the chamber 10 along the periphery of the insulating tubular support 14, and an annular exhaust path 18 is defined between the support part 16 and an inner wall of the chamber 10. Moreover, an annular baffle plate 20 is attached to an entrance or a top portion of the exhaust path 18, and an exhaust port 22 is provided at a bottom portion thereof.

To allow a gas to uniformly flow in the chamber 10 axisymmetrically with regard to the semiconductor wafer W on the susceptor 12, it is preferable to provide a plural number of exhaust ports 22 at a regular interval circumferentially. The exhaust ports 22 are connected to an exhaust device 26 via respective exhaust pipes 24. The exhaust device 26 includes a vacuum pump such as a turbo molecular pump to evacuate a plasma-processing space in the chamber 10 to a predetermined vacuum level. Attached to the sidewall of the chamber 10 is a gate valve 28 for opening and closing a loading/unloading port 27.

An RF power supply 30 for an RF bias is electrically connected to the susceptor 12 via a matcher 32 and a power supply rod 34. The RF power supply 30 outputs a variable RF power $RF_L$ of an appropriate frequency (e.g., 13.56 MHz or less) to control the energies of ions attracted toward the semiconductor wafer W. The matcher 32 includes a variable-reactance matching circuit for performing the matching between the impedances of the RF power supply 30 and the load (mainly, susceptor, plasma and chamber), and the matching circuit includes a blocking capacitor for generating a self-bias.

An electrostatic chuck 36 is provided on an upper surface of the susceptor 12 to hold the semiconductor wafer W by an electrostatic attraction force, and a focus ring 38 is provided around the electrostatic chuck 36 to annularly surround the periphery of the semiconductor wafer W. The electrostatic chuck 36 includes an electrode 36a made of a conductive film and a pair of dielectric films 36b and 36c, the electrode 36a being arranged between the dielectric films 36b and 36c. A high voltage DC power supply 40 is electrically connected to the electrode 36a via a switch 42 by using a coated line 43. By applying a high DC voltage from the DC power supply 40 to the electrode 36a, the semiconductor wafer W can be attracted to and held on the electrostatic chuck 36 by the electrostatic force.

A coolant path 44, which extends in, e.g., a circumferential direction, is provided inside the susceptor 12. A coolant, e.g., a cooling water, of a predetermined temperature is supplied from a chiller unit (not shown) to the coolant path 44 to be circulated through pipelines 46 and 48. By adjusting the temperature of the coolant, it is possible to control a process temperature of the semiconductor wafer W held on the electrostatic chuck 36. Moreover, a heat transfer gas, e.g., He gas, is supplied from a heat transfer gas supply unit (not shown) to a space between a top surface of the electrostatic chuck 36 and a bottom surface of the semiconductor wafer W through a gas supply line 50. Further, an elevating mechanism (not shown) including lift pins capable of being moved up and down while vertically extending through the susceptor 12 and the like is provided to load and unload the semiconductor wafer W.

Next, various units having involvement in the plasma generation in the inductively coupled plasma etching apparatus will be described.

Figure 46A:
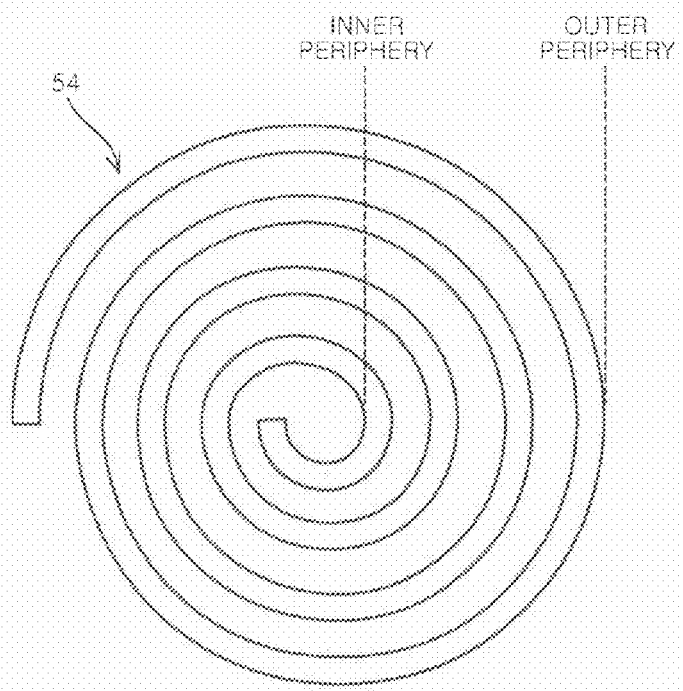
FIG. 46A is a perspective view showing an example of an RF antenna having a spiral coil shape.
Figure 46B:
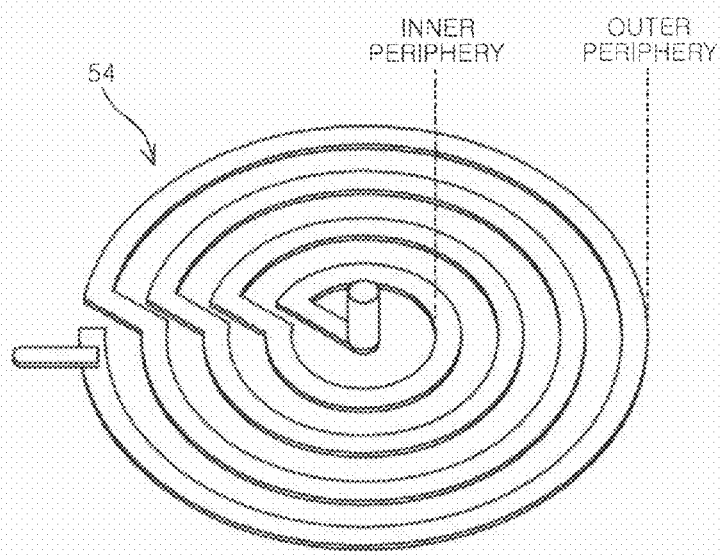
FIG. 46B is a perspective view showing an example of an RF antenna having a concentric coil shape.

A ceiling or a ceiling plate of the chamber 10 is separated from the susceptor 12 at a relatively large distance, and a circular dielectric window 52 formed of, e.g., a quartz plate is airtightly provided as the ceiling plate. As a single unit with the chamber 10, an antenna chamber 15 is provided above the dielectric window 52. Typically, a coil shaped RF antenna 54 is horizontally arranged in the antenna chamber 15 to be concentric with the chamber 10 or the susceptor 12. Preferably, the RF antenna 54 includes, e.g., a spiral coil (FIG. 46A); or one or more concentric (circular ring-shaped) coils having a same radius in each circular cycle (FIG. 46B). The RF antenna 54 is fixed on the dielectric window 52 by an antenna fixing member (not shown) formed of an insulator. Further, although multi-wound circular ring-shaped coils are shown in FIG. 46, the RF antenna 54 may be formed of a single-wound coil.

One end of the RF antenna 54 is electrically connected to an output terminal of an RF power supply 56 for plasma generation via a matcher 58 by using a power supply line 60. The other end of the RF antenna 54 is connected to an electric ground potential through a ground line.

The RF power supply 56 outputs an RF power $RF_H$ of an appropriate frequency (e.g., 13.56 MHz or more) for plasma generation by RF discharge at a desired level. The matcher 58 includes a variable-reactance matching circuit for performing the matching between the impedances of the RF power supply 56 and the load (mainly, RF antenna, plasma and floating coil).

A processing gas supply unit for supplying a processing gas to the chamber 10 includes an annular manifold or buffer unit 62 provided inside (or outside) the sidewall of the chamber 10 to be located at a place slightly lower than the dielectric window 52; a plurality of sidewall gas injection holes 64 circumferentially formed on the sidewall at a regular interval and opened to the plasma-generation space from the buffer unit 62; and a gas supply line 68 extended from a processing gas supply source 66 to the buffer unit 62. The processing gas supply source 66 includes a mass flow controller and an on-off valve, which are not shown.

In order to variably control a density distribution of an inductively coupled plasma generated in a processing space of the chamber 10 in the diametric direction, the inductively coupled plasma etching apparatus includes a floating coil 70 having a variable capacitor capable of being coupled to the RF antenna 54 by an electromagnetic induction; and a capacitance varying mechanism 72 for variably controlling an electrostatic capacitance of the floating coil 70 (more accurately, variable capacitor) in the antenna chamber 15 serving as an atmospheric space provided above a ceiling wall (ceiling plate) of the chamber 10. The detailed configurations and functions of the floating coil 70 and the capacitance varying mechanism 72 will be described later.

A main control unit 75 includes, e.g., a microcomputer and controls the overall operation (sequence) of the plasma etching apparatus and individual operations of various units, e.g., the exhaust device 26, the RF power supplies 30 and 56, the matchers 32 and 58, the switch 42 of the electrostatic chuck, the processing gas supply source 66, the capacitance varying mechanism 72, the chiller unit (not shown), the heat-transfer gas supply unit (not shown) and the like.

When the inductively coupled plasma etching apparatus performs an etching process, the gate valve 28 is first opened to load a target semiconductor wafer W to be processed into the chamber 10 and mount it onto the electrostatic chuck 36. Then, the gate valve 28 is closed, and an etching gas (typically, a gaseous mixture) is introduced from the processing gas supply source 66, via the buffer unit 62, into the chamber 10 at a preset flow rate and flow rate ratio through the sidewall gas injection holes 64 by using the gas supply line 68. Further, the pressure inside the chamber 10 is adjusted to a predetermined level by the exhaust device 26. Thereafter, the RF power supply 56 is turned on to output a plasma-generating RF power $RF_H$ at a predetermined RF level, so that a current of the RF power $RF_H$ is supplied to the RF antenna 54 through the power supply line 60 via the matcher 58. In addition, the RF power supply 30 is turned on to output an ion-attracting control RF power $RF_L$ at a predetermined RF level, so that the RF power $RF_L$ is supplied to the susceptor 12 through the power supply rod 34 via the matcher 32.

Further, a heat-transfer gas (i.e., He gas) is supplied from a heat-transfer gas supply unit to a contact interface between the electrostatic chuck 36 and the semiconductor wafer W, and the switch 42 is turned on, so that the heat-transfer gas is confined in the contact interface by the electrostatic attraction force of the electrostatic chuck 36.

The etching gas injected through the sidewall gas injection holes 64 is uniformly diffused in the processing space below the dielectric window 52. At this time, the RF magnetic field is generated around the RF antenna 54 by the current of the RF power $RF_H$ flowing through the RF antenna 54, so that its magnetic force lines travel through the dielectric window 52 and a plasma generation space in the chamber 10 and, thus, an RF electric field is induced in an azimuth direction of the processing space by the temporal alteration of the generated RF magnetic field.

Then, electrons azimuthally accelerated by the induced electric field collide with molecules and/or atoms in the etching gas, to thereby ionize the etching gas and generate a plasma in a doughnut shape. In the wide processing space, radicals and ions of the plasma generated in the doughnut shape are diffused in all directions, so that the radicals isotropically pour down and the ions are attracted by the DC bias onto a top surface (target surface) of the semiconductor wafer W. Accordingly, plasma active species cause chemical and physical reactions on the target surface of the semiconductor wafer W, thereby etching a target film into a predetermined pattern.

As such, in the inductively coupled plasma etching apparatus, an inductively coupled plasma is generated in the doughnut shape at a portion below the RF antenna 54 and near the RF antenna 54 and then is diffused in the wide processing space, so that the density of the plasma becomes uniform around the susceptor 12 (i.e., on the semiconductor wafer W). Here, the density of the plasma in the doughnut shape depends on the intensity of the induced electric field and, furthermore, the magnitude of the RF power $RF_H$ supplied to the RF antenna 54 (more specifically, the current flowing through the RF antenna 54). In other words, as the RF power $RF_H$ is increased, the density of the plasma in the doughnut shape is increased and, thus, the density of the plasma around the susceptor 12 becomes generally increased through the diffusion of the plasma.

Meanwhile, the shape in which the plasma in the doughnut shape is diffused in all directions (especially, in a diametric direction) mainly depends on the pressure inside the chamber 10 and, thus, as the pressure becomes decreased, amount of the plasma accumulated on a central portion of the chamber 10 is increased, so that the density distribution of the plasma around the susceptor 12 tends to be swollen at the central portion. Further, the density distribution of the plasma in the doughnut shape may be changed depending on the magnitude of the RF power $RF_H$ supplied to the RF antenna 54, the flow rate of the processing gas introduced into the chamber 10, or the like.

Here, the expression "plasma in the doughnut shape" indicates not only a state where the plasma is generated only at the radially outer portion in the chamber 10 without being generated at the radially inner portion (at the central portion) therein but also a state where the volume or density of the plasma generated at the radially outer portion becomes larger than that at the radially inner portion. Moreover, if the kind of the processing gas, the pressure inside the chamber 10 and/or the like are changed, the plasma may be generated in another shape instead of the doughnut shape.

In such plasma etching apparatus, to freely control the density distribution of the plasma in the doughnut shape around the susceptor 12, the RF antenna 54 performs an electromagnetic field correction on the generated RF magnetic field by the floating coil 70 having the variable capacitor and varies the electrostatic capacitance of the floating coil 70 by the capacitance varying mechanism 72 depending on predetermined process parameters (e.g., RF power, gas flow rate and the like) that are set up in a process recipe.

Hereinafter, the configurations and functions of the floating coil 70 and the capacitance varying mechanism 72 as major features of the plasma etching apparatus will be described.

Figure 2:
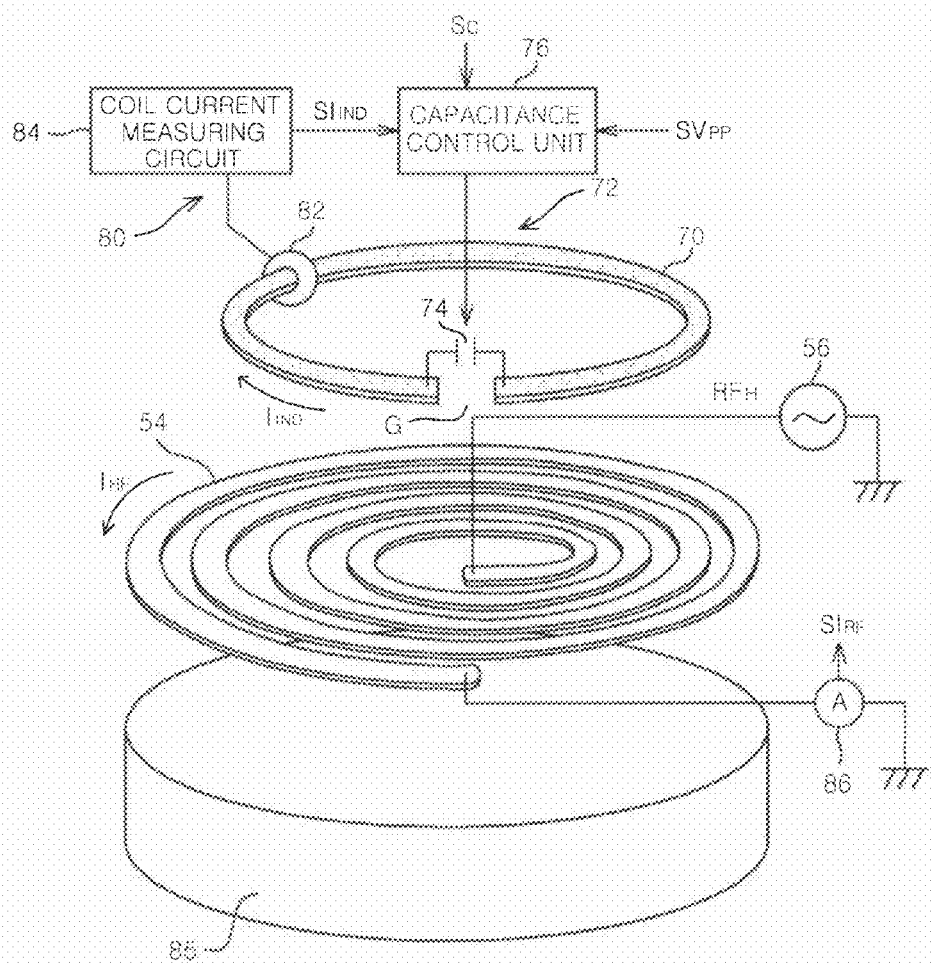
FIG. 2 is a perspective view schematically showing a basic configuration of a floating coil and a layout relationship of an RF antenna in accordance with the first embodiment of the present invention.

FIG. 2 shows a basic configuration of the floating coil 70 and a layout relationship of the RF antenna 54. As shown in FIG. 2, the floating coil 70 is electrically floated as the basic configuration. Specifically, in the present embodiment, an "electrically floated" state indicates a state that is electrically floated or separated from a power supply and a ground potential and where a peripheral conductor through which absolutely no or hardly any charge or current is received or transmitted and only an induced current may flow by the electromagnetic induction.

Further, as the basic configuration, the floating coil 70 is formed of a single-wound (or multi-wound) coil having a cutout portion G interposed between its opposite ends. A variable capacitor 74 is provided in the cutout portion G.

The variable capacitor 74, as will be described later, may be of, e.g., a commercially available general-purpose type such as a varicon (variable condenser) or a varicap (variable capacitor) or a specially customized product or a typical product provided in the floating coil 70 as a single unit.

Preferably, the floating coil 70 is arranged to be concentric with the RF antenna 54, and has a coil diameter such that its coil conductor is positioned between the outer and the inner periphery (e.g., around the accurately central portion) of the RF antenna 54. The floating coil 70 is arranged in the azimuthal direction such that the position of the variable capacitor 74 (i.e., the cutout portion G) is overlapped with that of the cutout portion G for the RF input and output of the RF antenna 54 as described in FIG. 2, for example. The coil conductor of the floating coil 70, preferably, is made of a metal having a high conductivity, e.g., a silver-plated copper.

In the present embodiment, the expression "concentric" indicates a positional relationship in which central axial lines of a plurality of axisymmetric objects (e.g., coils or antennas) are overlapped with each other, including not only a case where coil surfaces or antenna surfaces are axially or vertically offset to each other but also a case where the coil surfaces or the antenna coil surfaces are identical to each other on the same plane (concentric positional relationship).

The capacitance varying mechanism 72 includes the variable capacitor 74 provided in the loop of the floating coil 70; and a capacitance control unit 76 for variably controlling an electrostatic capacitance of the variable capacitor 74 by, typically, a mechanical driving mechanism or an electric driving circuit.

As for the electrostatic capacitance of the variable capacitor 74, the capacitance control unit 76 receives from the main control unit 75 through a control signal $S_C$ a capacitance setting value, recipe information based on the capacitance setting value, a process parameter and the like. Further, as for a monitoring signal or a feedback signal for variably controlling the coil capacitance, the capacitance control unit 76 receives from a $V_{PP}$ detector 78 (FIG. 1) a signal $SV_{PP}$ indicating a peak value $V_{PP}$ of an RF voltage obtained immediately before being inputted into the RF antenna 54 and from a coil current measuring unit 80 a signal $SI_{ND}$ indicating a current value (root square value (RMS)) of an induced current $I_{IND}$ flowing through the floating coil 70. The $V_{PP}$ detector 78 may use a value stored in the matcher 58 to measure a peak value $V_{PP}$ of an output voltage of the matcher 58.

Next, the functions of the floating coil 70 and the capacitance varying mechanism 72 will be described. Following electromagnetic field simulations were performed by the present inventors for the inductively coupled plasma etching apparatus of the present embodiment.

Specifically, when the electrostatic capacitance of the floating coil 70 (particularly, the variable capacitor 74) was varied in the range between 100 and 1400 pF as parameters and the RF power $RF_H$ was supplied to the RF antenna 54 at a predetermined level, a ratio $I_{IND}/I_{RF}$ of a coil current (induced current) $I_{IND}$ to an antenna current (RF current) $I_{RF}$ flowing through the RF antenna 54 and a peak value $V_{PP}$ of an RF voltage immediately before it being inputted into the RF antenna 54 were calculated. Then, the calculated results were plotted by setting the electromagnetic capacitance of the floating coil 70 as a horizontal axis and the current ratio $I_{IND}/I_{RF}$ and the RF voltage peak value $V_{PP}$ as a vertical axis. Resultantly, the properties shown in FIG. 3 were obtained.

In the electromagnetic system simulations, the outer radius of the RF antenna 54 was set to be, e.g., 250 mm; the inner radius and the outer radius of the floating coil 70 were respectively set to be, e.g., 100 mm and 130 mm; and a distance between the RF antenna 54 and the floating coil 70 was set to be, e.g., 5 mm. As the plasma generated in the doughnut shape at the processing space provided below the RF antenna 54 in the chamber 10, a disk-shaped resistance 85 shown in FIG. 2 was simulated, where its diameter, resistivity and skin depth were set to be, e.g., 250 mm, 100 Ωcm and 10 mm, respectively. Further, the plasma-generating RF power $RF_H$ was set to have a frequency of about 13.56 MHz, and it was assumed that a load impedance of about 1000 W was inputted from an input unit, in order to calculate the voltage peak value $V_{PP}$.

As shown in FIG. 3, the ratio $I_{IND}/I_{RF}$ of the coil current $I_{IND}$ to the antenna current $I_{RF}$ shows the profile where a central portion is upwardly extended on the horizontal axis (within a variable range of the coil capacitance). The current ratio $I_{IND}/I_{RF}$ is simply increased between a minimum value (100 pF) and an intermediate portion of about 500 pF; and reaches a local maximum value (about 800%) at the portion of about 500 pF. Further, the current ratio $I_{IND}/I_{RF}$ is simply decreased after the portion of about 500 pF. Resultantly, the current ratio $I_{IND}/I_{RF}$ is changed in the range between about 10% or less and about 800%.

Moreover, if the coil capacitance is increased to be significantly greater than 1400 pF, the current ratio $I_{IND}/I_{RF}$ reaches about 60% and does not fall down any further, which is not shown in FIG. 3. In other words, when the variable capacitor 74 is cut off, the coil current $I_{IND}$ of about 60% as compared with the antenna current $I_{RF}$ flows through the floating coil 70.

The RF voltage peak value $V_{PP}$ shows the profile where a central portion falls down in a bowl shape on the horizontal axis (within the variable range of the coil capacitance). The value $V_{PP}$ is simply decreased between a minimum value (100 pF) and an intermediate portion of about 730 pF; and reaches a local minimum value (about 350 V) at the portion of about 730 pF. Further, the value $V_{PP}$ is monotonously increased after the portion of about 730 pF. Resultantly, the value $V_{PP}$ is changed in the range between about 350 V and about 1800 V.

In the electromagnetic system simulations, as the result of obtaining a current density distribution (corresponding to the plasma density distribution) in the radial direction of an inner portion (a position of 5 mm from the top surface) of the plasma in the doughnut shape with regard to each representative capacitance position of a capacitance position "A" (minimum coil capacitance), a capacitance position "B" (local maximum coil current), a capacitance position "C" (local minimum $V_{PP}$) and a capacitance position "D" (maximum coil capacitance), the profiles shown in FIGS. 4A to 4D were obtained.

In the case of the capacitance position "A" (minimum coil capacitance), the coil current $I_{IND}$ hardly flows through the floating coil 70, or its state becomes similar to a state where there is no floating coil 70. The distribution of the current density (plasma density) in the diametric direction obtained in the capacitance position "A" shows the profile shown in FIG. 4A, where the current respectively has zero at the center (r=0 mm) and an outer peripheral edge (r=250 mm) of the plasma in the doughnut shape, and is smoothly swollen to a height of about 100 A/m² at a central section (r=120 to 160 mm).

In the case of the capacitance position "B" (local maximum coil current), the coil current $I_{IND}$ flows through the floating coil 70 at a state approximately similar to a series resonance. Here, a passive circuit or an equivalent load of the floating coil 70 is provided by a series circuit of resistance, inductance and capacitance included in the loop (current path) of the floating coil 70. The resistance of the floating coil 70 is determined depending on a material (resistivity), a cross-sectional area and a length of its coil conductor. The inductance of the floating coil 70 includes mutual inductances between the floating coil 70 and the RF antenna 54 and between the floating coil 70 and the plasma as well as a self inductance caused by the structure of the floating coil 70 itself. The impedance of the floating coil 70 is defined by such inductances and the electrostatic capacitance of the variable capacitor 74.

Figure 4A:
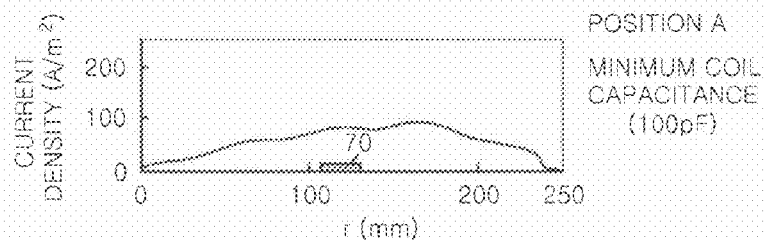
FIGS. 4A to 4D show a current density distribution of inductively coupled plasma in a radial direction in well-known capacitor position shown in FIG. 3 obtained from an electromagnetic field simulation result.
Figure 4B:
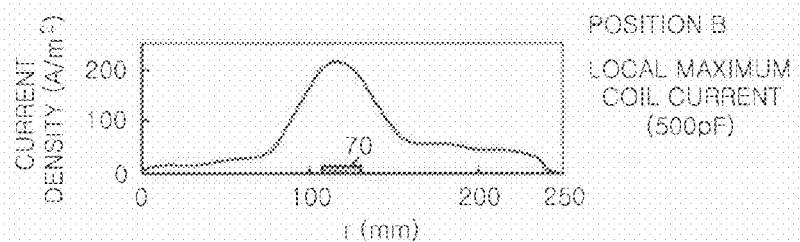

The distribution of the current density (plasma density) in the diametric direction obtained in the capacitance position "B" shows the profile shown in FIG. 4B, where the current is locally significantly swollen to be higher than 200 A/m² around a section (r=100 to 120 mm) that is overlapped with the coil conductor of the floating coil 70, and is slightly lower at the diametrically inner portion and the diametrically outer portion than that in the case of the capacitance position "A."

As such, if the passive circuit in the floating coil 70 is under a series resonance state, a large amount of the coil current $I_{IND}$ flows through the floating coil 70 and, thus, the density of the plasma in the doughnut shape becomes locally significantly increased (as much as two times or more as compared with the case of no floating coil 70) at a position that is overlapped with the coil conductor of the floating coil 70.

In the case of capacitance position "C" (local minimum $V_{PP}$), the peak value $V_{PP}$ of the RF voltage immediately before it is inputted into the RF antenna 54 becomes locally minimum. The distribution of the current density (plasma density) in the diametric direction obtained in the capacitance position "C" shows the profile shown in FIG. 4C, where the current is locally slightly less swollen around the section (r=100 to 120 mm) that is overlapped with the coil conductor of the floating coil 70, and is slightly higher at the diametrically inner portion and the diametrically outer portion than that in the case of the capacitance position "B."

In the case of the capacitance position "D" (maximum coil capacitance), its state becomes similar to a state where the floating coil 70 is short-circuited without the variable capacitor 74. The distribution of the current density (plasma density) in the diametric direction obtained in the capacitance position "D" shows the profile shown in FIG. 4D, where the current locally suddenly falls down around the section (r=100 to 120 mm) that is overlapped with the coil conductor of the floating coil 70, and is swollen to be higher than 100 A/m² around a peripheral section (r=160 to 230 mm) in compared with that in the case of the capacitance position "A."

Although it is not shown, it shall be obvious that the current density distribution in the radial direction of the plasma in the doughnut shape is changed continuously depending on the electrostatic capacitance values of the variable capacitor 74 provided in the floating coil 70. Specifically, the current density distribution in the radial direction is continuously changed between the profiles shown in FIGS. 4A and 4B in the section from the capacitance position "A" to capacitance position "B," and between the profiles shown in FIGS. 4C and 4D in the section from the capacitance position "C" to capacitance position "D."

Accordingly, it is easily estimated that, as the electrostatic capacitance of the variable capacitor 74 is increased, the density of the plasma in the doughnut shape is significantly swollen around the section (r=100 to 120 mm) that is overlapped with the coil conductor of the floating coil 70, or around a portion immediately below the floating coil 70, in the section from the capacitance position "A" to capacitance position "B." It is also easily estimated that, as the electrostatic capacitance of the variable capacitor 74 is increased, the density of the plasma in the doughnut shape is decreased or suddenly falls down around the portion immediately below the floating coil 70, in the section from the capacitance position "C" to capacitance position "D."

Figure 4C:
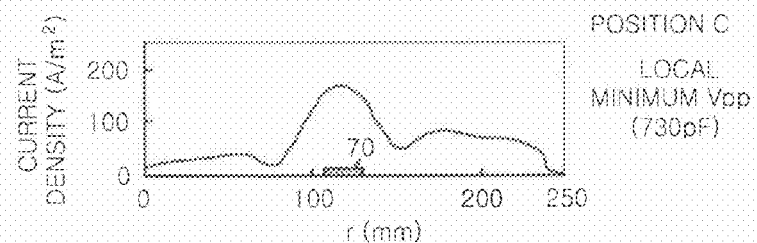
Figure 4D:
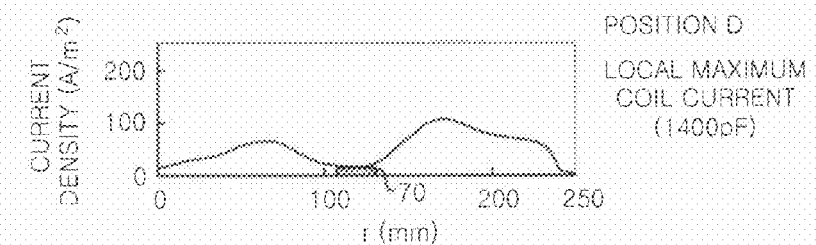

Moreover, as shown in FIG. 3, it can be said that the properties of the ratio $I_{IND}/I_{RF}$ of the coil current $I_{IND}$ to the antenna current $I_{RF}$ and the RF voltage peak value $V_{PP}$ changed depending on the coil capacitance are vertically symmetrical to each other, and the capacitance position "B" (local maximum coil current) and the capacitance position "C" (local minimum $V_{PP}$) are similar to each other based on the similarity of the current density (plasma density) distribution shown in FIGS. 4B and 4C. Accordingly, it is possible to simplify the capacitance positions "B" and "C" as one single mode to determine as three representative modes the capacitance positions "A," "B and C" and "D."

As such, in the present embodiment, by varying the electrostatic capacitance of the floating coil 70 (particularly, the variable capacitor 74), it is possible to variously freely control in the diametric direction the density distribution of the plasma generated in the doughnut shape in the chamber 10 and, furthermore, the plasma density distribution around the susceptor 12 obtained from the result where the plasma in the doughnut shape is diffused in all directions (especially, the diametric direction) in the processing space. Accordingly, it is possible to easily make the plasma density distribution around the susceptor 12 uniform in the diametric direction.

In the present embodiment, based on the results obtained from the above-mentioned electromagnetic system simulations, as shown in FIG. 1, a current value of the coil current (induced current) $I_{IND}$ flowing through the floating coil 70 and the peak value $V_{PP}$ of the RF voltage immediately before it being inputted into the RF antenna 54 are respectively measured by the coil current measuring unit 80 and the $V_{PP}$ detector 78 and their measured values $SI_{IND}$ and $SV_{PP}$ are transferred to the capacitance control unit 76.

Furthermore, as shown in FIG. 2, a current value (RMS) of the antenna current (RF current) $I_{RF}$ flowing through the RF antenna 54 is measured by an RF ampere meter and its measured value $SI_{RF}$ is transferred to the capacitance control unit 76. As an example, the coil current measuring unit 80 includes a current sensor 82; and a coil current measuring circuit 84 for calculating a current value (RMS) of the coil current $I_{IND}$ based on an output signal from the current sensor 82.

As described above, the inductance of the floating coil 70 includes the mutual inductances between the floating coil 70 and the RF antenna 54 and between the floating coil and the plasma. Accordingly, if the values of the process parameters (pressure, RF power and the like), the impedance of the floating coil 70 may be changed by an affect from the plasma; and the capacitance position "B" (local maximum coil current) or the capacitance position "C" (local minimum $V_{PP}$) may be indeterminately varied in the properties shown in FIG. 3. However, by providing a coil current monitoring unit, an RF antenna current monitoring unit and/or a $V_{PP}$ monitoring unit, the capacitance position "B" or the capacitance position "C" may be checked as needed even when the setting values of the process parameters are changed.

Preferably, the capacitance control unit 76 may include a microcomputer and map the properties of the current ratio $I_{IND}/I_{RF}$ and the peak value $V_{PP}$, such as the dependencies thereof on the coil capacitance, as shown in FIG. 3, in a table memory. Further, the capacitance control unit 76 may select the most appropriate capacitance of the variable capacitor 74 for a corresponding process or most appropriately dynamically vary the capacitance of the variable capacitor 74 based on information such as a capacitance setting value (target value), a process recipe, a process parameter or the like obtained from the main control unit 75 and, furthermore, by feedback control or the like performed by using the coil current monitoring unit or the $V_{PP}$ monitoring unit.

As shown in the aforementioned electromagnetic system simulations, in case that the floating coil 70 includes no variable capacitor 74 (the cutout portion G is provided to be disconnected from the coil conductor), the induced current $I_{IND}$ flows through the floating coil 70 at a regular rate (e.g., about 60% in the above example) that is smaller than that of the antenna current $I_{RF}$ flowing through the RF antenna 54. On the other hand, in case that the floating coil 70 includes the variable capacitor 74, the current value of the induced current $I_{IND}$ flowing through the floating coil 70 is widely varied depending on the electrostatic capacitance of the variable capacitor 74 and, thus, the density of the plasma in the doughnut shape is widely varied around the portion immediately below the floating coil 70.

As the electrostatic capacitance of the variable capacitor 74 is increased, the induced current $I_{IND}$ is monotonously increased from about 10% to about 800% of the antenna current $I_{RF}$, especially in the section between the capacitance position "A" (100 pF) and the capacitance position "B" (500 pF). Accordingly, around the portion immediately below the floating coil 70, the density of the plasma in the doughnut shape is significantly changed from an approximately flat state to a locally high uplifted state.

In the section between the capacitance position "C" (730 pF) and the capacitance position "D" (1400 pF), as the electrostatic capacitance of the variable capacitor 74 is increased, the induced current $I_{IND}$ is monotonously decreased from about 320% to about 120% of the antenna current $I_{RF}$. Accordingly, around the portion immediately below the floating coil 70, the density of the plasma in the doughnut shape is significantly changed from a locally high uplifted state to a locally depressed state.

Further, it is noted that, even though the induced current $I_{IND}$ flowing through the floating coil 70 in the capacitance position "D" is ten times or more as large as that in the capacitance position "A," the density of the plasma in the doughnut shape around the portion immediately below the floating coil 70 is in an approximately flat state in the case of the capacitance position "A." On the other hand, the density of the plasma in the doughnut shape locally significantly falls down in the case of the capacitance position "D."

Figure 5:
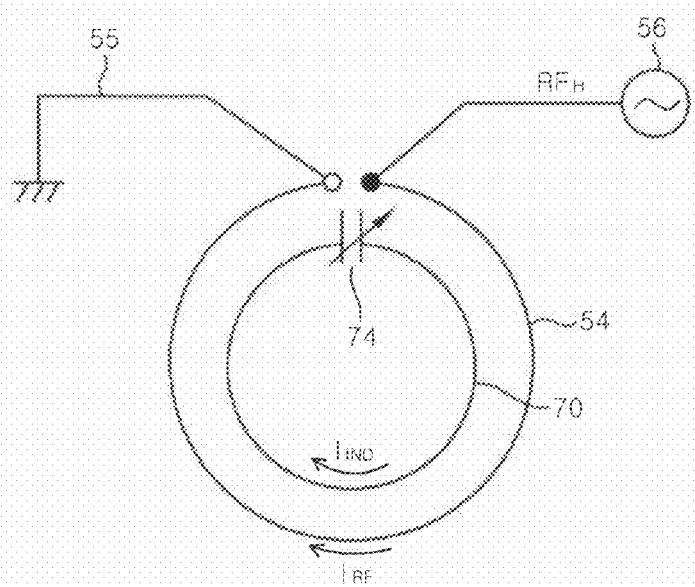
FIG. 5 shows a model (basic configuration) for explaining an operation when an electrostatic capacitance of a variable capacitor is varied in the floating coil.

The above function of the floating coil 70, especially when the electrostatic capacitance of the variable capacitor is changed, may be easily understood by using a simple model (basic configuration) shown in FIG. 5. In FIG. 5, the RF antenna 54 and the floating coil 70 are formed of circular ring-shaped single-wound coils having different radiuses and concentrically arranged adjacent to each other.

In the model shown in FIG. 5, when the RF power $RF_H$ of a frequency f is supplied from the RF power source 56 to the RF antenna 54 and, thus, the antenna current $I_{RF}$ flows through the RF antenna 54, an electromotive force, i.e., an induced electromotive force $I_{IND}$, generated in the floating coil 70 by the electromagnetic induction is represented by the following Eq. 1 by Faraday's law.

$$V_{IND} = -d\Phi/dt = -i\omega M I_{RF} \qquad \text{Eq. 1,}$$

where $\omega$ is the angular frequency ($\omega = 2\pi f$), and M is the mutual inductance between the RF antenna 54 and the floating coil 70. Moreover, since the mutual inductance between the RF antenna 54 and the floating coil 70 is relatively small in Eq. 1, it is disregarded.

The current (induced current) $I_{IND}$ flowing through the floating coil 70 by the induced electromotive force $V_{IND}$ is represented by the following Eq. 2.

$$I_{IND} = V_{IND}/Z_{70} = i M \omega I_{RF}/\{R_{70} + i(L_{70}\omega - 1/C_{74}\omega)\} \qquad \text{Eq. 2,}$$

where $Z_{70}$, $R_{70}$, $L_{70}$ and $C_{74}$ are the impedance of the floating coil 70, the resistance (including a resistance component caused by a power absorbed to the plasma) of the floating coil 70, the self inductance of the floating coil and the electrostatic capacitance of the variable capacitor 74, respectively.

Since the equation, $|R_{70}| \leq |L_{70}\omega - 1/C_{74}\omega|$, is satisfied in the floating coil 70 of typical material and structure to be used for a typical purpose, the induced current $I_{IND}$ is represented by the following approximate Eq. 3.

$$I_{IND} \approx -M\omega I_{RF}/(L_{70}\omega - 1/C_{74}\omega) \qquad \text{Eq. 3,}$$

The Eq. 3 shows how the direction of the induced current $I_{IND}$ flowing through the floating coil 70 is changed in the circling direction depending on the electrostatic capacitance $C_{74}$ of the variable capacitor 74.

Specifically, if a value of the electrostatic capacitance $C_{74}$ of the variable capacitor 74 is determined as $C_R$ when the series resonance is generated in the floating coil 70, in case that $C_{74}$ is greater than $C_R$, $L_{70}\omega$ becomes greater than $1/C_{74}\omega$. That is, the reactance, $L_{70}\omega - 1/C_{74}\omega$, of the floating coil 70 becomes positive. Accordingly, a negative (the direction reverse to that of the antenna current $I_{RF}$ in the circling direction) induced current $I_{IND}$ flows through the floating coil 70. On the other hand, in case that $C_{74}$ is smaller than $C_R$, $L_{70}\omega$ becomes smaller than $1/C_{74}\omega$. That is, the reactance, $L_{70}\omega - 1/C_{74}\omega$, of the floating coil 70 becomes negative. Accordingly, a positive (the direction identical to that of the current $I_{RF}$ flowing through the RF antenna 54 in the circling direction) induced current $I_{IND}$ flows through the floating coil 70. These properties are indicated by the graph (plot diagram) shown in FIG. 6.

Figure 6:
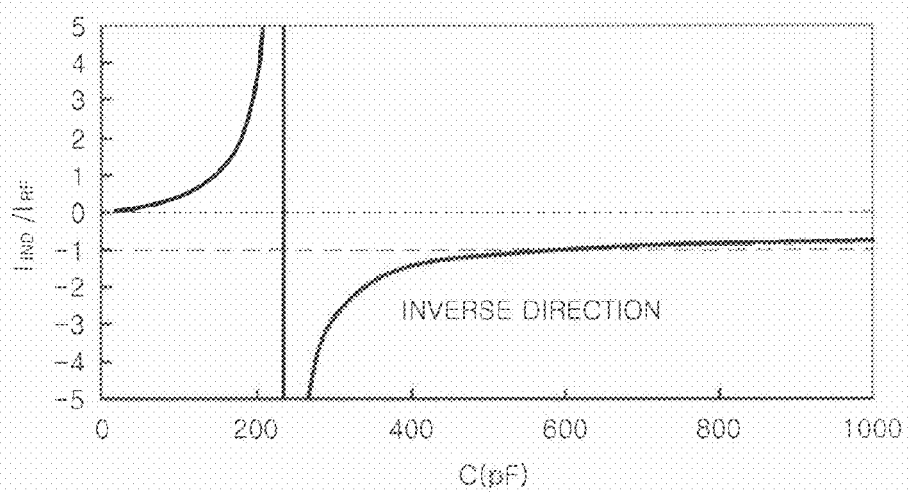
FIG. 6 shows how a ratio of an induced current to an antenna current is changed when an electrostatic capacitance of a variable capacitor is varied in the floating coil.

In the graph shown in FIG. 6, the horizontal axis denotes the electrostatic capacitance $C_{74}$ of the variable capacitor 74, which is ranged from 20 pF to 1000 pF. The vertical axis denotes the ratio $I_{IND}/I_{RF}$ of the induced current $I_{IND}$ to the antenna current $I_{RF}$, which indicates at which current ratio of the induced current $I_{IND}$ to the antenna current $I_{RF}$ the induced current $I_{IND}$ flows through the floating coil 70. When the current ratio $I_{IND}/I_{RF}$ is positive, the induced current $I_{IND}$ flows in the direction circumferentially identical to that of the antenna current $I_{RF}$. On the other hand, the current ratio $I_{IND}/I_{RF}$ is negative, the induced current $I_{IND}$ circumferentially flows in the direction reverse to that of the antenna current $I_{RF}$. For the calculation of the graph, $f(\omega/2\pi)$, M and $R_{70}$ were set to be, e.g., 13.56 MHz, 350 nH and 580 nH, respectively. In this case, as the electrostatic capacitance $C_{74}$ of the variable capacitor 74 when the series resonance is generated in the floating coil 70, the value $C_R$ is calculated as about 230 pF from the resonance condition, $L_{70}\omega = 1/C_R\omega$.

As shown in FIG. 6, when the electrostatic capacitance $C_{74}$ of the variable capacitor 74 is, e.g., 20 pF, the induced current $I_{IND}$ becomes a positive value close to zero. If the value of the electrostatic capacitance $C_{74}$ is increased from 20 pF, the induced current $I_{IND}$ is gradually increased in the positive direction identical to that of the antenna current $I_{RF}$ and, resultantly, becomes larger than the antenna current $I_{RF}$. From then on, the induced current $I_{IND}$ is increased exponentially and has the maximum value immediately before the value of the electrostatic capacitance $C_{74}$ becomes identical to the value $C_R$. Then, if the induced current $I_{IND}$ becomes smaller than the antenna current $I_{RF}$ at that time, the large induced current $I_{IND}$ flows in the negative direction (reverse to that of the antenna current $I_{RF}$). Further, if the value of the electrostatic capacitance $C_{74}$ is increased, the induced current $I_{IND}$ becomes smaller like an algebraic function in the negative direction. Finally, the induced current $I_{IND}$ gradually approaches a value $I_S$ whose absolute value is smaller than the antenna current $I_{RF}$. Here, the saturation value $I_s$ approaches $MI_{RF}/L_{70}$. In the above example (M=350 nH and $L_{70}$=580 nH), the value $I_s$ approaches 0.6 $I_{RF}$.

The simulation results shown in FIGS. 3 and 4 may be understood by referring to the property shown in FIG. 6. Specifically, the section between the capacitance position "A" (100 pF) and the capacitance position "B" (500 pF) corresponds to the section where the current ratio $I_{IND}/I_{RF}$ is negative in FIG. 6, and the induced current $I_{IND}$ flows in the direction reverse to that of the antenna current $I_{RF}$ in the circling direction in the section.

An especially important point of the operations of floating coil 70 is that the direction in which the induced current $I_{IND}$ flows is changed depending on the electrostatic capacitance of the variable capacitor 74 and, thus, a different effect (operational effect) is exerted on the density distribution of the plasma generated in the doughnut shape in the chamber 10.

In other words, when the induced current $I_{IND}$ flows through the floating coil 70 in the direction reverse to that of the antenna current $I_{RF}$ in the circling direction, the operation effect decreases locally the intensity of the induced magnetic field or the density of the inductively coupled plasma at a portion immediately below its coil conductor. As the current value of the induced current $I_{IND}$ is increased, such plasma density decreasing effect becomes larger.

On the other hand, when the induced current $I_{IND}$ flows through the floating coil 70 in the direction identical to that of the antenna current $I_{RF}$ in the circling direction, the operation effect increases locally the intensity of the induced magnetic field or the density of the inductively coupled plasma at the portion immediately below the coil conductor. As the current value of the induced current $I_{IND}$ is increased, such plasma density increasing effect becomes larger.

Accordingly, by varying the electrostatic capacitance of the variable capacitor 74, it is possible to freely control the density distribution of the plasma generated in the doughnut shape in the chamber 10 and, furthermore, it is possible to freely or variously control the plasma density distribution around the susceptor 12 obtained resultantly as the plasma in the doughnut plasma is diffused in all directions (especially, diametric direction) in the processing space.

Moreover, the efficiency of supplying the RF power may be improved by the effect that is positively exerted on the generation of the inductively coupled plasma in not only the RF antenna 54 but also the floating coil 70 by allowing the induced current $I_{IND}$ to flow through the floating coil 70 in the direction identical to that of the antenna current $I_{RF}$ in the circling direction as described above. In other words, in case that the floating coil 70 is positively used to generate the inductively coupled plasma, the load of the RF antenna 54 side becomes lower and, thus, it is possible to reduce the RF current $I_{RF}$ supplied to the RF antenna 54. Accordingly, it is possible to reduce the loss of the RF power $RF_H$ generated in various units (especially, the matcher 58, the RF power supply line 60 and the like) of the RF power supply system.

Figure 7:
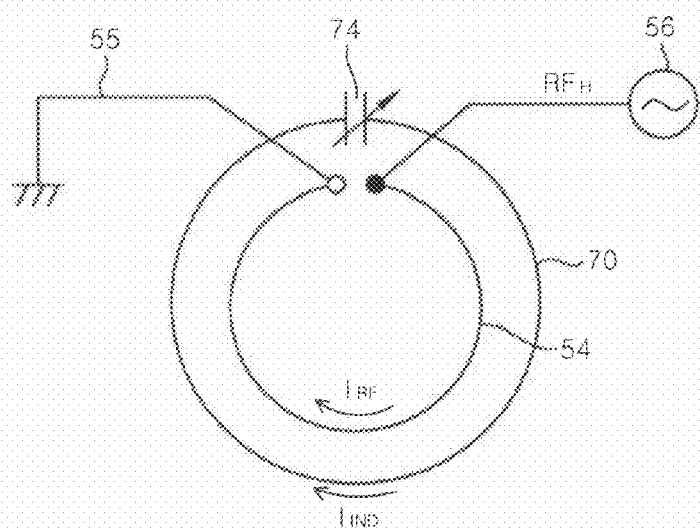
FIG. 7 shows a modification of the model shown in FIG. 5.

Although the floating coil 70 is arranged at the diametrically inner portion of RF antenna 54 in the model shown in FIG. 5, the same effect may be obtained from the configuration shown in FIG. 7 where the floating coil 70 is arranged at a diametrically outer portion of RF antenna 54. In other words, in the case of the same mutual inductance M, the induced current $I_{IND}$ having the same magnitude flows through the floating coil 70 in the same direction regardless of whether the floating coil 70 is arranged at the diametrically inner or outer portion of the RF antenna 54.

Most of all, if the floating coil 70 is arranged to be separated from the RF antenna 54 by a large distance, the mutual inductance M becomes smaller and, thus, the induced electromotive power $V_{IND}$ excited becomes weakened (lowered). In this case, however, it is possible to obtain the induced electromotive power $V_{IND}$ having a practically sufficient magnitude by a series resonance state or a state near thereto made by adjusting the electrostatic capacitance $C_{74}$ of the variable capacitor 74.

Here, when the series resonance state or the state near thereto is made in the floating coil 70, the following approximate Eq. 4 is used instead of the approximate Eq. 3.

$$I_{IND} \approx -iM\omega I_{RF}/R_{70} \qquad \text{Eq. 4}$$

As seen from the approximate Eq. 4, in case that the series resonance state or the state near thereto is made in the floating coil 70, there is an about 90-degree phase difference between the induced current $I_{IND}$ and the antenna current $I_{RF}$. In this case, if the mutual inductance M is too small, i.e., the coefficient $M\omega/R_{70}$ of the approximate Eq. 4 is too small, the approximate Eq. 4 is not practical. Accordingly, the coefficient $M\omega/R_{70}$ of the approximate Eq. 4 is required to be greater than 1. That is, the following conditional Eq. 5 is required.

$$M\omega > R_{70} \text{ or } 2\pi f M > R_{70} \qquad \text{Eq. 5}$$

Here, $R_{70}$ in the right side is the resistance of the floating coil 70, which is obtained by performing the sum ($R_{70c}+R_{70p}$) of the resistance $R_{70c}$ of its coil conductor and the resistance $R_{70c}$ corresponding to the power absolved by the plasma side. However, the resistance $R_{70c}$ of the coil conductor is dominant, but the resistance $R_{70p}$ may be disregarded on the design.

When each of the RF antenna 54 and the floating coil 70 is the circular ring-shaped single-wound coil as shown in FIG. 5 or 7 and the radiuses of the two coils 54 and 70 and the distance therebetween are respectively represented by "a," "b" and "d," the mutual inductance M is represented by the following Eq. 6.

$$M_{12} = \mu_0 \sqrt{ab} \left( \left( \frac{2}{k} - k \right) K(k) - \frac{2}{k} E(k) \right) \qquad \text{Eq. 6}$$

$$k = \frac{4ab}{(a+b)^2 + d^2}$$

$$K(k) = \int_0^{\pi/2} \frac{d\varphi}{\sqrt{1-k^2\sin^2\varphi}}$$

$$E(k) = \int_0^{\pi/2} \sqrt{1-k^2\sin^2\varphi}\, d\varphi$$

Figure 8:
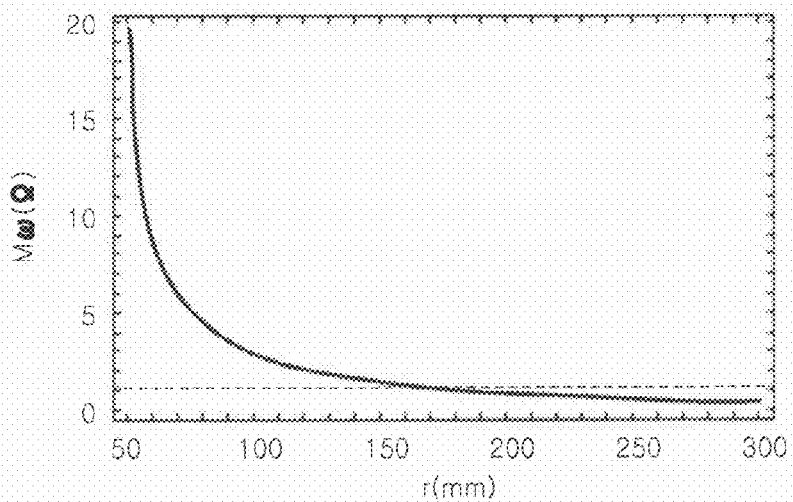
FIG. 8 shows dependence of the multiplication of mutual inductance and angular frequency on a radius of the floating coil.

As an example, in case that the RF antenna 54 of the radius of e.g., 50 mm and the floating coil of a radius "r" are arranged to be concentric with each other, the multiplication $M\omega$ of the mutual inductance M and the angular frequency $\omega$ depends on the radius "r" of the floating coil 70 in the property shown in FIG. 8. Here, $f(\omega/2\pi)$ is set to be, e.g., 13.56 MHz.

If the resistance R of the floating coil 70 is estimated as 1Ω, which is the typical value of the resistance R of the floating coil 70, an equation, r<about 150 mm, is obtained. In other words, if the radius "r" of the floating coil 70 is smaller than a distance of three times the radius of 50 mm of the RF antenna 54, the multiplying $M\omega$ becomes greater than 1. That is, the condition given by Eq. 5 is satisfied.

Moreover, the property shown in FIG. 8 is obtained under the assumption that the floating coil 70 is arranged at the diametrically outer portion of the RF antenna 54. In case that the floating coil 70 is arranged at the diametrically inner portion of the RF antenna 54, the relationship therebetween is reversely obtained. Accordingly, if the radius of 50 mm of the RF antenna 54 is smaller than a distance that is about three times the radius "r" of the floating coil 70, the multiplying $M\omega$ becomes greater than 1. That is, the condition given by Eq. 5 is satisfied. From another point of view, if the radius "r" of the floating coil 70 is equal to or greater than a distance that is about ⅓ times the radius of the RF antenna 54, the multiplying $M\omega$ becomes greater than 1. That is, the condition given by Eq. 5 is satisfied.

(Second Embodiment)

Next, a second embodiment of the present invention will be described with reference to FIGS. 9 to 13.

Figure 9:
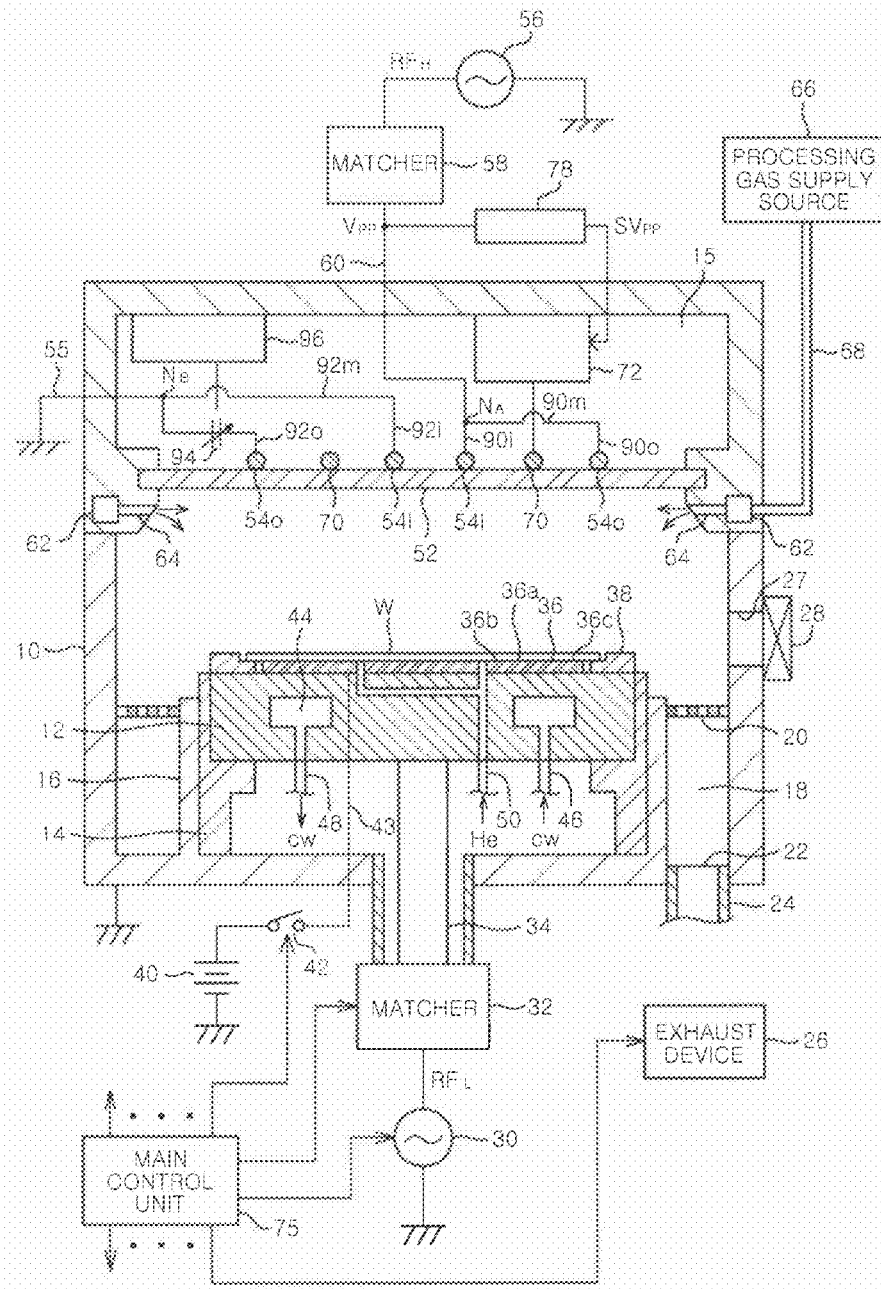
FIG. 9 is a longitudinal cross sectional view showing a configuration of an inductively coupled plasma processing apparatus in accordance with a second embodiment of the present invention.
Figure 10:
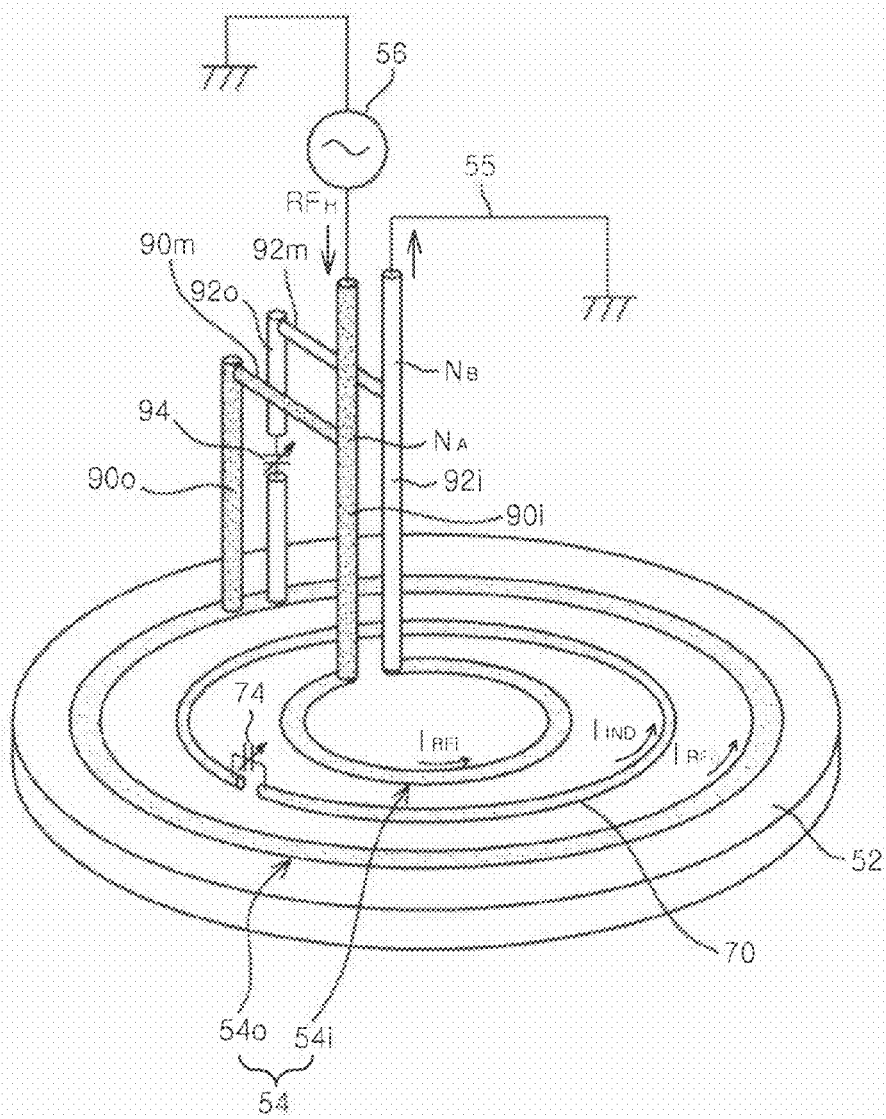
FIG. 10 is a perspective view showing a layout configuration of an RF antenna and a floating coil in the inductively coupled plasma processing apparatus shown in FIG. 9.

FIG. 9 shows a configuration of an inductively coupled plasma processing apparatus in accordance with the second embodiment of the present invention, and FIG. 10 shows a layout configuration of the RF antenna 54 and the floating coil 70 in accordance with the second embodiment of the present invention. In the following description and drawings, components having substantially the same configuration and function as those of the aforementioned first embodiment (FIG. 1) are denoted by like reference characters.

In the second embodiment, the RF antenna 54 includes an inner circular ring-shaped coil $54_i$ and an outer circular ring-shaped coil $54_o$. The inner coil $54_i$ and the outer coil $54_o$ are electrically in parallel, via connection conductors $90_i$ and $90_o$ and $92_i$ and $92_o$, to the RF power supply unit, i.e., between a node $N_A$ at the power supply line 60 side from the RF power supply 56 and a node $N_B$ at a ground line side to the ground potential member and respectively arranged at an inner and an outer portion on the dielectric window 52 diametrically separately from each other. The floating coil 70 is diametrically arranged at a central portion between the inner coil $54_i$ and the outer coil $54_o$. In the second embodiment, it is preferable that all of the inner coil $54_i$, the outer coil $54_o$ and the floating coil have a mutually similar shape and are arranged on the dielectric window 52 to be concentric with one another. Further, the floating coil 70 is preferably arranged at the same distance from each of the inner coil $54_i$ and the outer coil $54_o$.

By using a configuration where the inner coil $54_i$, the outer coil $54_o$ and the floating coil 70 have a mutually similar shape; and the floating coil 70 is concentrically arranged at the central portion between the inner coil $54_i$ and the outer coil $54_o$, it is possible to independently control each of the balance between distributed currents in the RF antenna 54 (the inner coil $54_i$ and the outer coil $54_o$) and the direction and the magnitude (current value) of the induced current $I_{IND}$ flowing through the floating coil 70.

By using the configuration where the floating coil 70 as well as the inner coil $54_i$ and the outer coil $54_o$ are arranged on the dielectric window 52, the floating coil 70 similar to the inner coil $54_i$ and the outer coil $54_o$ may positively contribute to the generation of the induced plasma at the maximum efficiency from a closest portion to the plasma generation space in the chamber 10.

In the second embodiment, there is further provided a variable capacitor 94 that is connected in parallel to the inner coil $54_i$ and in series to the outer coil $54_o$ in order to freely control the balance (ratio) between distributed currents $I_{RFi}$ and $I_{RFo}$ respectively flowing through the inner coil $54_i$ and the outer coil $54_i$ in the RF antenna 54. An electrostatic capacitance of the variable capacitor 94 may be varied by a capacitance control unit 96 under the control of the main control unit 75. Further, the variable capacitor 94 may be provided (connected in series to the inner coil $54_i$) in the inner coil $54_i$.

In the antenna chamber 15 (FIG. 9), as shown in FIG. 10, horizontal branch lines or jumper wires 90m and 92m are respectively formed at portions separated by a sufficiently large distant from the connection conductors $90_i$ and $90_o$ and $92_i$ and $92_o$ extending uprightly with regard to the RF antenna 54. Accordingly, an electronic influence thereof on the RF antenna 54 and the floating coil 70 becomes reduced.

Figure 11A:
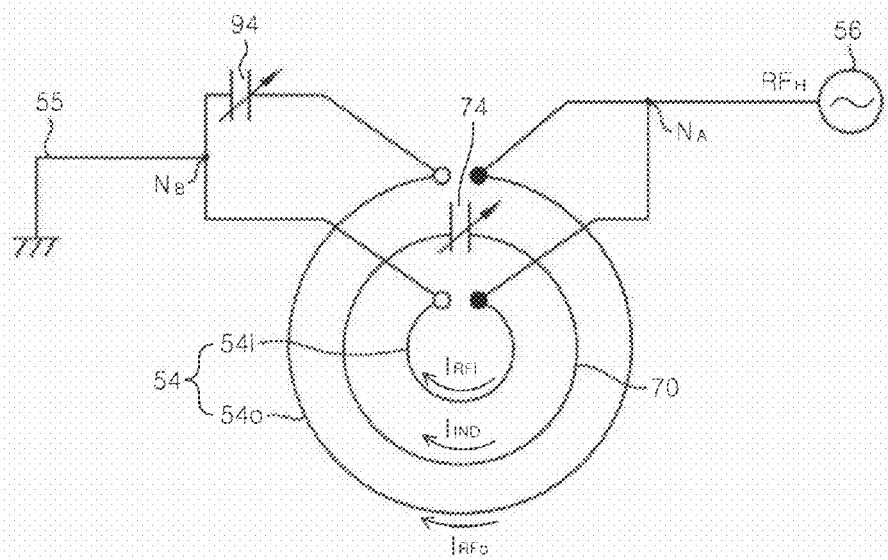
FIG. 11A shows a preferable configuration of layout and electric connection of an RF antenna and a floating coil in accordance with the second embodiment.
Figure 11B:
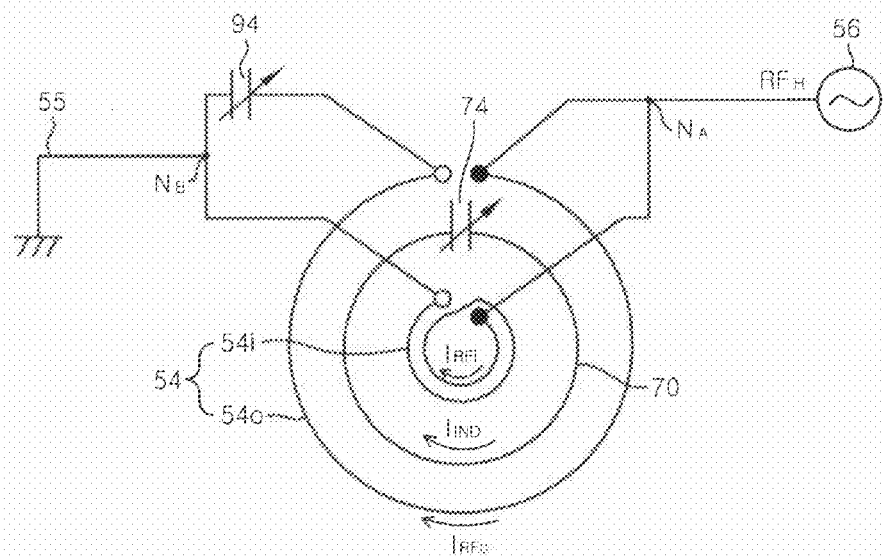
FIG. 11B shows another preferable configuration of layout and electric connection of an RF antenna and a floating coil in accordance with the second embodiment.

FIG. 11A shows a preferable configuration of layout and electric connection of the RF antenna 54 and the floating coil 70 in accordance with the second embodiment. All of the inner coil $54_i$ and the outer coil $54_o$ of the RF antenna 54 and, furthermore, the floating coil 70 may be formed of a multi-wound coil without being limited to the single-wound coil. For example, as shown in FIG. 11B, the outer coil $54_o$ and the floating coil 70 may be formed of single-wound coils, and the inner coil $54_i$ may be formed of a two-wound coil.

The following simulations for the inductively coupled plasma etching apparatus in accordance with the second embodiment were performed by the present inventors.

Specifically, electrostatic capacitances $C_{74}$ and $C_{94}$ of the variable capacitors 74 and 94 in the floating coil 70 and the RF antenna 54 were respectively stepwisely varied as parameters between 24 and 1495 pF ($C_{74}$); and 126 and 1321 pF ($C_{94}$), and when the RF power $RF_H$ was supplied to the RF antenna 54, each of the distributed currents $I_{RFi}$ and $I_{RFo}$ flowing through the inner coil $54_i$ and the outer coil $54_o$ in the RF antenna 54 and a current value of the induced current $I_{IND}$ flowing through the floating coil 70 was measured. Further, the electron density distribution (corresponding to plasma density distribution) in the radial direction was obtained at a portion (separated from the top surface by about 5 mm) in the plasma in the doughnut shape.

As main process conditions in the simulations, the frequency and an RF level of the RF power $RF_H$ were set to be, e.g., 13.56 MHz and 1500 W, and the pressure inside the chamber 10 was set to be, e.g., 100 mTorr. As the processing gas, a gaseous mixture of Ar and $O_2$ was employed at the flow rate of 300/30 sccm. Further, as specifications of the RF antenna 54 (the inner coil $54_i$ and the outer coil $54_o$) and the floating coil 70, the layout configuration shown in FIG. 11B was employed, and the radiuses of the inner coil $54_i$ (single-wound), the outer coil $54_o$ (two-wound) and the floating coil 70 (single-wound) were respectively set to be, e.g., 50, 150 and 100 mm.

Figure 12:
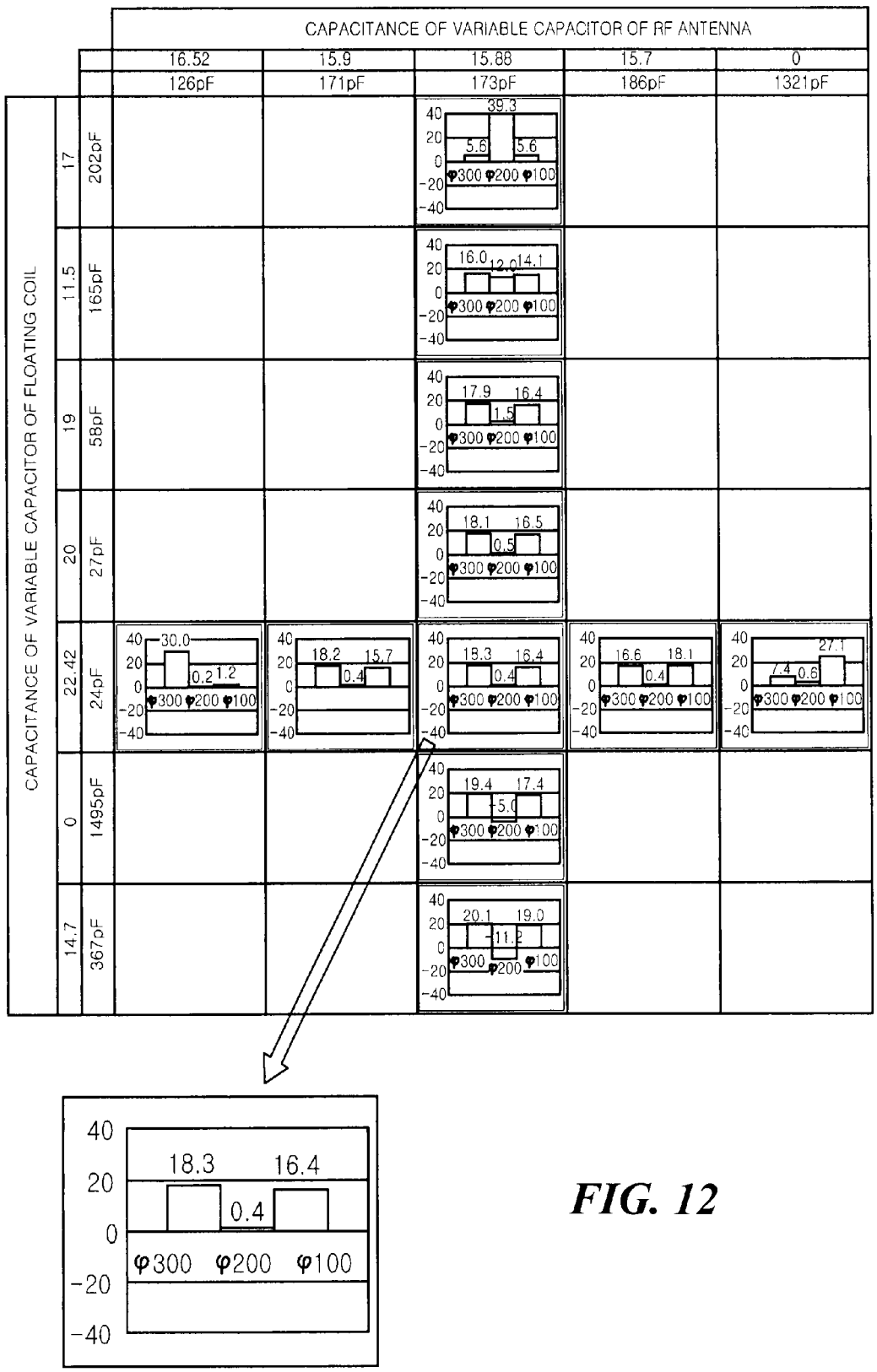
FIG. 12 shows data of each coil current obtained from a test in accordance with the second embodiment.
Figure 13:
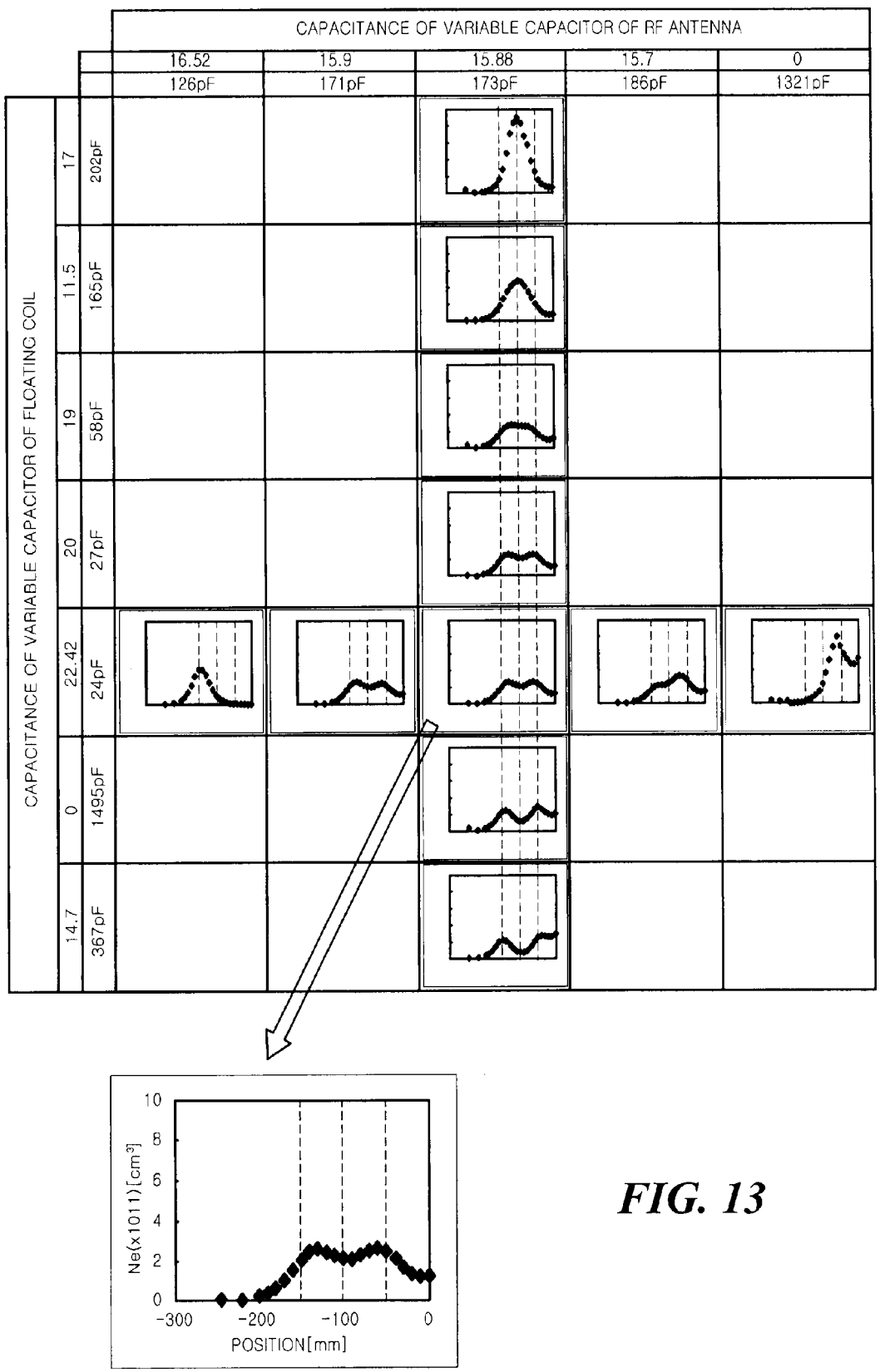
FIG. 13 shows data of an electron density distribution (corresponding to plasma density distribution) in a diametric direction obtained in a simulation in accordance with the second embodiment.

The results (data) obtained in the simulations are shown in FIGS. 12 and 13.

Each bar graph shown in FIG. 12 uses three bars to indicate the distributed currents $I_{RFi}$ and $I_{RFo}$ and the induced current $I_{IND}$ for each combination of the electrostatic capacitances $C_{74}$ and $C_{94}$ of the variable capacitors 74 and 94 in the floating coil 70 and the RF antenna 54. In each bar graph, a right, a left and a central bar respectively indicate the distributed current $I_{RFi}$ flowing through the inner coil $54_i$, the distributed current $I_{RFo}$ flowing through the outer coil $54_o$ and the induced current $I_{IND}$ flowing through the floating coil 70. The bars of the distributed currents $I_{RFi}$ and $I_{RFo}$ are constantly positive because they are based on the direction in which the distributed currents $I_{RFi}$ and $I_{RFo}$ flow in the circling direction. The bar of the induced current $I_{IND}$ is positive when the induced current $I_{IND}$ flows in the direction that is circumferentially identical to those of the distributed currents $I_{RFi}$ and $I_{RFo}$; and negative when the induced current $I_{IND}$ flows in the direction that is circumferentially reverse to those of the distributed currents $I_{RFi}$ and $I_{RFo}$.

FIG. 13 shows the electron density distribution (corresponding to plasma density distribution) in the radial direction at the portion (separated from the top surface by about 5 mm) in the plasma in the doughnut shape for each combination of the electrostatic capacitances $C_{74}$ and $C_{94}$ of the variable capacitors 74 and 94 in the floating coil 70 and the RF antenna 54. In each electron density distribution graph, a position of a right end of the horizontal axis corresponds to a position (r=0 mm) on the central axis of the chamber 10.

In the simulations, the following analyses may be made for the bar graph data (FIG. 12) obtained by fixing the electrostatic capacitance $C_{94}$ of the variable capacitor 94 as 173 pF and stepwisely increasing the electrostatic capacitance $C_{74}$ of the variable capacitor 74 as 24→27→58→165 pF; and the electron density (plasma density) distribution data (FIG. 13) of the plasma in the doughnut shape.

In this case, as shown in FIG. 12, the distributed currents $I_{RFi}$ and $I_{RFo}$ respectively flowing through the inner coil $54_i$ and the outer coil $54_o$ are respectively slightly changed as 14.1 A to 16.4 A and 16.0 A to 18.3 A, while the induced current $I_{IND}$ flowing through the floating coil 70 is rapidly increased as 0.4 A→0.5 A→1.5 A→12 A, positively (in the direction identical to those of the distributed currents $I_{RFi}$ and $I_{RFo}$). Moreover, when the electrostatic capacitance $C_{74}$ is 202 pF, the series resonance state or the state near thereto is made and the induced current $I_{IND}$ is increased to 39.3 A. At this time, the distributed currents $I_{RFi}$ and $I_{RFo}$ are decreased to 4.6 and 5.8 A, respectively.

Meanwhile, in this case, the electron density (plasma density) distribution, as shown in FIG. 13, shows an approximately flat profile at an inner section (r=50 to 100 mm) of the RF antenna 54 when the induced current $I_{IND}$ is 0.4 to 1.5 A. If the induced current $I_{IND}$ becomes 12 A, the electron density distribution shows a profile where it is locally increased around the portion (r=100 mm) immediately below the floating coil 70. If the induced current $I_{IND}$ becomes 39.3 A, the electron density distribution shows a profile where such increase becomes significantly larger.

As such, it is very interesting and important results that, in case that the distributed currents $I_{RFi}$ and $I_{RFo}$ of about 14 to 16 A and about 16 to 18 A respectively flow through the inner coil $54_i$ and the outer coil $54_o$ in the RF antenna 54, when the small (1/10 or less) induced current $I_{IND}$ of about 0.5 to 1.5 A flows through the floating coil 70 in the direction circumferentially identical to those of the distributed currents $I_{RFi}$ and $I_{RFo}$, the electron density (plasma density) distribution shows an approximately flat profile.

This is because, in case that no floating coil 70 is provided, the plasma generated around the portion immediately below the inner coil $54_i$ and the outer coil $54_o$ in the RF antenna 54 becomes diffused in the diametric direction and, thus, the plasma of a significantly high density is located at a central section of the coils $54_i$ and $54_o$. Accordingly, if a small (about 0.4 to 1.5 A in the example) current is allowed to flow in the direction circumferentially identical to those of the distributed currents $I_{RFi}$ and $I_{RFo}$ through an intermediate coil (floating coil 70) independent from the coils $54_i$ and $54_o$, this positively contributes to the generation of the inductively coupled plasma around a portion immediately below the intermediate coil and, thus, it is possible to make the plasma density uniform in the diametric direction.

From another point of view, it is required to configure the variable capacitor 74 to supply an electrostatic capacitance of a sufficiently smaller level (about 10 to 80 pF) than the level (about 202 pF) causing the series resonance in order to make approximately flat the electron density (plasma density) distribution of the plasma in the doughnut shape, or in order to obtain the small induced current $I_{IND}$ flowing in the direction identical to those of the distributed currents $I_{RFi}$ and $I_{RFo}$, by positively adding or allowing the floating coil 70 into or to contribute to the generation of the inductively coupled plasma.

Next, in the simulations, the following analyses may be made for the bar graph data (FIG. 12) obtained by fixing the electrostatic capacitance $C_{94}$ of the variable capacitor at 173 pF and stepwisely increasing the electrostatic capacitance $C_{74}$ of the variable capacitor 74 as 367→1495 pF; and the electron density (plasma density) distribution data (FIG. 13) of the plasma in the doughnut shape.

In this case, since the electrostatic capacitance $C_{74}$ of the variable capacitor 74 is changed in a section that is beyond the level (around 202 pF) causing series resonance, the bar graph of the induced current $I_{IND}$ is negative as shown in FIG. 12. That is, the induced current $I_{IND}$ flows through the floating coil 70 in the direction circumferentially reverse to those of the distributed currents $I_{RFi}$ and $I_{RFo}$. Further, when the electrostatic capacitance $C_{74}$ is 367 pF, which is close to the level (around 202 pF) causing the series resonance, the current value (absolute value) of the induced current $I_{IND}$ is 11.2 A, which is a relatively large value. On the other hand, when the electrostatic capacitance $C_{74}$ is 1495 pF, which is significantly distant from the level (around 202 pF) causing the series resonance, the current value (absolute value) of the induced current $I_{IND}$ is 5.0 A, which is a relatively small value. In the meantime, the current values of the distributed currents $I_{RFi}$ and $I_{RFo}$ flowing through the inner coil $54_i$ and the outer coil $54_o$ are 17.4 to 19.0 A and the 19.4 to 20.1 A, respectively, which are not significantly changed.

In this case, the electron density (plasma density) distribution, as shown in FIG. 13, shows a profile where it is locally decreased around the portion (r=100 mm) immediately below the floating coil 70 when the electrostatic capacitance $C_{74}$ is 367 pF (the induced current $I_{IND}$ is −11.2 A). The electron density distribution shows a profile where such decrease becomes significantly larger when the electrostatic capacitance $C_{74}$ is 1495 pF (the induced current $I_{IND}$ is −5.0 A). This is because, since the direction in which the induced current $I_{IND}$ flows through the floating coil 70 is circumferentially reverse to that in which the distributed currents $I_{RFi}$ and $I_{RFo}$ flow through the inner coil $54_i$ and the outer coil $54_o$ of the RF antenna 54, the induced magnetic field becomes weakened around the portion immediately below the floating coil 70, to thereby suppress the generation of the inductively coupled plasma.

Next, in the simulations, the following analyses may be made for the bar graph data (FIG. 12) obtained by fixing the electrostatic capacitance $C_{74}$ of the variable capacitor at 24 pF and stepwisely increasing the electrostatic capacitance $C_{94}$ of the variable capacitor 94 as 126→171→173→186→1321 pF; and the electron density (plasma density) distribution data (FIG. 13) of the plasma in the doughnut shape.

In this case, as shown in FIG. 12, the balance (ratio) between the distributed currents $I_{RFi}$ and $I_{RFo}$ respectively flowing through the inner coil $54_i$ and the outer coil $54_o$ in the RF antenna 54 is significantly changed.

Specifically, when the electrostatic capacitance $C_{94}$ is 126 pF, the distributed currents $I_{RFi}$ and $I_{RFo}$ respectively are 1.2 and 30.0 A, and the distributed current $I_{RFi}$ is equal to or greater than the distributed current $I_{RFo}$ as for the balance. On the other hand, when the electrostatic capacitance $C_{94}$ is 171 pF, the distributed currents $I_{RFi}$ and $I_{RFo}$ respectively are 15.7 and 18.2 A, and, even if the distributed current $I_{RFi}$ is greater than the distributed current $I_{RFo}$ to be accurate as for the balance, it can be considered that the distributed current $I_{RFi}$ is approximately equal to the distributed current $I_{RFo}$. Further, when the electrostatic capacitance $C_{94}$ is 173 pF, the distributed currents $I_{RFi}$ and $I_{RFo}$ respectively are 16.4 and 18.3 A, and the distributed current $I_{RFi}$ is more closely approximated to be equal to the distributed current $I_{RFo}$.

When the electrostatic capacitance $C_{94}$ is 186 pF, the distributed currents $I_{RFi}$ and $I_{RFo}$ respectively are 18.1 and 16.6 A, and the relationship therebetween becomes reverse, or the distributed current $I_{RFi}$ is smaller than the distributed current $I_{RFo}$, and it can also be considered that the distributed current $I_{RFi}$ is approximately equal to the distributed current $I_{RFo}$. Finally, when the electrostatic capacitance $C_{94}$ is 1321 pF, the distributed currents $I_{RFi}$ and $I_{RFo}$ respectively are 27.1 and 7.4 A, and the distributed current $I_{RFi}$ is equal to or smaller than the distributed current $I_{RFo}$.

In the meantime, although the electrostatic capacitance $C_{94}$ is changed from 126 to 1321 pF, the induced current $I_{IND}$ flowing through the floating coil 70 is changed only within 0.2 to 0.6 A. Further, the flowing direction of the current is not changed, and the current value is hardly changed.

As such, in the present embodiment, it is possible to independently control each of the direction and magnitude of the induced current $I_{IND}$ flowing through the floating coil 70 and the balance (ratio) between the distributed currents $I_{RFi}$ and $I_{RFo}$.

The main reason that such independent control is possible is because a mutual inductance $M_i$ between the floating coil 70 and the inner coil $54_i$ is equal to a mutual inductance $M_O$ between the floating coil 70 and the outer coil $54_o$.

When the distributed currents $I_{RFi}$ and $I_{RFo}$ respectively flow through the inner coil $54_i$ and the outer coil $54_o$ of the RF antenna 54, the induced electromotive force $V_{IND}$ generated in the floating coil 70 is obtained, due to their superposition, by adding an induced electromotive force generated in the floating coil 70 when the distributed current $I_{RFi}$ flows through the inner coil $54_i$ and an induced electromotive force generated in the floating coil 70 when the distributed current $I_{RFo}$ flows through the outer coil $54_o$. Here, when each mutual inductance $M_i$ and $M_O$ is equal to each other, it is seen from the Eqs. 1, 2 and 3 that the induced electromotive and, furthermore, the induced current generated in the floating coil 70 depend on the sum ($I_{RFi}+I_{RFo}$) of the distributed current $I_{RFi}$ and $I_{RFo}$ regardless of the ratio ($I_{RFi}/I_{RFo}$) of the distributed current $I_{RFi}$ to the distributed current $I_{RFo}$.

In this case, the electron density (plasma density) distribution, as shown in FIG. 13, shows a profile where it is locally swollen around a portion (r=150 mm) immediately below the distributed current $I_{RFo}$ when the electrostatic capacitance $C_{94}$ is 126 pF ($I_{RFi} \leq I_{RFo}$). Moreover, when the electrostatic capacitance $C_{94}$ is 171 or 173 pF (it can be considered that $I_{RFi} \approx I_{RFo}$, although $I_{RFi} < I_{RFo}$ to be accurate), the electron density distribution shows an approximately flat profile at a section (r=50 to 150 mm) immediately below the RF antenna 54. When the electrostatic capacitance $C_{94}$ is 186 pF (it can be considered that $I_{RFi} \approx I_{RFo}$ although $I_{RFi} > I_{RFo}$ to be accurate), the electron density distribution shows a profile where it is increased to be relatively higher around a portion immediately below the inner coil $54_i$ than around a portion immediately below the outer coil $54_o$. Finally, the electrostatic capacitance $C_{94}$ is 1321 pF ($I_{RFi} \geq I_{RFo}$), the electron density distribution shows a profile where it is locally significantly swollen around a portion (r=50 mm) immediately below the inner coil $54_i$.

As such, by varying the electrostatic capacitance $C_{94}$ of the variable capacitor 94 in the RF antenna 54, it is possible to freely control the balance between the distributed currents $I_{RFi}$ and $I_{RFo}$ and, furthermore, the balance between the densities of the inductively coupled plasma around the portions immediately below the inner coil $54_i$ and the outer coil $54_o$.

In the inductively coupled plasma etching apparatus in accordance with the aforementioned embodiment, it is possible to variably control the electrostatic capacitance of the variable capacitor 74 depending on the adjustment, the conversion and the change of the process conditions under the control of the main controller 75 during a single plasma process or a series of multiple plasma processes of one semiconductor wafer W.

Accordingly, through the entire processing time or the entire steps of the single-wafer plasma process, it is possible to freely, accurately control, at an any timing, the intensity of the RF magnetic field or the RF electric field generated around an antenna conductor (especially, the plasma generation space in the chamber 10) by the RF antenna current $I_{RF}$ flowing through the RF antenna 54 and, furthermore, the contributing operation (increasing or decreasing operation) or the degree (strength and weakness) of the floating coil 70. Therefore, it is possible to freely or variously control the plasma density around the susceptor 12 in the diametric direction and, thus, it becomes easy to make the plasma density distribution uniform in the diametric direction. Resultantly, it is possible to easily improve the uniformity of the plasma process.

[Modifications of Layouts of RF Antenna and Floating Coil]

FIGS. 14A to 22 show several modifications of layout configurations of the RF antenna 54 and the floating coil 70 that are applicable to the inductively coupled plasma etching apparatus in accordance with the second embodiment.

Figure 14A:
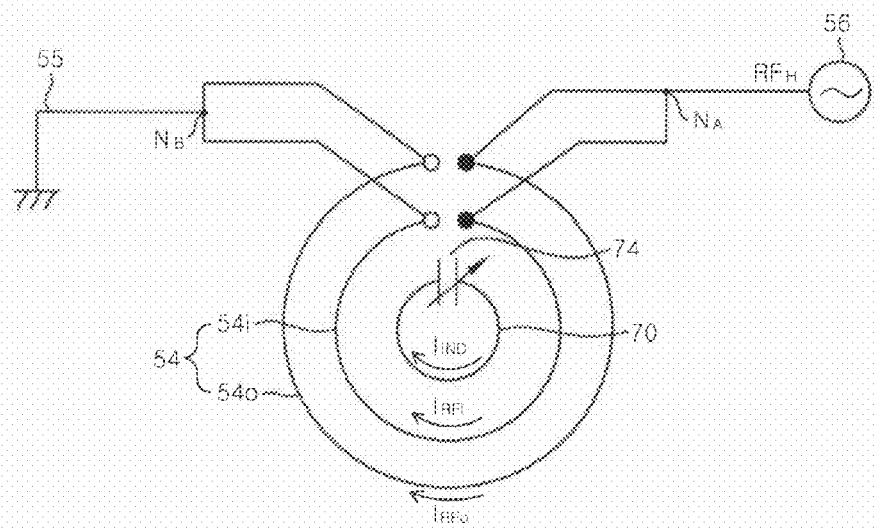
FIG. 14A shows a configuration example where the floating coil is arranged at a diametrically inner portion of an inner coil of the RF antenna.
Figure 14B:
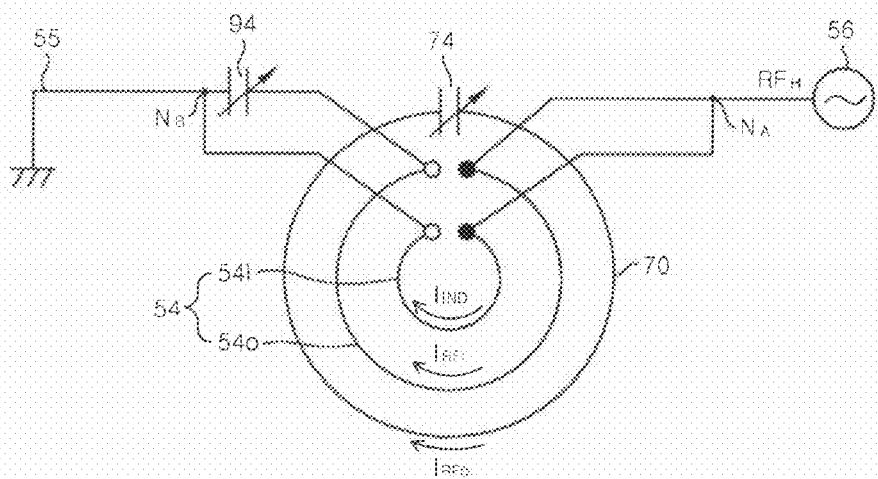
FIG. 14B shows a configuration example where the floating coil is arranged at a diametrically outer portion of an outer coil of the RF antenna.

FIGS. 14A and 14B respectively show configuration examples where the floating coil 70 is respectively arranged at a diametrically inner portion of the inner coil $54_i$ and a diametrically outer portion of the outer coil $54_o$ in case that the RF antenna 54 includes the inner coil $54_i$ and the outer coil $54_o$.

In the configuration example shown in FIG. 14A, a mutual inductance between the floating coil 70 and the inner coil $54_i$ is significantly larger than that between the floating coil 70 and the outer coil $54_o$. Accordingly, the induced $I_{IND}$ flowing through the floating coil 70 depends on the current $I_{RFi}$ flowing through the inner coil $54_i$ more than the current $I_{RFo}$ flowing through the outer coil $54_o$.

On the other hand, in the configuration example shown in FIG. 14B, a mutual inductance between the floating coil 70 and the outer coil $54_o$ is significantly larger than that between the floating coil 70 and the inner coil $54_i$. Accordingly, the induced $I_{IND}$ flowing through the floating coil 70 depends on the current $I_{RFo}$ flowing through the outer coil $54_i$ more than the current $I_{RFi}$ flowing through the inner coil $54_o$.

FIGS. 15A to 15D show configuration examples where a plurality of (e.g., two) floating coils $70_i$ and $70_o$ having different coil diameters are installed.

Figure 15A:
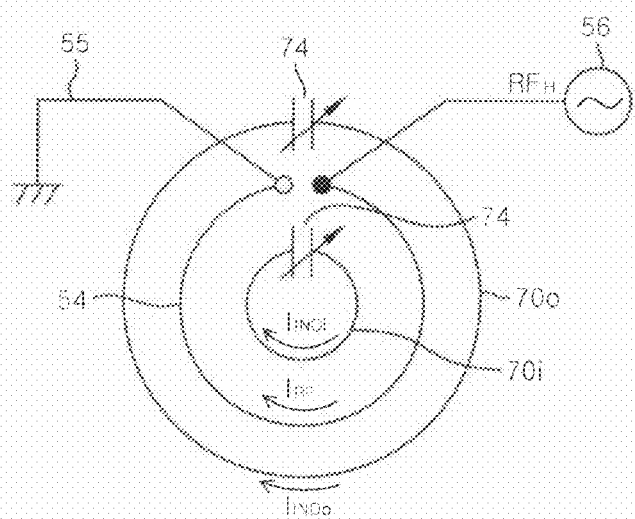
FIG. 15A shows a configuration example where an inner floating coil and an outer floating coil are respectively arranged at diametrically opposite sides of the RF antenna.

Typically, the RF antenna and the floating coil can take the configuration shown in FIG. 15A, wherein the inner floating coil $70_i$ having a small coil diameter and the outer floating coil $70_o$ having a large coil diameter are respectively arranged at the diametrically inner and outer portions of the RF antenna 54 such that the RF antenna 54 is arranged therebetween.

Figure 15B:
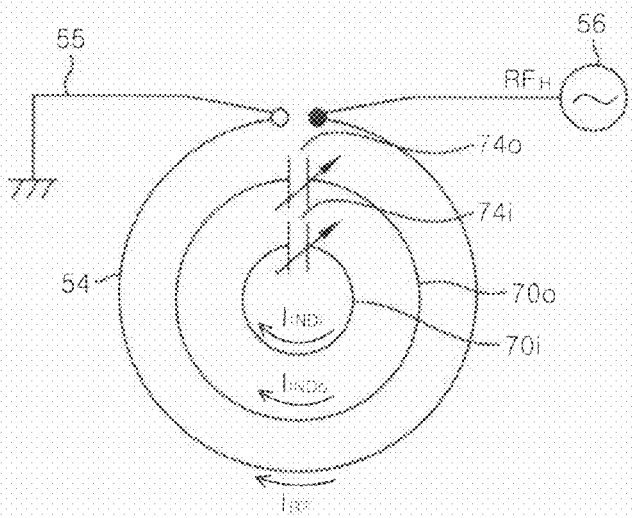
FIG. 15B shows a configuration example where both the inner floating coil and the outer floating coil are arranged at a diametrically inner portion of the RF antenna.
Figure 15C:
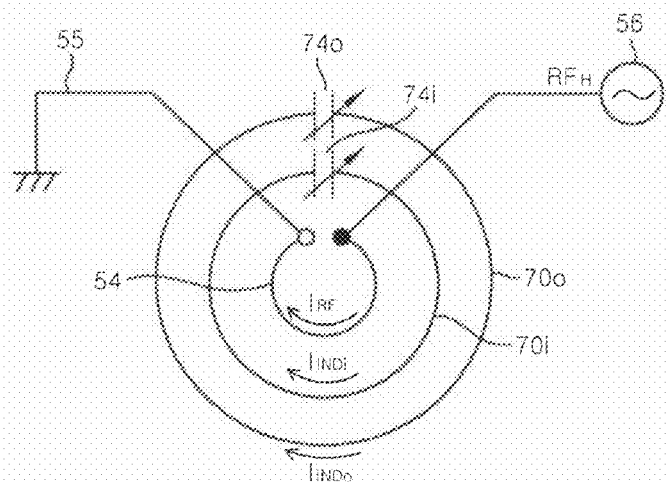
FIG. 15c shows a configuration example where both the inner floating coil and the outer floating coil are arranged at a diametrically outer portion of the RF antenna.

Alternatively, as shown in FIGS. 15B and 15C, both of the inner and the outer floating coil $70_i$ and $70_o$ may be arranged inside or outside the RF antenna 54.

Figure 15D:
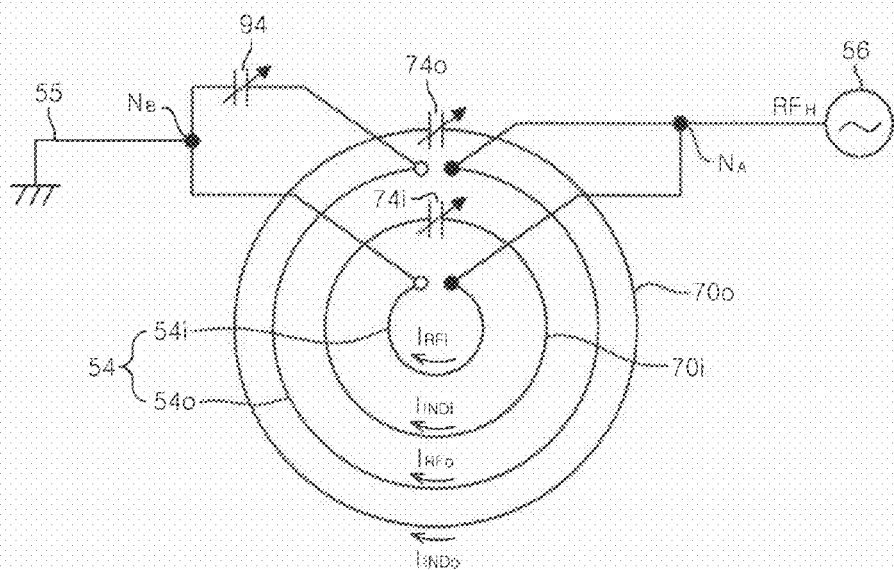
FIG. 15D shows a configuration example where the inner floating coil is arranged between the inner coil and the outer coil of the RF antenna, and the outer floating coil is arranged outside the outer coil.

Further alternatively, as shown in FIG. 15D, in case that the RF antenna 54 includes the inner and the outer coil $54_i$ and $54_o$, the inner floating coil $70_i$ may be arranged between the inner and the outer coil $54_i$ and $54_o$; and the outer floating coil $70_o$ may be arranged at a diametrically outer portion of the outer coil $54_o$. As one modification, although it is not shown, the inner floating coil $70_i$ may be arranged at a diametrically inner portion of the inner coil $54_i$; and the outer floating coil $70_o$ may be arranged between the inner and the outer coil $54_i$ and $54_o$.

In such configuration examples where the independent plural floating coils $70_i$ and $70_o$ are installed, each of the mutual inductances between the floating coils $70_i$ and $70_o$ and the RF antenna 54 may be approximately identical to each other in some cases or distinguished from each other in some other cases. In all cases, since variable capacitors $74_i$ and $74_o$ are respectively individually provided in the floating coil $70_i$ and $70_o$, it is possible to individually control each of the directions and magnitudes (current values) of induced currents $I_{INDi}$ and $I_{INDo}$ flowing through the floating coil $70_i$ and $70_o$ by respectively varying the electrostatic capacitances of the variable capacitors $74_i$ and $74_o$.

Figure 16:
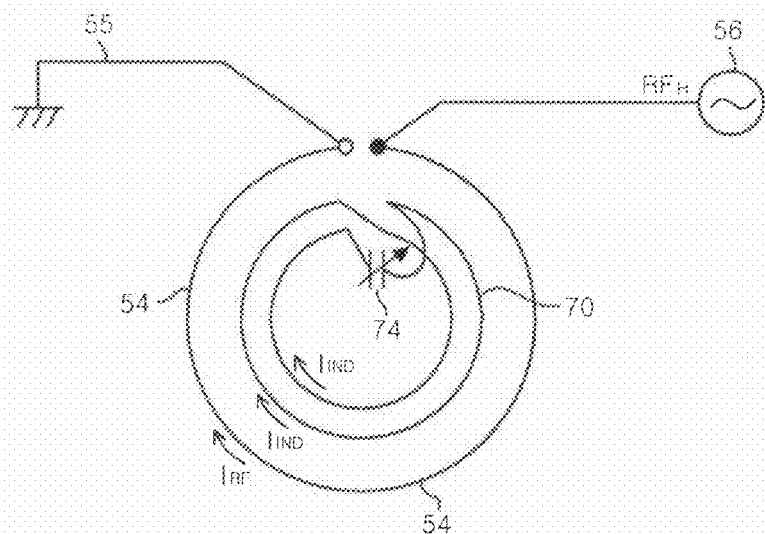
FIG. 16 shows a configuration example in case that the floating coil is a multi-wound coil.

As shown in FIG. 16, the floating coil 70 is formed of a multi-wound (e.g., twice-wound) coil. As for the multi-wound coil, since a resistance $R_{70}$ of a coil whole body (whole circumstance) and a self inductance $L_{70}$ are increased, the induced current $I_{IND}$ becomes reduced by such increased amount. Especially, since the coil length is increased, a magnet-motive force AT (ampere turn) identical to that of a single-wound coil is obtained from the coil whole body. Accordingly, the floating coil 70 of such multi-wound coil is advantageous in the case when it is required to prevent the large induced current $I_{IND}$ from flowing through the floating coil 70 in view of its resistance property, for example.

Figure 17:
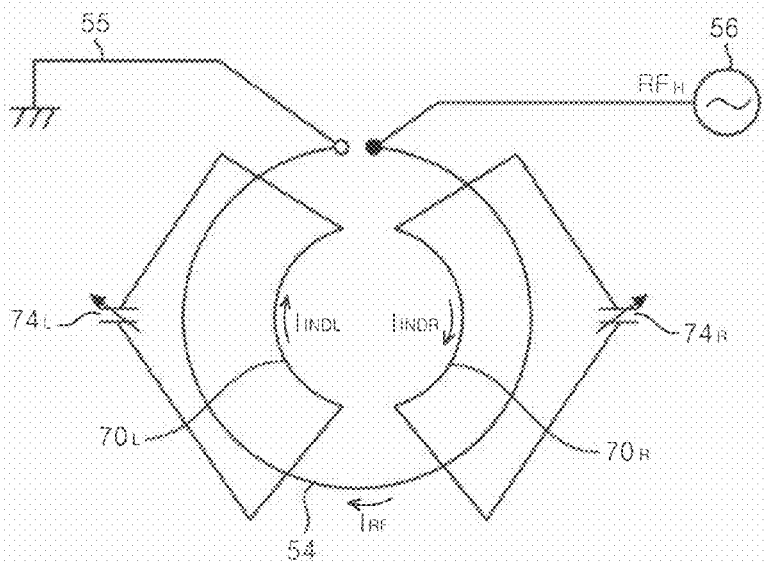
FIG. 17 shows a configuration example where the floating coil is divided into a plurality of coil segments in a circling direction.

In addition, as shown in FIG. 17, the floating coil 70 may be divided into a plurality of (e.g., two in FIG. 17) sections in the circling direction. In this case, variable capacitors $74_L$ and $74_R$ are respectively individually provided in circular arc shaped divided coils 70L and 70R. Typically, electrostatic capacitances of the variable capacitors $74_L$ and $74_R$ are respectively adjusted such that currents having a same magnitude flow through one circle of coil in the same direction, or induced currents $I_{INDL}$ and $I_{INDR}$ having a same magnitude respectively flow through the divided coils 70L and 70R in a same direction. Most of all, in such dividing method of the floating coil 70, the direction and/or magnitude of the induced currents $I_{INDL}$ and $I_{INDR}$ respectively flow through the divided coils 70L and 70R may be set to be different levels as necessary in order to compensate the asymmetry of the structure of the apparatus in an azimuth direction, for example.

Figure 18:
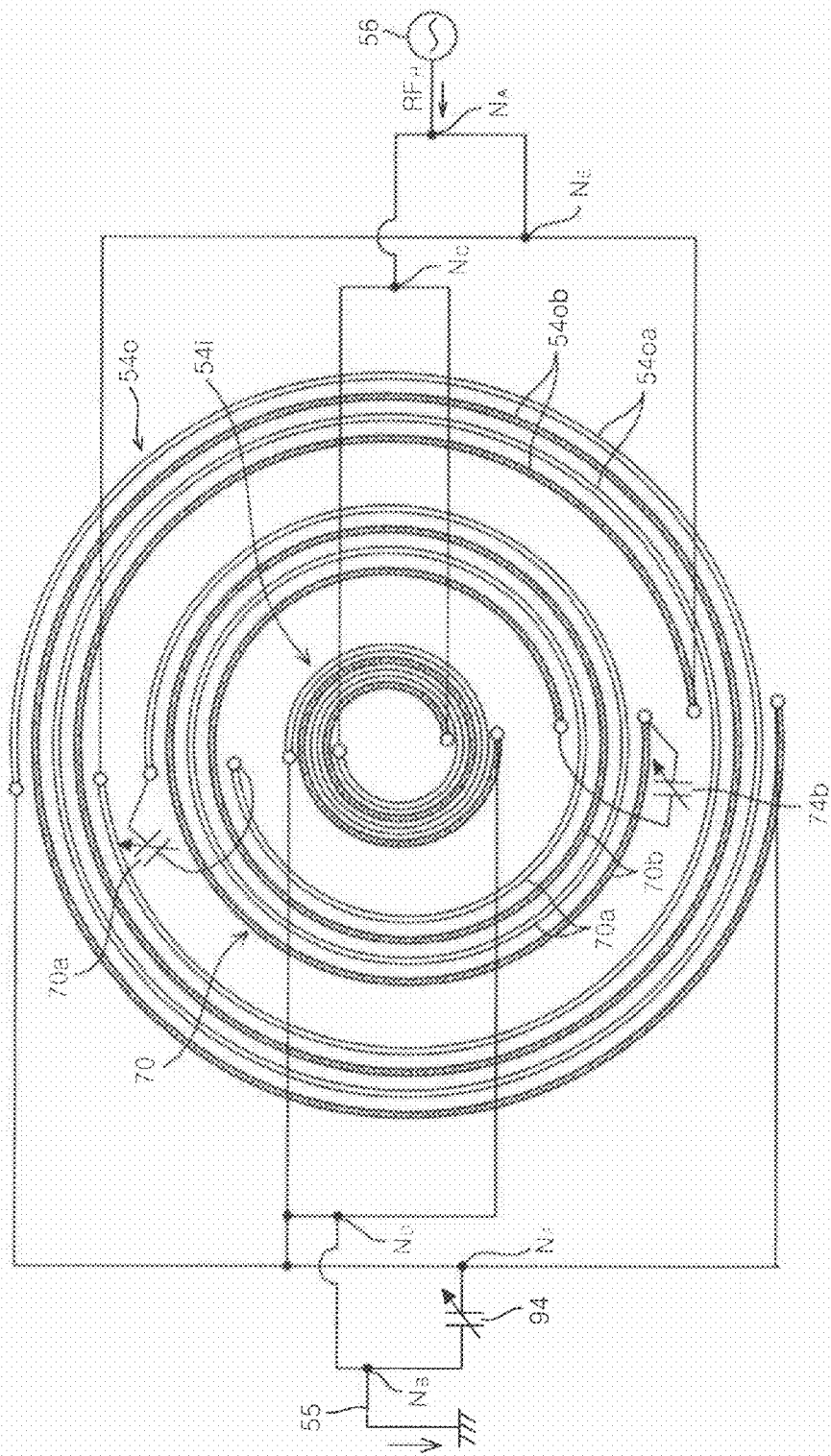
FIG. 18 shows a configuration example where the floating coil and each coil of the RF antenna are formed of, e.g., a pair of spiral coils arranged spatially and electrically in parallel.

FIG. 18 shows an example where each of the coils (the inner coil $54_i$ and the outer coil $54_o$) included in the RF antenna 54 and the floating coil 70 is made of a pair of spiral coils that are in a spatial and electric in-parallel relationship.

Specifically, the inner coil $54_i$ is made of a pair of spiral coils $54_{ia}$ and $54_{ib}$ that are translated in a phase difference of 180° in the circling direction. The spiral coils $54_{ia}$ and $54_{ib}$ are connected electrically in parallel between a node $N_c$ provided at a downstream side lower than the node $N_A$ of the RF power supply 56 side and a node $N_D$ provided at an upstream side upper than the node $N_B$ of the ground line 55 side.

The outer coil $54_o$ is made of a pair of spiral coils $54_{oa}$ and $54_{ob}$ that are translated in a phase difference of 180° in the circling direction. The spiral coils $54_{oa}$ and $54_{ob}$ are connected electrically in parallel between a node $N_E$ provided at a downstream side lower than the node $N_A$ of the RF power supply 56 side and a node $N_F$ provided at an upstream side upper than the node $N_B$ of the ground line 55 side (furthermore, the variable capacitor 74).

The floating coil 70 is made of a pair of spiral coils $70_a$ and $70_b$ that are translated in a phase difference of 180° in the circling direction. Variable capacitors $74_a$ and $74_b$ are respectively provided in loops of the spiral coils $70_a$ and $70_b$.

Further, the distance relative to a mutual inductance between each spiral coil included in the floating coil 70 and each spiral coil included in the RF antenna 54 may approximate the distance between average diameters of the respective spiral coils.

Figure 19:
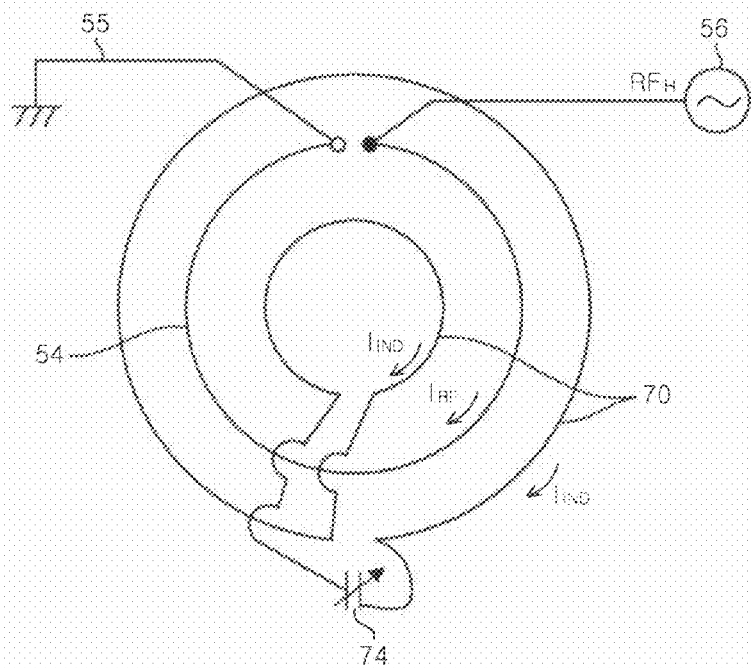
FIG. 19 shows a configuration example where the floating coil is extended over an inner and an outer side of the RF antenna such that the RF antenna is interposed between an inner and an outer portion thereof.

FIG. 19 shows a configuration example where the floating coil 70 is extended over an inner or an outer side of the RF antenna 54 such that the RF antenna 54 is interposed between an inner and an outer portion thereof. With such configuration, it is possible to increase the mutual inductance between the RF antenna 54 and the floating coil 70 and disperse or extend an inductively coupled plasma generation area around a portion immediately below the floating coil 70 in the diametric direction.

Figure 20:
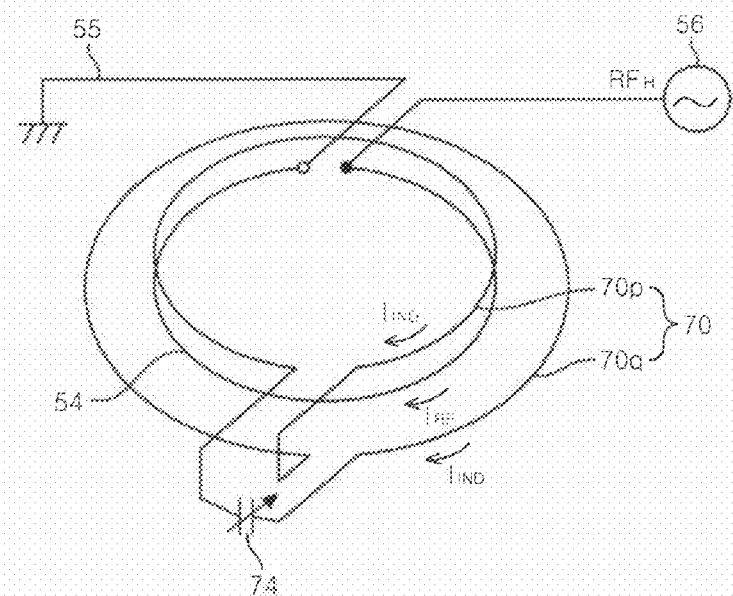
FIG. 20 shows a configuration example where the floating coil is formed of an upper and a lower coil segment that are respectively arranged immediately above and the same planar surface as that of the RF antenna and electrically connected to each other in series.

FIG. 20 shows a configuration example where the floating coil 70 includes an upper coil segment $70_p$ concentrically arranged immediately above the RF antenna 54 and a lower coil segment $70_q$ concentrically arranged on the same planar surface (e.g., at an diametrically outer portion) as that of the RF antenna 54; and the upper and the lower coil segment $70_p$ and $70_q$ are connected electrically in series.

With such configuration, it is preferable that the upper coil segment $70_p$ has a same coil diameter as that of the RF antenna 54 and is arranged closer to the RF antenna 54 to increase the mutual inductance between the upper coil segment $70_p$ and the RF antenna 54. The lower coil segment $70_q$ may have a diameter adjusted preferably adequately in consideration of a diametric distribution property of the inductively coupled plasma in the chamber 10 provided immediately therebelow instead of the mutual inductance between the RF antenna 54 and the lower coil segment $70_q$. In this way, the upper coil segment $70_p$ mainly contributes to the generation of the induced electromotive force, and the lower coil segment $70_q$ mainly contributes to the control of the plasma density distribution. As such, with such configuration, it is possible to assign separate functions to the upper and the lower coil segment $70_p$ and $70_q$.

Figure 21:
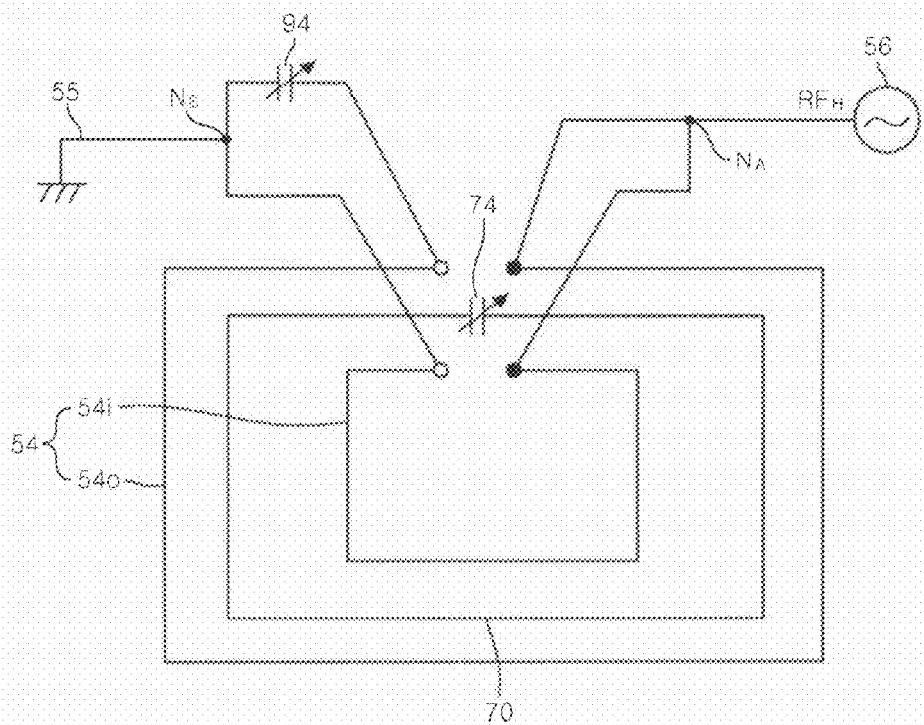
FIG. 21 shows a configuration example where each of the RF antenna and the floating coil is formed to have a quadrangular shape.
Figure 22:
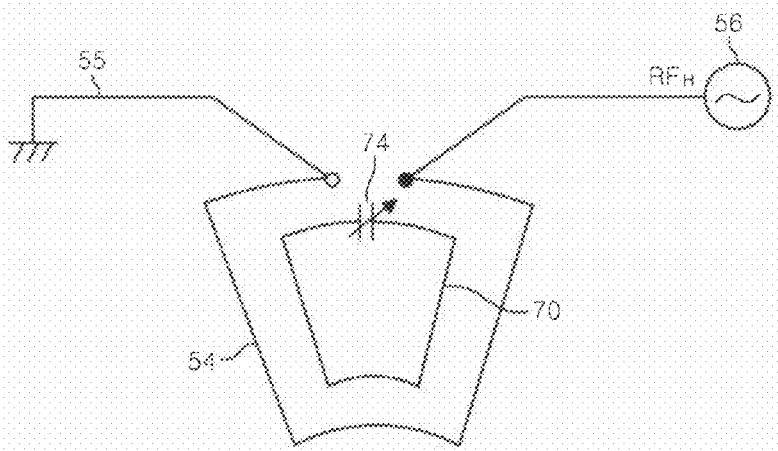
FIG. 22 shows a configuration example where each of the RF antenna and the floating coil is formed to have a fan shape.

FIGS. 21 and 22 show modifications of the shapes of the RF antenna 54 and the floating coil 70. In the embodiments of the present invention, the loop shapes of the RF antenna 54 and the floating coil 70 may have various shapes conforming to the shape of the target substrate to be processed, or the like. For example, the loop shapes thereof may have a rectangular or quadrangular shape as shown in FIG. 21; or a fan shape as shown in FIG. 22.

Further, although it is not shown, the RF antenna coil 54 may have a different shape from that of the floating coil 70.

[Other Examples of Layouts of RF Antenna and Floating Coil]

In the inductively coupled plasma etching apparatus in accordance with the first and the second embodiment, the dielectric window 52 is horizontally attached on the ceiling of the chamber 10; and the RF antenna 54 and the floating coil 70 are arranged on or above the dielectric window 52. However, in the embodiments of the present invention, the layout configurations of the RF antenna 54 and the floating coil 70 are not limited to the above embodiments.

Figure 23A:
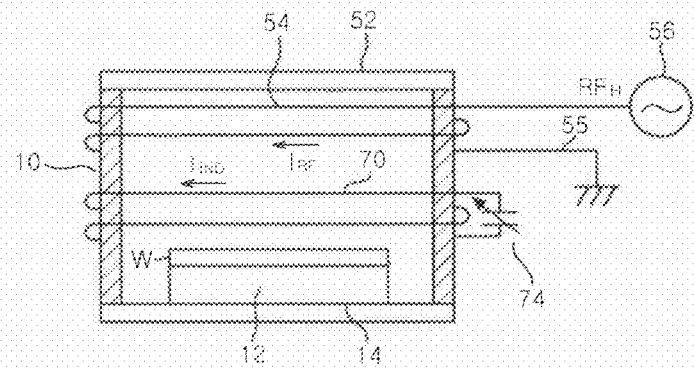
FIG. 23A shows a configuration example where the RF antenna and the floating coil are arranged around a chamber to be offset in a vertical direction of the chamber.

For example, as shown in FIG. 23A, the RF antenna 54 and the floating coil 70 may be arranged around the sidewall of the chamber 10 to be offset (dislocated) with each other in a vertical direction of the chamber 10. In the configuration example shown in FIG. 23A, the floating coil 70 is arranged below the RF antenna 54. The sidewall of the chamber 10 has at least peripheral portions, formed of a dielectric body, with regard to the portions where the RF antenna 54 and the floating coil 70 are arranged. The RF antenna coil 54 or the floating coil 70, made of a multi-wound coil, may have a helical shape.

In the configuration example shown in FIG. 23A, when the RF antenna current $I_{RF}$ flows through the RF antenna 54 from the camber 10, a magnetic field generated by the antenna current $I_{RF}$ travel through the sidewall (dielectric window) and the plasma generation space in the chamber 10. The temporal alteration of the generated magnetic field causes an electric field to be induced azimuthally. Moreover, electrons azimuthally accelerated by the induced electric field collide with molecules and/or atoms of the processing gas, to thereby ionize the processing gas and generate a plasma in the doughnut shape.

In the meantime, by the antenna current $I_{RF}$ flowing through the RF antenna 54, the induced current $I_{IND}$ flows through the floating coil 70 and, thus, another magnetic field generated by the induced current $I_{IND}$ travel through the sidewall (dielectric window) and the plasma generation space in the chamber 10. If the induced current $I_{IND}$ flows in the direction reverse to that of the antenna current $I_{RF}$, the amount of the generated inductively coupled plasma becomes reduced. On the other hand, if the induced current $I_{IND}$ flows in the direction identical to that of the antenna current $I_{RF}$, the amount of the generated inductively coupled plasma becomes increased.

In the above example, since the variable capacitor 74 is provided in the loop of the floating coil 70, it is possible to control whether the induced current $I_{IND}$ flows in the direction identical or reverse to that of the antenna current $I_{RF}$ and, furthermore, the magnitude (current value) of the induced current $I_{IND}$, by adjusting the electrostatic capacitance of the variable capacitor 74.

Figure 23B:
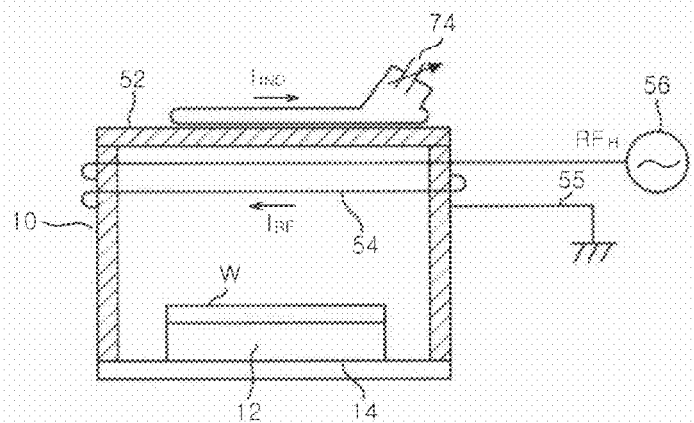
FIG. 23B shows a configuration example where the RF antenna and the floating coil are respectively arranged around a sidewall of the chamber and on a ceiling plate of the chamber.

In the configuration example shown in FIG. 23A, since the floating coil 70 is arranged at a lower portion than the RF antenna 54, or at a portion close to the susceptor 12, around the sidewall of the chamber 10, it is possible to increase the effect of the contribution of the floating coil 70 and/or the variable capacitor 74. However, the floating coil 70 may be arranged at a portion higher than the RF antenna 54, or distantly from the RF antenna 54. For example, as shown in FIG. 23B, the floating coil 70 may be arranged on the ceiling plate (dielectric window) 52 of the chamber 10. In this case, the floating coil 70 may have a circular ring-shaped or spiral shaped coil.

Figure 23C:
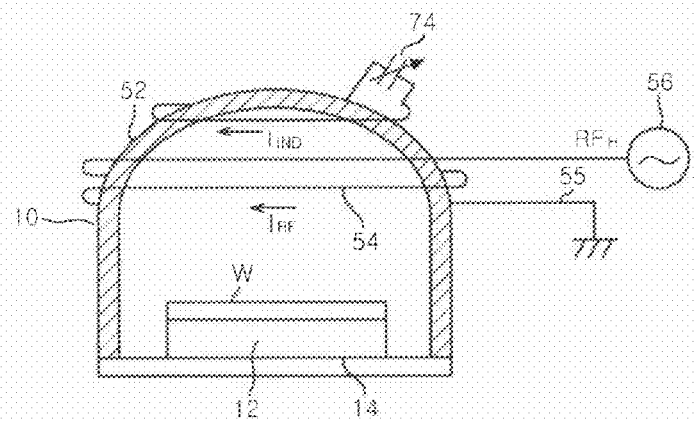
FIG. 23C shows a configuration example where the RF antenna and the floating coil are arranged on a domed ceiling plate of the chamber.

As an additional example, as shown in FIG. 23C, a domical-shaped ceiling plate (dielectric window) 52 is provided in the chamber 10, and the RF antenna 54 and the floating coil 70 may be arranged (preferably, while being mounted) on the domical-shaped dielectric window 52.

[Example where Fixed Capacitor is Provided in Floating Coil]

Figure 24:
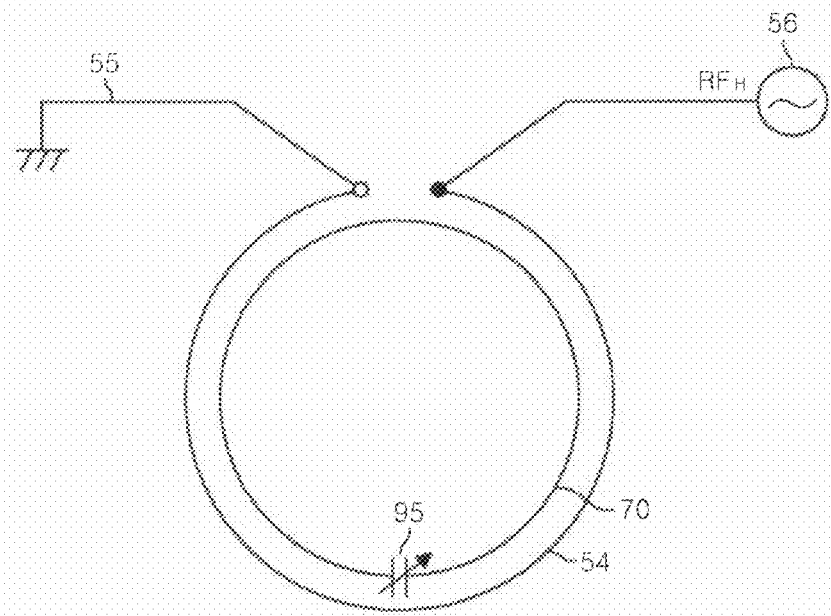
FIG. 24 shows an example where a fixed capacitor is provided in a loop of the floating coil.

FIG. 24 shows an example where the fixed capacitor 95 is provided in the floating coil 70. In this example, the floating coil 70 is preferably made of a circular ring-shaped single-wound coil and arranged closer to the RF antenna 54. Further, although the floating coil 70 is arranged at the diametrically inner portion of the RF antenna 54 in the example shown in FIG. 24, the floating coil 70 may be arranged at the diametrically outer portion of the RF antenna 54.

In this example, in case that the floating coil is positively used for the generation of the inductively coupled plasma, the electrostatic capacitance of the fixed capacitor is selected to allow the induced current $I_{IND}$ having an adequate magnitude (e.g., several times more than that of the antenna current $I_{RF}$) to flow through the floating coil 70 in the direction that is circumferentially identical to that of the antenna current $I_{RF}$ flowing through the RF antenna 54. In other words, the electrostatic capacitance of the fixed capacitor 95 is selected to a current value that is smaller than and close to that of the electrostatic capacitance for causing a series resonance in the floating coil 70. Accordingly, even when the floating coil 70 is made of, e.g., a circular ring-shaped single-wound coil, the floating coil 70 can perform the apparently same function as that of a circular ring-shaped multi-wound or spiral coil with regard to such assisting effect on the generation of the inductively coupled plasma.

Such circular ring-shaped single-wound floating coil 70 can be easily manufactured and have an advantage in that the assembling is performed around the RF antenna 54 or the maintenance is performed. Further, since no disconnected location and no connecting conductor exist in the loop of the floating coil 70, the floating coil 70 has various advantages such as little power loss, good uniformity in the circling direction in view of the electromagnetic operation, or the like.

Moreover, in the first and the second embodiment, it is possible to employ the fixed capacitor 95 instead of the variable capacitor 74 or 94.

[Example 1 Related to Configuration of Floating Coil]

Next, with reference to FIGS. 25 to 29, configuration examples of the floating coil 70 used in the inductively coupled plasma processing apparatus of the present invention will be described.

First, the case of using a capacitor element of a commercially available product serving as the capacitors 74 and 95 of the floating coil 70 will be described with reference to FIGS. 25 to 29.

Figure 25:
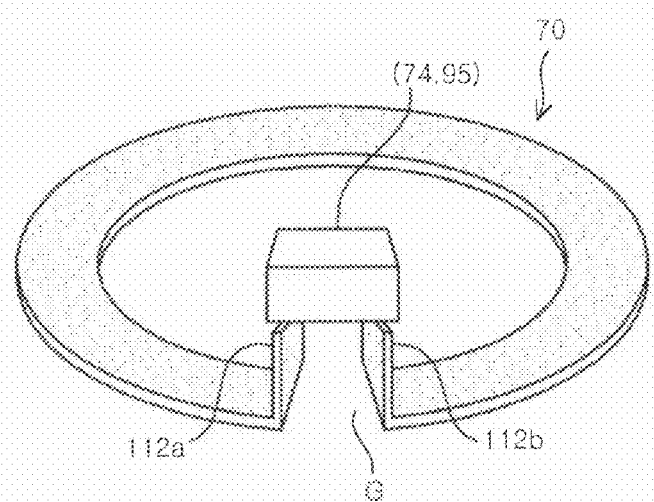
FIG. 25 is a perspective view showing a structure of a floating coil in accordance with a test example.

In the configuration example shown in FIG. 25, a single cutout portion G is formed at the floating coil 70, and the two-terminal capacitors 74 and 95 of commercially available products are attached to the cutout portion G. This configuration example features that connection conductors 112a and 112b connected to terminals of a package main body of the coil conductor and the capacitors 74 and 95 of the floating coil 70 are (preferably, perpendicularly) uprightly extended to be higher than the coil conductor.

In case that the large induced current $I_{IND}$ flows through the floating coil 70 as described in the above, the capacitors 74 and 95 each having a large capacitance through which a large current can flow are used. However, if the capacitances of the capacitors 74 and 95 are large, the size of the cutout portion G is also large and, thus, the cutout portion G in the loop of the floating coil 70 may serve as a singularity that is not disregardable in view of the electromagnetic operation.

In this configuration example, since the connection conductors 112a and 112b are upwardly extended and a capacitor main body is arranged above the coil conductor (separately from the plasma side as described above), the capacitor main body is difficult to be seen, or is masked from the plasma side.

Figure 26A:
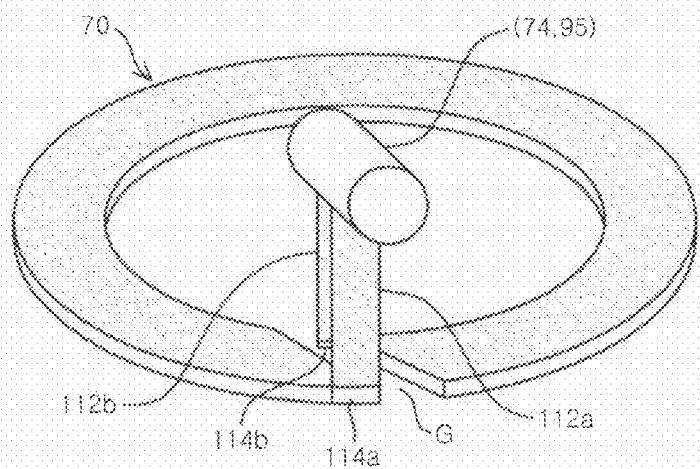
FIG. 26A is a perspective view showing a structure of a floating coil in accordance with a test example.
Figure 26B:
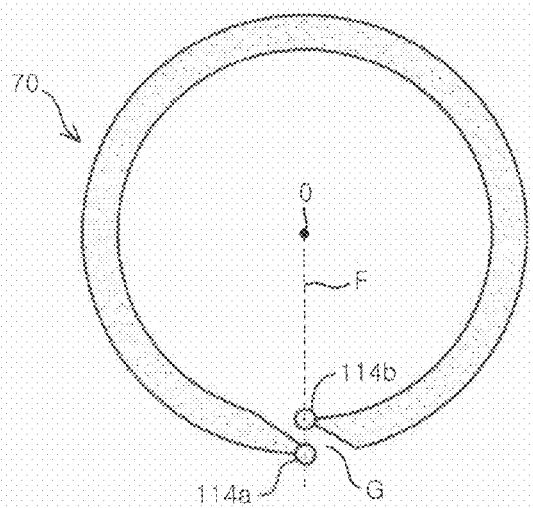
FIG. 26B is a plan view showing a structure of a cutout portion of the floating coil shown in FIG. 26A.

As an additional configuration example shown in FIGS. 26A and 26B, the cutout portion G of the floating coil 70 is obliquely formed at a specific angle (e.g., 45°) in a coil circling direction (or a coil radial direction). Further, a pair of capacitor power supply points (positions of base ends of the connection conductors 112a and 112b) respectively provided at both open end portions of the coil conductor which are opposite to each other via the cutout portion are located on a line F that passes through a coil center "O" in the radial direction. With such configuration, the location of the cutout portion G is difficult to be seen from the plasma side and is thus seen as if the coil conductor of the floating coil 70 is continuously extended in the circling direction.

Figure 26C:
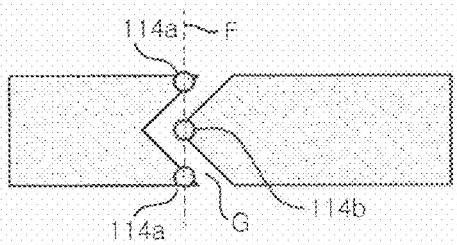
FIG. 26C is a partially expanded plan view showing a modified structure of the cutout portion shown in FIG. 26B.

As a modification, the cutout portion G of the floating coil 70 may be formed to have an oblique box shape shown in FIG. 26C instead of being formed to one oblique line.

Figure 27A:
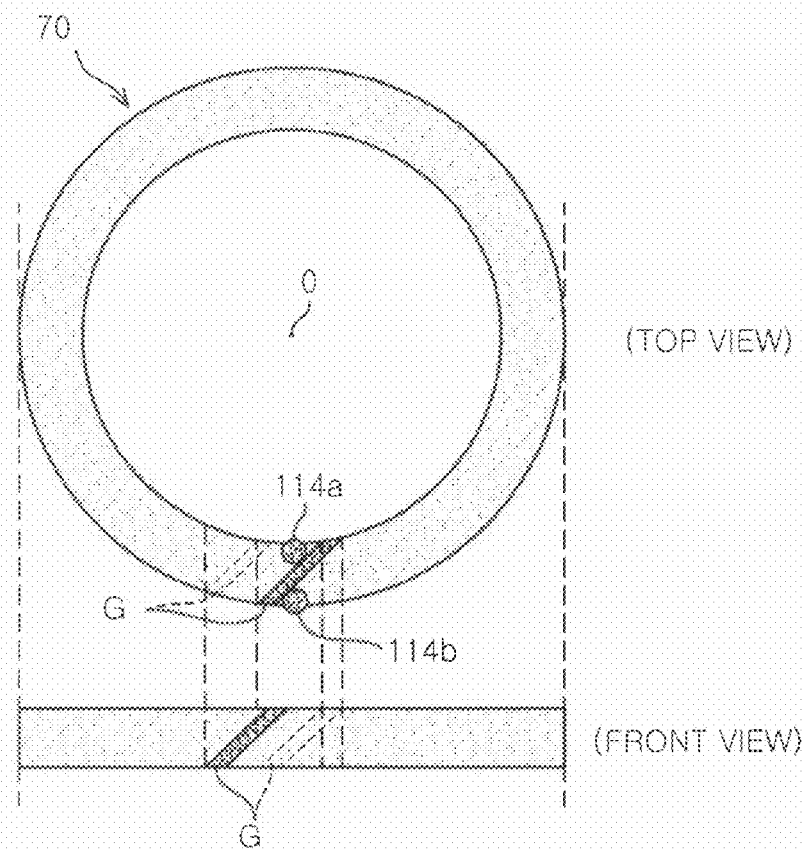
FIG. 27A shows a structure of a floating coil in accordance with a test example.

An additional example shown in FIG. 27A features that the cutout portion G of the floating coil 70 is extended while the coil conductor is obliquely cut not only in the coil radical direction but also in a vertical (coil axis) direction. With such configuration, the location of the cutout portion G is difficult to be seen from the plasma side and, thus, the pseudo-continuity of the coil conductor of the floating coil in the circling direction is further improved.

Figure 27B:
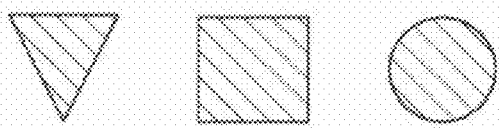
FIG. 27B is a cross sectional view showing a cross section of a coil conductor of the floating coil.

The coil conductor of the floating coil 70 may have any sectional shape, e.g., a triangular shape, a quadrangular shape or a circular shape as shown in FIG. 27B.

Figure 28:
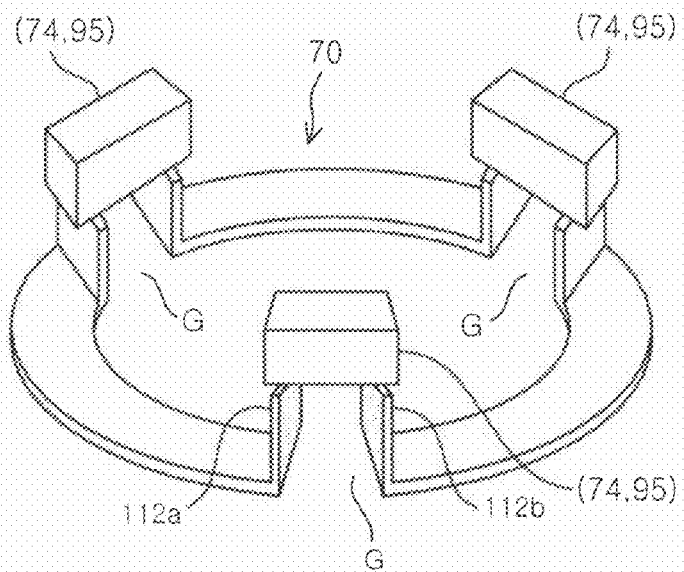
FIG. 28 is a perspective view showing a structure of a floating coil in accordance with a test example.

FIG. 28 shows another additional example for effectively removing or suppressing a singularity caused by the cutout portion G of the floating coil 70. In this example, a plurality of (e.g., three) capacitors 74 or 95 (are provided in the floating coil 70 at a regular interval in the circling direction.

Originally, in the inductively coupled plasma processing apparatus, a plasma is generated non-uniformly (in a doughnut shape) in a diametric direction at a portion immediately below the RF antenna and the non-uniform plasma is diffused, so that the uniform plasma is obtained on the substrate at the susceptor side. Even when the density of the plasma in the doughnut shape in the circling direction has a non-uniform location, the smoothness operation is performed by such diffusion. Since, however, a longer diffusion distance for performing the smoothness operation is required in the circling direction than that in the diametric direction, it is difficult to perform the smoothness operation or the uniformity operation.

In this regard, as shown in FIG. 28, it is possible to shorten the diffusion distance for performing the smoothness operation by providing a plurality of discontinuous points in the circling direction. For example, as shown in FIG. 28, if three cutout portions G are provided at every 120 degree in the circling direction, the distance for performing the smoothness operation in the circling direction becomes ⅓ of the circumference and, thus, it becomes easy to perform the smoothness operation or the uniformity operation.

Figure 29:
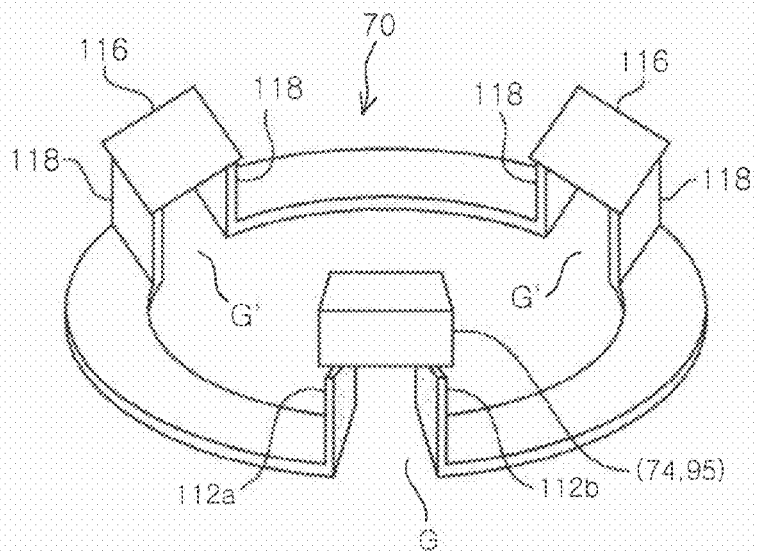
FIG. 29 is a perspective view showing a modified structure of the floating coil shown in FIG. 28.

FIG. 29 shows a modification of the example shown in FIG. 28. The modification shown in FIG. 29 features that a dummy cutout portion G' is further formed in the floating coil 70 and a dummy capacitor electrode 116 and a dummy capacitor connection conductor 118 are provided in the dummy cutout portion. The dummy cutout portion G' may have the same structure as that of the original cutout portion G for attaching the capacitors 74 and 95. One or more dummy cutout portion G' and the original cutout portion G are arranged together at a regular interval in the circling direction. The dummy capacitor electrode 116 may be made of a single conductive plate (e.g., copper plate). The dummy capacitor connection conductor may be made of the same material and have the same shape as those of the connection conductors 112a and 112b.

Although the plural capacitors 74 and 95 are provided to be electrically connected to the floating coil 70 in the example shown in FIG. 28, one capacitor 74 or 95 is satisfactorily provided in the example shown in FIG. 29.

[Example 2 Related to Configuration of Floating Coil]

Next, with reference to FIGS. 30 to 36B, examples where the fixed capacitor 95 and the variable capacitor 74 serving as a structure are respectively assembled to the floating coil 70 as one single unit will be described.

Figure 30:
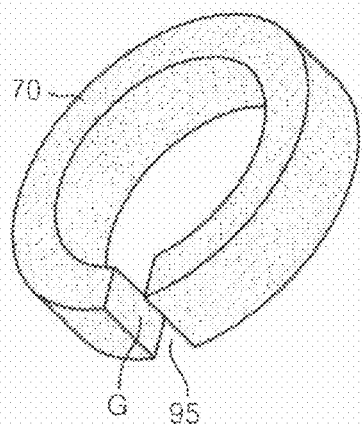
FIG. 30 is a perspective view showing how the fixed capacitor is provided in the floating coil as a single unit in accordance with a test example.

FIG. 30 shows an example where the cutout portion G of the floating coil 70 is used as a gap between electrodes of the fixed capacitor 95.

Figure 31:
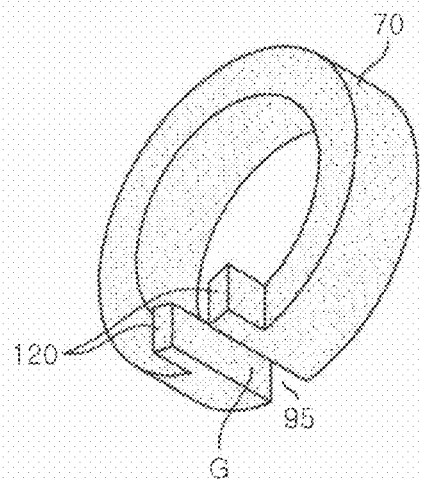
FIG. 31 is a perspective view showing a modification of the test example shown in FIG. 30.

In this example, a pair of open end portions of the coil conductor of the floating coil 70 that are opposite to each other via the cutout portion G can serve as electrodes of the capacitor. As shown in FIG. 31, the electrode area can be controlled to a desired size by respectively attaching extending portions 120 extending upward (or sideward) thereto as one single unit.

Figure 32:
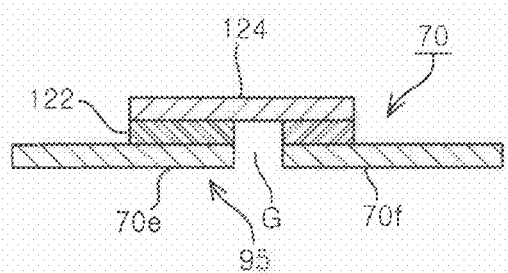
FIG. 32 is a front view partially showing how the fixed capacitor is provided in the floating coil as a single unit in accordance with a test example.

Instead of such attaching type capacitor configuration, the capacitor configuration shown in FIG. 32, for example, may be suggested. Specifically, in the floating coil 70, a dielectric body 122 is attached on one end portion 70e of the coil conductor adjacent to the cutout portion G serving as one capacitor electrode, and a bridge conductive plate 124 connected to the other end portion 70f is attached on a top surface of the dielectric body 120 to serve as the other capacitor electrode. In this way, the superposition type fixed capacitor 95 is obtained.

FIGS. 33 to 35D show an example where the fixed capacitor 95 serving as a structure is assembled to the floating coil 70 as one single unit will be described. Briefly, the bridge conductive plate 124 is replaced with a movable electrode 126 capable of sliding in the fixed capacitor 95 shown in FIG. 32.

Figure 33:
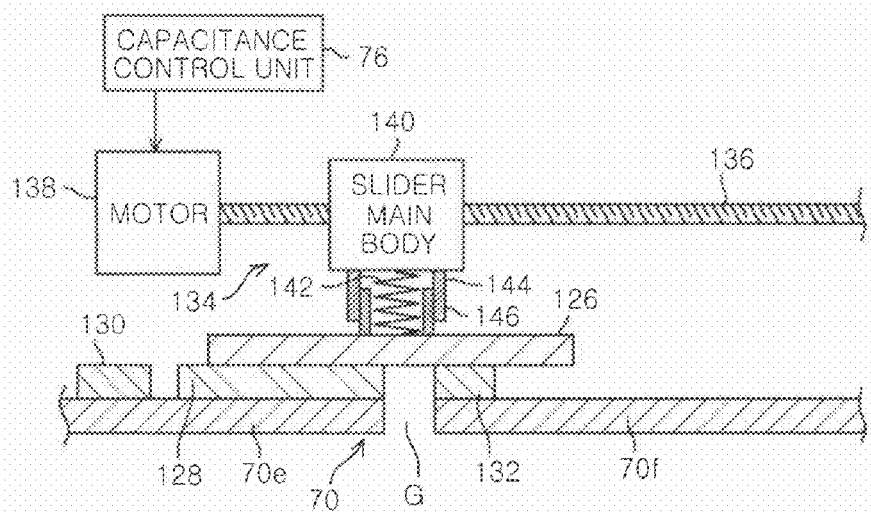
FIG. 33 is a front view partially showing how the fixed capacitor is provided in the floating coil as a single unit in accordance with a test example.

As shown in FIG. 33, in this example, a dielectric body 128 and a fixed contact conductor 130, which have a plate or sheet shape with same thickness, are attached on one end portion 70a of the coil conductor adjacent to the cutout portion G serving as one capacitor electrode. Here, the fixed contact conductor 130 is arranged to be more distant from the cutout portion G than the dielectric body 128. Moreover, a plate or sheet-shaped fixed contact conductor 132 having the same thickness as that of the dielectric body 128 and the fixed contact conductor 130 is attached on the other end portion 70b of the coil conductor adjacent to the cutout portion G. The movable electrode 126 is configured to be movable in the coil circling direction by sliding on top surfaces of the fixed contact conductor 130, the dielectric body 128 and the fixed contact conductor 132 which are arranged in a line. Although the circling direction of the floating coil 70 strictly has a circular shape, it may be considered as a straight line locally at a position around the cutout portion G. Accordingly, the moving electrode 126 can be moved in a straight line without being dislocated from an upper portion to a side portion of the floating coil 70.

A sliding mechanism for allowing the moving electrode 126 to slide is formed of, e.g., a ball screw mechanism and includes a stepping motor 138 for rotatably driving a feed screw 136 that is horizontally extended from a position; a nut portion (not shown) for being coupled to the feed screw 136; a slider main body 140 horizontally moved in the axis direction by the rotation of the feed screw 136; a compressible coil spring 142 for coupling the slider main body 140 to the moving electrode 126; and a pair of cylindrical bodies for holding the moving electrode 126 to be capable of sliding. Here, the outer and inner cylindrical body 144 and 146 are respectively fixed to the slider main body 140 and the moving electrode 126. The compressible coil spring 142 is biased to the moving electrode 126 toward the fixed contact conductor 130, the dielectric body 128 and the fixed contact conductor 132 by its elastic force. The capacitance control unit 76 controls a sliding position of the moving electrode 126 by adjusting the rotating direction and amount of the stepping motor 138.

Figure 34:
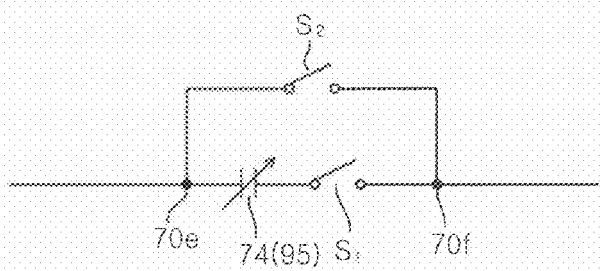
FIG. 34 is an equivalent circuit view showing how a switch is connected to the capacitor in series and/or parallel.

In this example, the variable capacitor 74, a first switch $S_1$ and a second switch $S_2$, which are included in the equivalent circuit shown in FIG. 34, are installed between the coil end portions 70e and 70f, through which the cutout portion G is interposed. Here, the first switch $S_1$ is an on-off unit connected in series to the variable capacitor 74, and the second switch $S_2$ is an on-off unit connected in parallel to the variable capacitor 74.

Specifically, the variable capacitor 74 includes the end portion 70a of the coil conductor, the dielectric body 128, the moving electrode 126 and the sliding mechanism 134. The first and the second switch $S_1$ and $S_2$ include the fixed contact conductors 130 and 132, the moving electrode 126 and sliding mechanism 134.

Here, an operation of the example will be described with reference to FIGS. 35A to 35D.

Figure 35A:
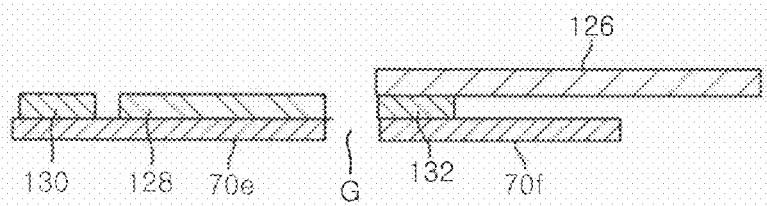
FIGS. 35A to 35D are cross sectional views of main parts for explaining an operation of the test example shown in FIG. 33.

First, the moving electrode 126 is moved to the position shown in FIG. 35A where the moving electrode 126 is brought into contact with only the fixed contact conductor 132 on the end portion 70f of the coil conductor but neither one of the fixed contact conductor 130 and the dielectric body 128 on the end portion 70e of the coil conductor. At this position, the first and the second switch $S_1$ and $S_2$ are opened (OFF), and the cutout portion G of the floating coil 70 is completely opened (blocked). Accordingly, no induced current $I_{IND}$ flows through the floating coil 70, which is substantially identical to the case that no floating coil 70 is provided.

Figure 35B:
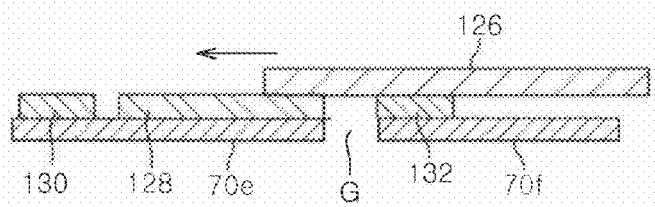

Then, the moving electrode 126 is moved to the position shown in FIG. 35B where the moving electrode 126 is brought into contact with the fixed contact conductor 132 on the end portion 70f of the coil conductor and the dielectric body on the end portion 70e of the coil conductor; but is not in contact with the fixed contact conductor 130 on the end portion 70e of the coil conductor. At this position, the second switch $S_2$ is opened (OFF), while the first switch $S_1$ is closed (ON), the variable capacitor 74 is operated (electrically connected) to have an effective capacitance.

Figure 35C:
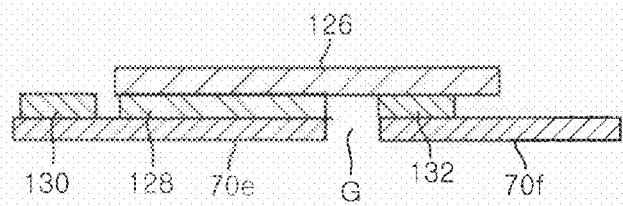

The electrostatic capacitance of the variable capacitor 74 is increased as the moving electrode 126 is moved toward the fixed contact conductor 132 and has the maximum value when the moving electrode 126 is moved to cover the whole area of the top surface of the dielectric body 128 as shown in FIG. 35C.

Figure 35D:
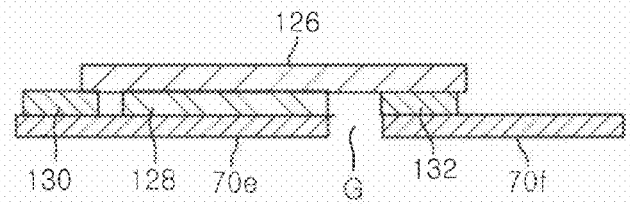

Then, if the moving electrode 126 is further forwardly moved until the moving electrode 126 is brought into contact with the fixed contact conductor 130 as shown in FIG. 35D, the fixed contact conductors 130 and 132 become short-circuited via the moving electrode 126 and the first switch $S_1$ becomes closed (ON). That is, the cutout portion G is short-circuited, and the floating coil 70 serves as a ring where end portions of the coil conductor are closed.

Further, the configuration shown in FIG. 34 where the variable capacitor 74 (can be replaced with fixed capacitor 95) is connected to the first and the second switch $S_1$ and $S_2$ in series and in parallel, respectively, may be applied to the third embodiment (FIGS. 25 to 29) where the commercially available capacitor element is used. The in-series connected switch $S_1$ may be provided at an additional cutout portion in the loop of the floating coil 70 other than the capacitor 74 or 95.

Figure 36A:
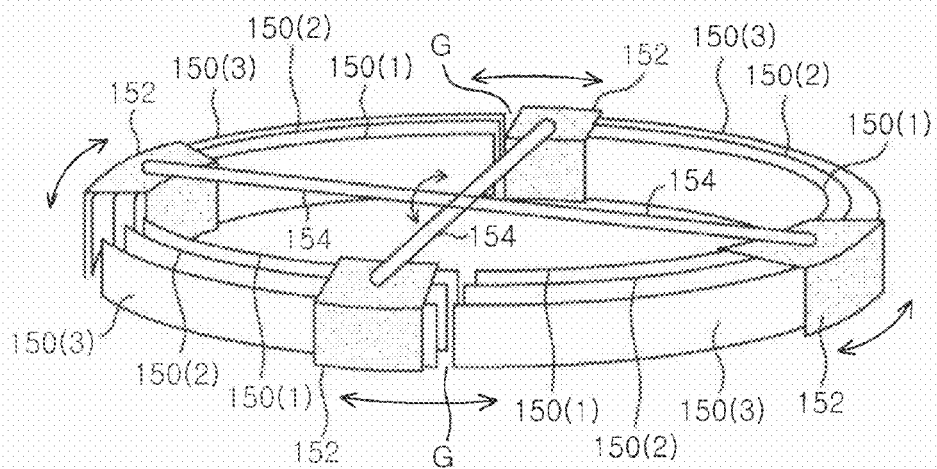
FIG. 36A is a perspective view showing how a variable capacitor is assembled in the floating coil as a single unit in accordance with a test example.
Figure 36B:
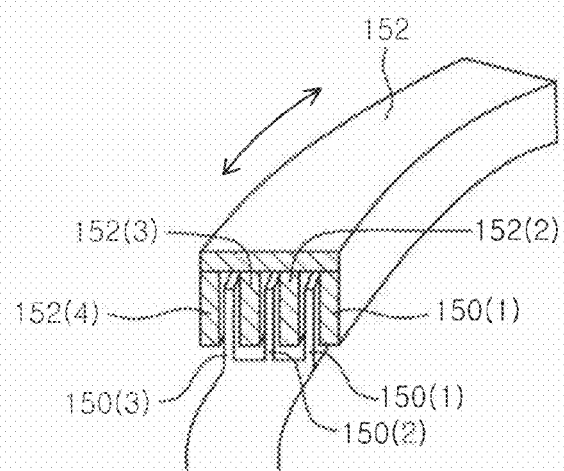
FIG. 36B is a cross sectional perspective view partially showing main parts of the variable capacitor shown in FIG. 36A.

FIGS. 36A and 36B show an additional example where the variable capacitor 74 serving as a structure is assembled to the floating coil 70 as one single unit.

In the example, the coil conductor of the floating coil 70 is arranged to include a plurality of (e.g., three) cylindrical shaped (circular arc shaped, to be accurate) plate bodies 150(1), 150(2) and 150(3) that are disconnected from or connected to the bottom as one single unit, the plate bodies 150(1), 150(2) and 150(3) being arranged to be concentric to each other (or to have pectinate shaped cross sections). Further, in the coil conductors 150(1), 150(2) and 150(3), the cutout portions G are formed at locations or each of a plurality of locations at a regular interval in the circling direction, and the movable electrodes 152 that are movable or displaceable around respective cutout portions G.

The respective movable electrodes 152 include a plurality of (e.g., four) circular arc-shaped plate bodies 152(1), 152(2), 152(3) and 152(4) that are connected as one single unit at top portions thereof to have a comb-shaped cross section which oppositely face in non-contact manner with the cylindrical shaped bodies 150(1), 150(2) and 150(3) having a comb-shaped cross section. The moving electrodes 152 are coupled to each other as one single body via horizontal supporting bars 154 and connected to a rotating mechanism (not shown) such as a motor via a vertical supporting bar (not shown) passing through the center "O."

If the moving electrodes 153 are moved to the position shown in FIG. 36A, the coil conductors 150(1), 150(2) and 150(3) of the floating coil 70 are electrically disconnected at the cutout portion G in the circling direction, which is substantially identical to the case that no floating coil 70 is provided.

If the moving electrodes 152 are slightly moved from the position shown in FIG. 36A in the counterclockwise direction, the moving electrodes 152 move cross the cutout portion G in the circling direction and serve as capacitors together with the end portions of the coil conductor. In this way, by adjusting the rotating positions of the moving electrodes 152 moving across the cutout portion G, it is possible to vary the compounded capacitance of the capacitors.

[Examples Relative to Control of Electrostatic Capacitance of Variable Capacitor]

Figure 37A:
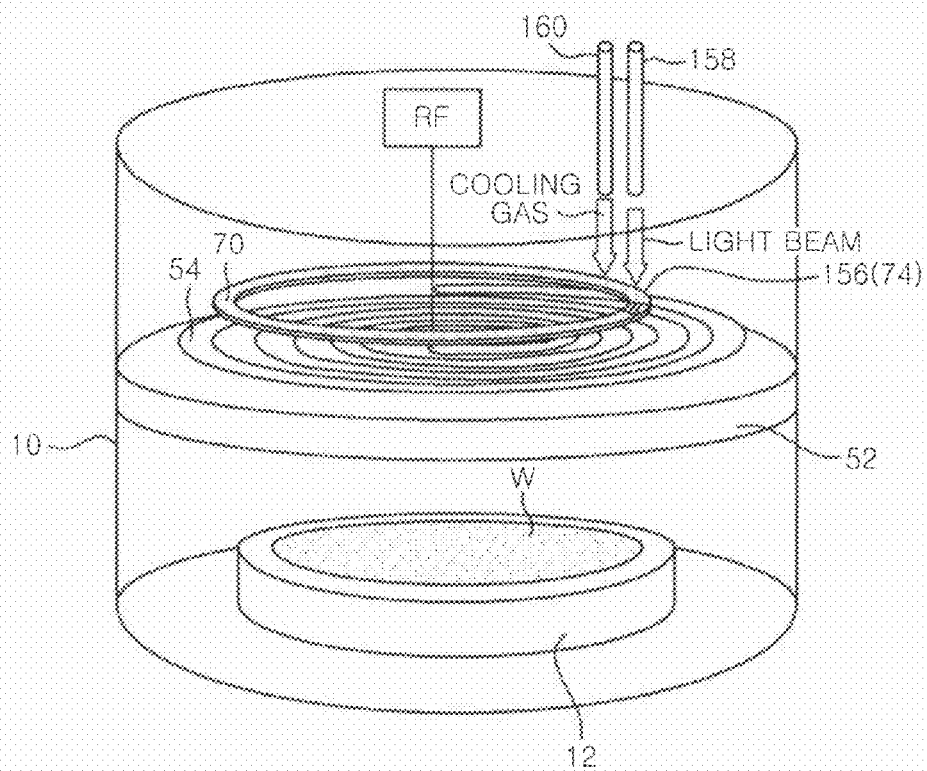
FIG. 37A is a perspective view showing a test example for changing an electrostatic capacitance of the variable capacitor in the floating coil.
Figure 37B:
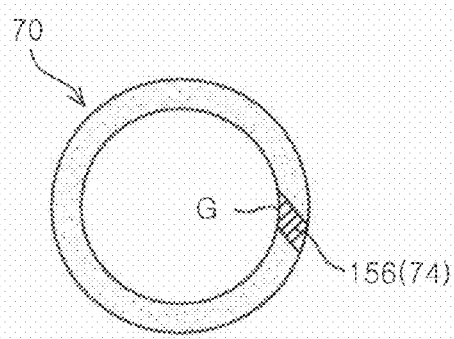
FIG. 37B is a cross sectional perspective view partially showing main parts of the variable capacitor shown in FIG. 37A.
Figure 37C:
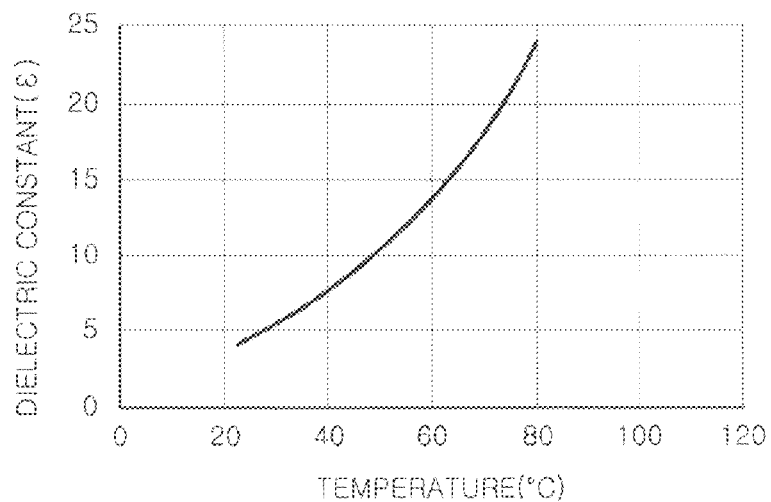
FIG. 37C shows a temperature-dielectric constant property of a dielectric body used in the variable capacitor shown in FIG. 37A.

The example shown in FIGS. 37A to 37C relates to a method of variably controlling the electrostatic capacitance of the variable capacitor 74 provided in the floating coil 70 by adjusting the temperature.

In the example, as shown in FIGS. 37A to 37C, a dielectric body 156 is inserted into one (or more) cutout portion G of the floating coil 70. The dielectric body 156 is made of a sensitive material to temperature, e.g., a polyamide resin, the dielectric constant of which is varied depending on its temperature. FIG. 37C shows a property example where the dielectric constant of such kind of material sensitive to temperature is varied depending on its temperature.

As such, by irradiating a heating light beam from, e.g., a laser or a lamp 158 to the dielectric body 156 sensitive to temperature, it is possible to vary the dielectric constant of the dielectric body 156 based on the temperature-dielectric constant property (FIG. 37C) and, furthermore, to variably control the electrostatic capacitance of the variable capacitor 74.

Figure 38:
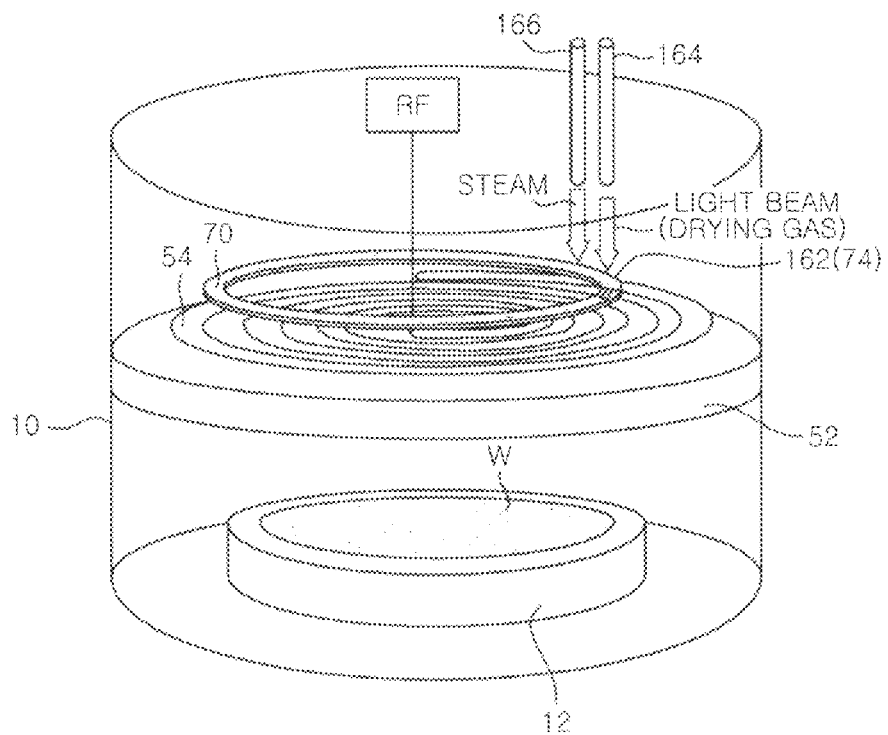
FIG. 38 is a perspective view showing a test example for changing an electrostatic capacitance of the variable capacitor in the floating coil.

As a modification, as shown in FIG. 38, the electrostatic capacitance of the variable capacitor 74 may be variably controlled by adjusting the humidity. In this case, a dielectric body 162 is inserted into one (or more) cutout portion G of the floating coil 70. The dielectric body 162 is made of a sensitive material to humidity, e.g., cross-linked polyamide, cellulose acetate, polyvinyl alcohol, polydactyl amide, or polyvinyl pyrrolidone, the dielectric constant of which is varied depending on the humidity.

As such, by irradiating a heating or drying light beam from, e.g., a laser or a lamp 164 to the dielectric body 162 sensitive to humidity or spraying steam from a gas nozzle 166, it is possible to vary the dielectric constant of the dielectric body 162 based on the humidity-dielectric constant property (not shown) and, furthermore, to variably control the electrostatic capacitance of the variable capacitor 74. As the medium for drying it, a drying gas may be used instead of the light beam.

[Other Examples Relative to Layout of Floating Coil]

Another example of the winding and the layout configuration of the floating coil 70 will be described with reference to FIGS. 39 to 43.

Figure 39:
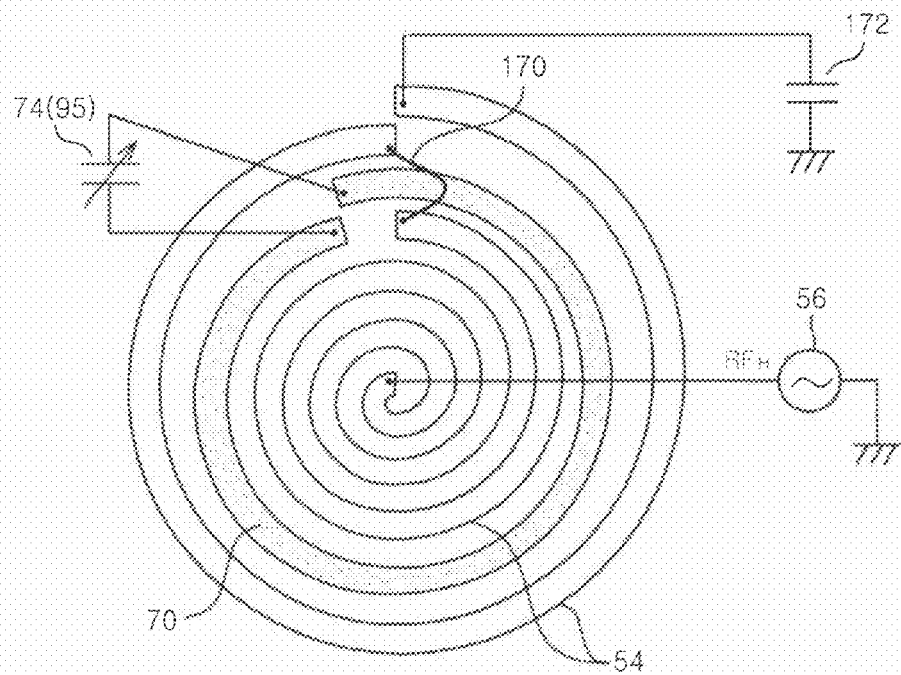
FIG. 39 is a plan view showing a wound structure of a floating coil in accordance with a test example.

In case that the length of the coil diameter of the floating coil 70 is equal to that of a central portion between an inner radius and an outer radius of the spiral-shaped RF antenna 54, as shown in FIG. 39, an elevated connection conductor 170 may be provided by extending over the coil conductor to connect an inside to an outside of the RF antenna 54. Further, a termination circuit including, e.g., a capacitor 172 may be connected to RF antenna 54.

Figure 40A:
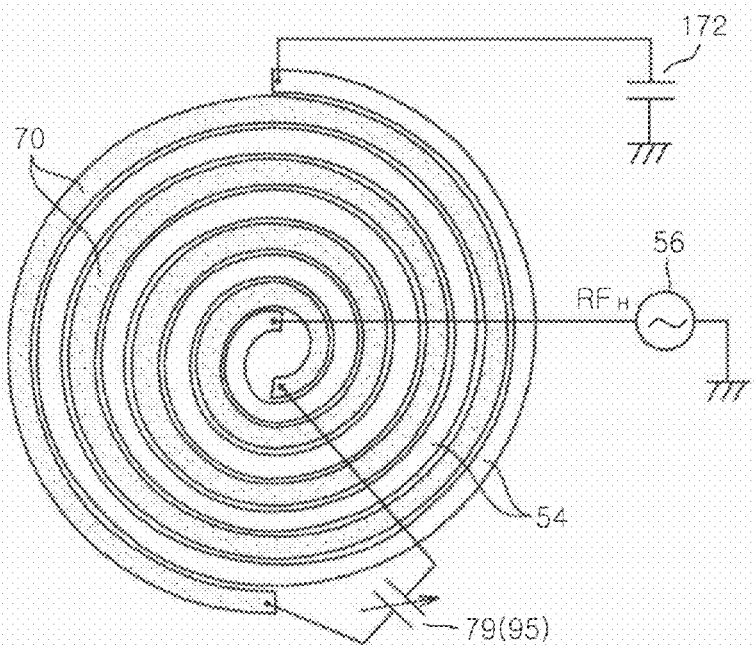
FIG. 40A is a plan view showing a wound structure of a floating coil in accordance with a test example.
Figure 40B:
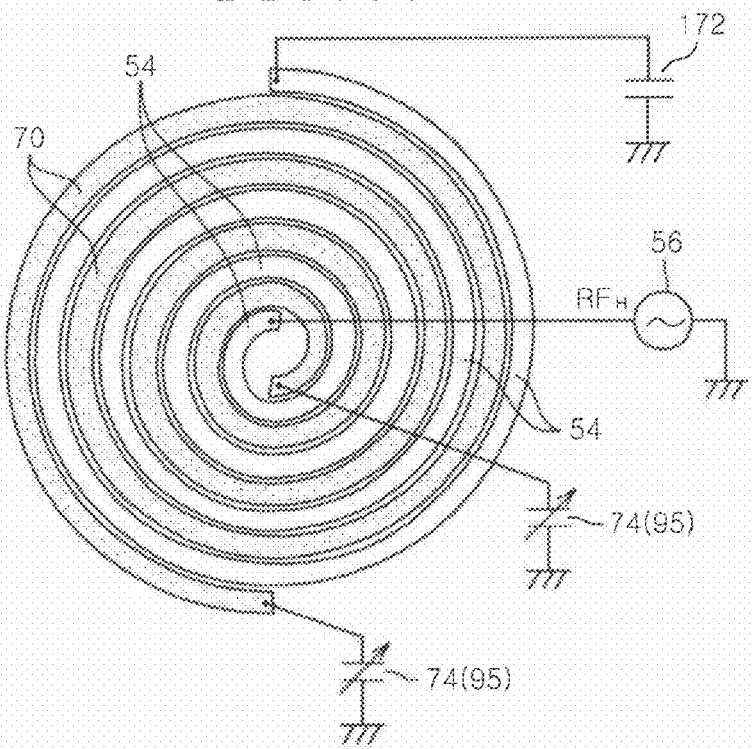
FIG. 40B is a plan view showing a wound structure of a floating coil in accordance with a test example.

Alternatively, the floating coil 70 may have the configuration shown in FIGS. 40A to 40B where it is spirally extended crossing with each other in the diametric direction with regard to the spiral-shaped RF antenna 54.

Figure 41:
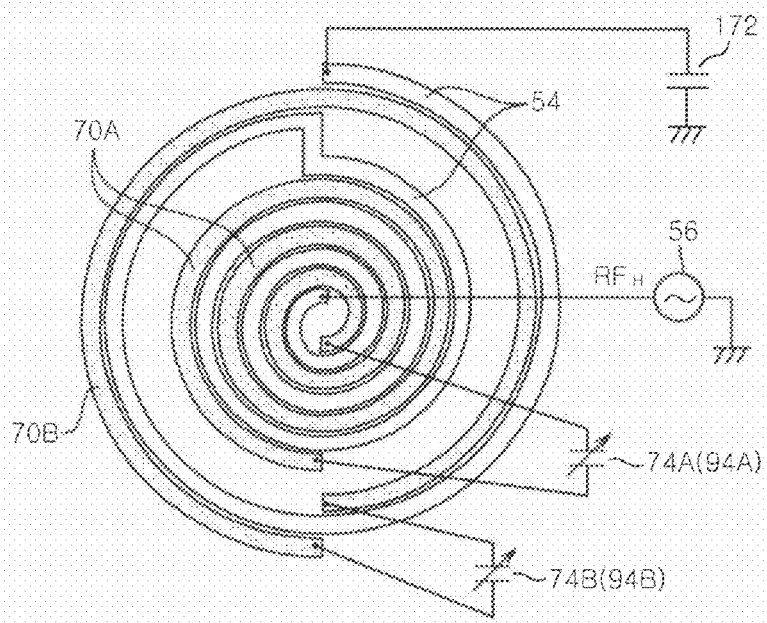
FIG. 41 is a plan view showing a wound structure of a floating coil in accordance with a test example.

Further alternatively, as shown in FIG. 41, two independent floating coils 70A and 70B having different coil diameters may be arranged to be concentric with each other.

Although it is not shown as an additional example, a plurality of independent floating coils having different vertical positions may be arranged to be concentric with each other.

Figure 42:
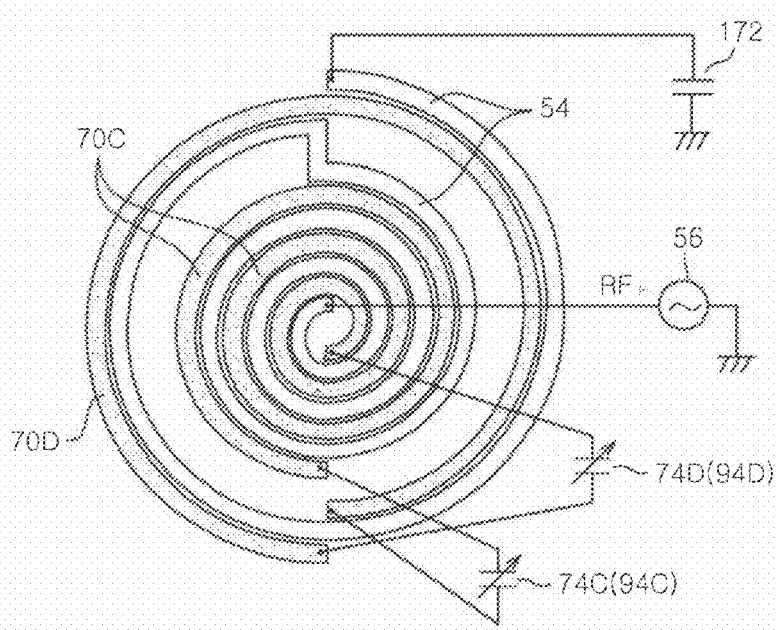
FIG. 42 is a plan view showing a wound structure of a floating coil in accordance with a test example.

In addition, as shown in FIG. 42, there may be provided a single multi-wound floating coil including a plurality of (e.g., two) spiral floating coils 70C and 70D having different coil diameters that are connected in series via fixed or variable capacitors 74C(95C) or 74D(95D). Furthermore, although it is not shown, one of the fixed or variable capacitors 74C(95C) or 74D(95D) may be omitted and thus short-circuited.

Figure 43:
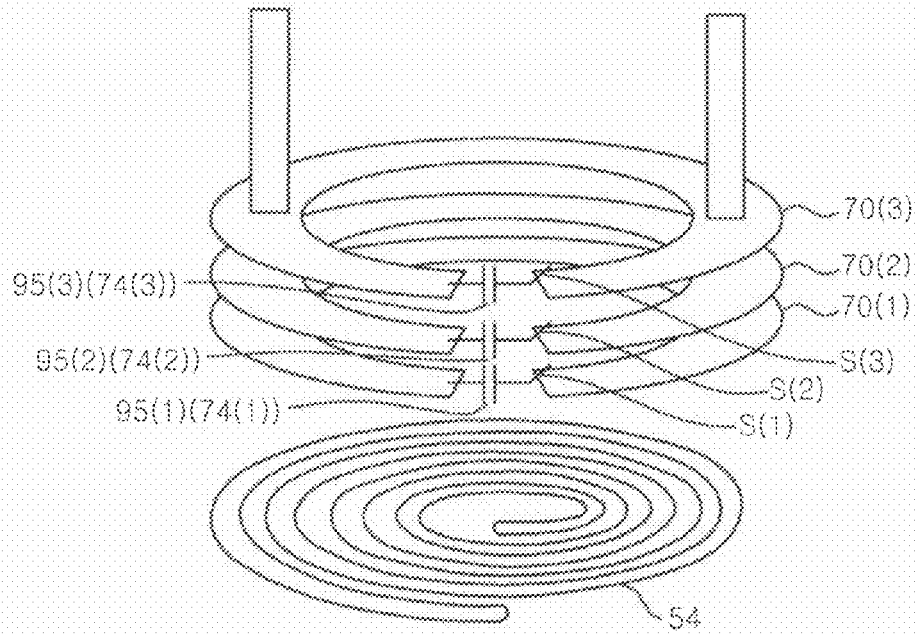
FIG. 43 shows a configuration example where a capacitor and a switch are provided in a loop of the floating coil.

Finally, as shown in FIG. 43, in the loops of one or more (e.g, three) floating coils 70(1), 70(2) and 70(3), fixed capacitors 95(1), 95(2) and 95(3) or variable capacitors 74(1), 74(2) and 74(3), and on-off switches S(1), S(2) and S(3) may be provided while being connected in series (in parallel).

[Other Embodiments or Modifications]

In present invention, a large induced current (sometimes, larger than that flowing through RF antenna) may flow through the floating coil and, thus, it may be important to cool the floating coil.

Figure 44A:
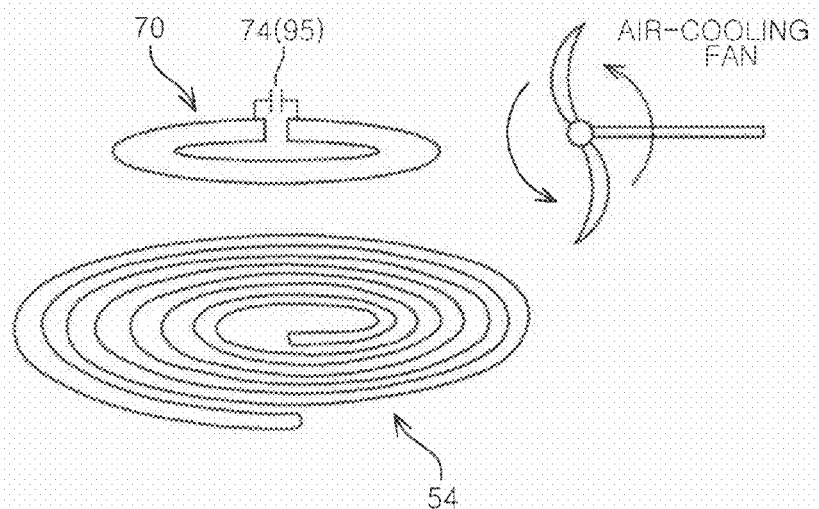
FIG. 44A shows a test example where the floating coil is cooled by an air cooling method.
Figure 44B:
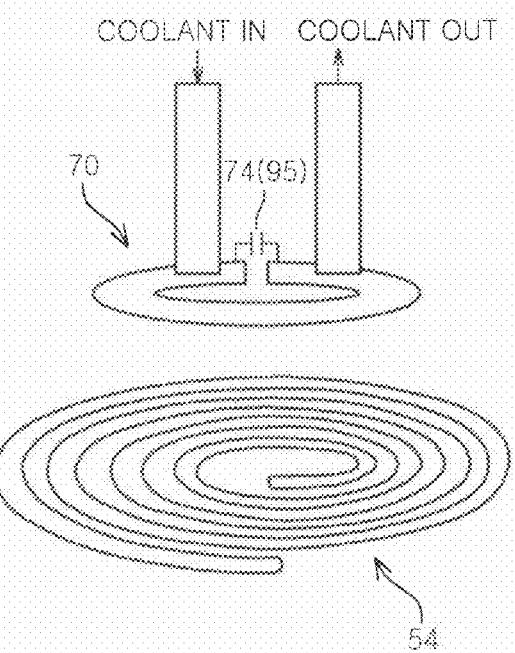
FIG. 44B shows a test example where the floating coil is cooled through a coolant.

In this regard, as shown in FIG. 44A, it is preferable to provide a coil cooling unit for air-cooling the floating coil by installing an air-cooling fan around the floating coil. Alternatively, as shown in FIG. 44B, it is also preferable to provide a coil cooling unit for preventing the floating coil 70 from being overheated by supplying a coolant into the floating coil 70 formed of a hollow tube made of copper.

Figure 45:
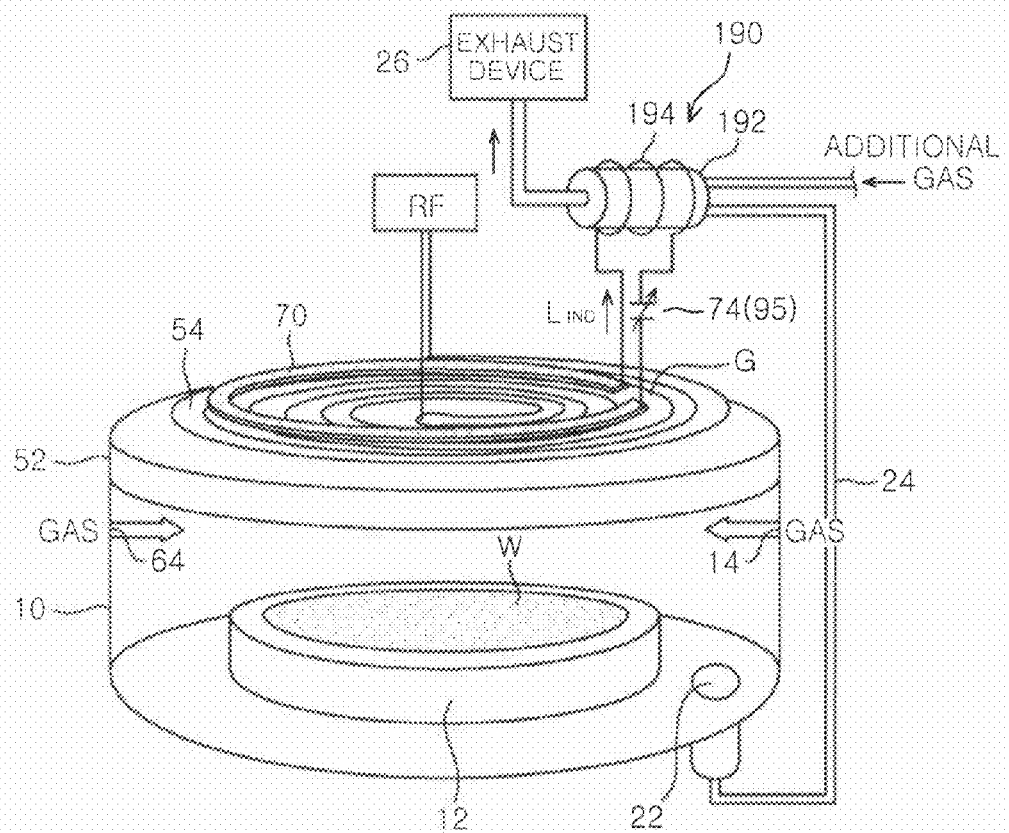
FIG. 45 is a perspective view showing a configuration of a test example with regard to a secondary function of the floating coil.

A secondary function of the floating coil of the present embodiment will be described with reference to FIG. 45.

In this embodiment, there is further provided an inductively coupled plasma exhaust gas decomposing apparatus 190 for decomposing a greenhouse gas included in the gases exhausted from the inductively coupled plasma etching apparatus by using the plasma. The inductively coupled plasma exhaust gas decomposing apparatus 190 includes a cylindrical shaped reaction vessel or tube 192 formed of, e.g. quartz or alumina and an RF antenna 194 provided around the reaction tube 192.

In the present embodiment, the RF antenna 194 is electrically connected in series to the capacitor 74 or 95 provided at the cutout portion G. The induced current $I_{IND}$ flows through the floating coil 70 and the RF antenna 194 together, to thereby generate an inductively coupled plasma in the reaction tube 192. An exhaust gas is introduced from the exhaust port 22 of the inductively coupled plasma etching apparatus to the reaction tube 192 through the exhaust pipe 24. The well-known greenhouse gas of such exhaust gases includes perfluorocarbon as a compound of fluorine and carbon, hydroflorocarbon as a compound of fluorine, carbon and hydrogen, $NF_3$ gas, $SF_6$ gas and the like. The greenhouse gas is decomposed by using the plasma of RF discharge by the inductive coupling and converted into the gases having little environmental load to be transferred to exhaust device 26.

An additional gas, e.g., $O_2$ gas, for improving the gas decomposing efficiency is introduced into the reaction tube 192 at a preset flow rate or a mixing ratio. Although it is not shown, e.g., a water-cooling pipe trough which cooling water flows may be wound around the outer periphery of the reaction tube 192 to control its temperature. To improve the gas decomposing efficiency further, an additional helical-shaped RF antenna (not shown) may be provided around the reaction tube 192, and an additional RF current may be supplied to the additional helical-shaped RF antenna.

As described above, in the present embodiment, the floating coil 70 of the inductively coupled plasma etching apparatus is connected in series to the RF antenna 194 of the inductively coupled plasma exhaust gas decomposing apparatus 190. Further, in the inductively coupled plasma etching apparatus, the induced current $I_{IND}$ flowing through the floating coil 70 to control the density distribution of the inductively coupled plasma is allowed to flow through the RF antenna 194 together, so that the induced current $I_{IND}$ is used again to generate a plasma in the inductively coupled plasma exhaust gas decomposing apparatus 190.

In the aforementioned embodiments of the present invention, the configuration of the inductively coupled plasma etching apparatus is merely an example. Various modifications of the units of the plasma-generation mechanism and units having no direct involvement in the plasma generation may be made.

Moreover, a processing gas may be supplied through the ceiling of the chamber 10 from the processing gas supply unit, and no series bias controlling RF power $RF_L$ may be supplied to the susceptor 12. The present invention can be applied to a plasma processing apparatus in which a plurality of RF antennas or antennas•segments are provided; and the plasma-generating RF power is respectively supplied from a plurality of RF power supplies or RF power supply systems to the respective RF antennas (or antenna•segments).

In the above embodiments, the inductively coupled plasma processing apparatus or the plasma processing method therefor is not limited to the technical field of the plasma etching, but is applicable to other plasma processes such as a plasma CVD process, a plasma oxidizing process, a plasma nitriding process and the like. In the embodiments, the target substrate to be processed is not limited to the semiconductor wafer. For example, the target substrate may be one of various kinds of substrates, which can be used in a flat panel display (FPD), a photomask, a CD substrate, a print substrate or the like.

In accordance with an inductively coupled plasma processing apparatus and a plasma processing method therefor of the present invention, it is possible to freely accurately control the plasma density distribution by using an electrically floated coil without requiring special processing on the plasma-generating RF antenna or the RF power supply system.

While the invention has been shown and described with respect to the embodiments, it will be understood by those skilled in the art that various changes and modifications may be made without departing from the scope of the invention as defined in the following claims.

What is claimed is:
1. A plasma processing apparatus comprising:
a processing chamber including a dielectric window;
a coil shaped RF antenna provided outside the dielectric window;
a substrate supporting unit, provided in the processing chamber, configured to mount thereon a target substrate to be processed;
a processing gas supply unit configured to supply a desired processing gas to the processing chamber to perform a desired plasma process on the target substrate;
an RF power supply unit configured to supply an RF power for RF discharge of the processing gas to the RF antenna to generate a plasma of the processing gas by an inductive coupling in the processing chamber;
a floating coil that is electrically floating and arranged at a position outside the processing chamber, wherein the floating coil is to be coupled with the RF antenna by electromagnetic induction;
a variable capacitor provided in a loop of the floating coil and having an electrostatic capacitance; and
a capacitance control unit configured to change a direction of a current flowing through the floating coil and to improve uniformity of a plasma density distribution below the floating coil in a radial direction with respect to the floating coil by dynamically varying the electrostatic capacitance of the variable capacitor,
wherein the floating coil and the RF antenna are arranged in a same plane.

2. The apparatus of claim 1, wherein the floating coil is arranged to be concentric with the RF antenna.

3. The apparatus of claim 1, wherein the floating coil and the RF antenna are arranged at a same distance from the substrate supporting unit in the processing chamber.

4. The apparatus of claim 1, wherein the dielectric window serves as a ceiling of the processing chamber, and
the RF antenna and the floating coil are mounted and arranged on the dielectric window.

5. The apparatus of claim 1, wherein the capacitance control unit is configured to selectively cause the current flowing through the floating coil to flow in a direction circumferentially identical to that of a current flowing through the RF antenna.

6. The apparatus of claim 5, wherein the capacitance control unit is configured to dynamically control the electrostatic capacitance of the variable capacitor to be smaller than an electrostatic capacitance that causes a series resonance in the floating coil.

7. The apparatus of claim 5, wherein the capacitance control unit is configured to selectively cause the floating coil to have a negative reactance.

8. The apparatus of claim 1, wherein an allowable range of the electrostatic capacitance of the variable capacitor includes a value smaller than an electrostatic capacitance that causes a series resonance in the floating coil.

9. The apparatus of claim 8, wherein the capacitance control unit is configured to dynamically vary the variable electrostatic capacitance to continuously or stepwisely vary the current flowing through the floating coil, in the direction identical to that of a current flowing through the RF antenna, in a magnitude range from about 1/10 of the current flowing through the RF antenna to about two times the current flowing through the RF antenna.

10. The apparatus of claim 1, wherein an allowable range of the electrostatic capacitance of the variable capacitor includes a value smaller than an electrostatic capacitance that causes series resonance in the floating coil and a value larger than that electrostatic capacitance.

11. The apparatus of claim 1, wherein an allowable range of the electrostatic capacitance of the variable capacitor includes a value larger than an electrostatic capacitance that causes a series resonance in the floating coil.

12. A plasma processing apparatus comprising:
a processing chamber including a dielectric window;
an RF power supply unit;
an RF antenna including an inner coil and an outer coil that are spaced apart from each other in a radial direction and respectively arranged at an inner portion and an outer portion outside the dielectric window, the inner coil and the outer coil being electrically connected in parallel to the RF power supply unit;
a substrate supporting unit, provided in the processing chamber, configured to mount thereon a target substrate to be processed;
a processing gas supply unit configured to supply a desired processing gas to the processing chamber to perform a desired plasma process on the target substrate, wherein the RF power supply unit is configured to supply an RF power for RF discharge of the processing gas to the RF antenna to generate a plasma of the processing gas by an inductive coupling in the processing chamber;
a floating coil that is electrically floating and arranged at a position outside the dielectric window, wherein the floating coil is to be coupled with at least one of the inner coil and the outer coil of the RF antenna by electromagnetic induction;
a variable capacitor provided in a loop of the floating coil and having an electrostatic capacitance; and
a capacitance control unit configured to change a direction of a current flowing through the floating coil and to improve uniformity of a plasma density distribution below the floating coil in a radial direction with respect to the floating coil by dynamically varying the electrostatic capacitance of the variable capacitor,
wherein the floating coil and the RF antenna are arranged in a same plane.

13. The apparatus of claim 12, wherein the inner coil, the outer coil and the floating coil are arranged to be concentric with one another.

14. The apparatus of claim 12, wherein the inner coil, the outer coil and the floating coil are mounted and arranged on the dielectric window.

15. The apparatus of claim 12, wherein the floating coil is arranged between the inner coil and the outer coil in a radial direction.

16. The apparatus of claim 15, wherein the floating coil is arranged at a same distance from each of the inner coil and the outer coil.

17. The apparatus of claim 15, wherein the capacitance control unit is configured to selectively cause the current flowing through the floating coil to flow in a direction circumferentially identical to those of currents respectively flowing through the inner coil and the outer coil.

18. The apparatus of claim 17, wherein the capacitance control unit is configured to selectively cause the current flowing through the floating coil to have a smaller current value than those of currents respectively flowing through the inner coil and the outer coil.

19. The apparatus of claim 18, wherein the capacitance control unit is configured to selectively cause the current flowing through the floating coil to have a current value that is about 1/10 times or less as much as those of currents respectively flowing through the inner coil and the outer coil.

20. The apparatus of claim 17, wherein the electrostatic capacitance of the variable capacitor is smaller than an electrostatic capacitance that causes series resonance in the floating coil.

21. The apparatus of claim 17, wherein the capacitance control unit is configured to selectively cause the floating coil to have a negative reactance.

22. The apparatus of claim 17, wherein an allowable range of the electrostatic capacitance of the variable capacitor includes a value smaller than that of an electrostatic capacitance that causes a series resonance in the floating coil.

23. The apparatus of claim 22, wherein the capacitance control unit is configured to dynamically vary the variable electrostatic capacitance to continuously or stepwisely vary the current flowing through the floating coil, in the direction identical to that of a current flowing through the RF antenna, in a magnitude range from about 1/10 of the current flowing through the inner coil or the outer coil of the RF antenna to about two times of the current flowing through the inner coil or the outer coil of the RF antenna.

24. The apparatus of claim 12, wherein the floating coil has a shape similar to that of at least one of the inner coil and the outer coil.

25. The apparatus of claim 12, further comprising a capacitor in the RF antenna to adjust a balance of the currents respectively flowing through the inner coil and the outer coil, the capacitor being connected in series to at least one of the inner coil and the outer coil.

26. The apparatus of claim 25, wherein the capacitor in the RF antenna is a variable capacitor.

27. The apparatus of claim 12, further comprising a variable capacitor connected in parallel to one of the inner coil and the outer coil and connected in series to the other of the inner coil and the outer coil.

* * * * *